(12) United States Patent
Kim et al.

(10) Patent No.: US 12,142,652 B2
(45) Date of Patent: Nov. 12, 2024

(54) SEMICONDUCTOR DEVICE INCLUDING A CAPPING PATTERN

(71) Applicant: Samsung Electronics Co., Ltd., Suwon-si (KR)

(72) Inventors: Seon-Bae Kim, Hwaseong-si (KR); Kyungin Choi, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 545 days.

(21) Appl. No.: 17/491,965

(22) Filed: Oct. 1, 2021

(65) Prior Publication Data

US 2022/0293753 A1    Sep. 15, 2022

(30) Foreign Application Priority Data

Mar. 12, 2021    (KR) ........................ 10-2021-0032900

(51) Int. Cl.
*H01L 27/088* (2006.01)
*H01L 29/417* (2006.01)
*H01L 29/423* (2006.01)

(52) U.S. Cl.
CPC ........ *H01L 29/4232* (2013.01); *H01L 27/088* (2013.01); *H01L 29/41775* (2013.01)

(58) Field of Classification Search
CPC ......... H01L 21/76805; H01L 21/76831; H01L 21/76834; H01L 21/76883; H01L 21/76897; H01L 21/823431; H01L 21/823475; H01L 23/485; H01L 23/5226; H01L 27/088; H01L 29/0673; H01L 29/0847; H01L 29/165; H01L 29/41725; H01L 29/71775; H01L 29/41791; H01L 29/4232; H01L 29/42392; H01L 29/66439; H01L 29/665; H01L 29/66545; H01L 29/6656; H01L 29/775; H01L 29/7848; H01L 29/78696
See application file for complete search history.

(56) References Cited

U.S. PATENT DOCUMENTS

| | | | |
|---|---|---|---|
| 6,740,549 B1 * | 5/2004 | Chen | H01L 21/823468 257/E21.627 |
| 9,349,812 B2 | 5/2016 | Chen et al. | |
| 9,640,625 B2 | 5/2017 | Bouche et al. | |
| 10,373,912 B2 | 8/2019 | Lee et al. | |
| 10,580,692 B1 | 3/2020 | Park et al. | |
| 10,658,299 B2 | 5/2020 | Lee et al. | |
| 2007/0096212 A1 * | 5/2007 | Sato | H01L 21/823475 257/E21.627 |

(Continued)

*Primary Examiner* — Eric A. Ward
(74) *Attorney, Agent, or Firm* — Harness, Dickey & Pierce, P.L.C.

(57) ABSTRACT

A semiconductor device is disclosed. The semiconductor device may include a semiconductor substrate including a protruding active pattern, a first gate pattern provided on the active pattern and extended to cross the active pattern, a first capping pattern provided on a top surface of the first gate pattern, the first capping pattern having a top surface, a side surface, and a rounded edge, and a first insulating pattern covering the side surface and the edge of the first capping pattern. A thickness of the first insulating pattern on the edge of the first capping pattern is different from a thickness of the first insulating pattern on outer side surfaces of the spacer patterns.

19 Claims, 49 Drawing Sheets

(56) References Cited

U.S. PATENT DOCUMENTS

2017/0294535 A1* 10/2017 Zhang .............. H01L 29/66795
2019/0043959 A1* 2/2019 Lee .................. H01L 23/53209
2021/0098584 A1* 4/2021 Cheng ............... H01L 29/66795

* cited by examiner

SEMICONDUCTOR DEVICE INCLUDING A CAPPING PATTERN

CROSS-REFERENCE TO RELATED APPLICATIONS

This U.S. non-provisional patent application claims priority under 35 U.S.C. § 119 to Korean Patent Application No. 10-2021-0032900, filed on Mar. 12, 2021, in the Korean Intellectual Property Office, the entire contents of which are hereby incorporated by reference.

BACKGROUND

Some example embodiments relate to a semiconductor device, and in particular, to a semiconductor device including a capping pattern and/or a method of fabricating the same.

Due to their small size, multiple functionality, and/or low-cost characteristics, semiconductor devices are esteemed as important elements in the electronic industry. As the electronics industry is highly developed, there is an increasing desire for semiconductor devices with improved characteristics. To meet this desire, complexity and/or integration density of semiconductor devices are increasing.

SUMMARY

Some example embodiments of inventive concepts provides a semiconductor device with improved reliability and a method of fabricating the same.

According to some example embodiments of inventive concepts, a semiconductor device may include a substrate including an active pattern protruding in an upward direction, a first gate pattern on the active pattern and extending cross the active pattern, spacer patterns on a first side surface of the first gate pattern and on a second side surface of the first gate pattern, a first capping pattern on a top surface of the first gate pattern and on top surfaces of the spacer patterns, the first capping pattern having a top surface, a side surface, and a rounded edge connecting the top surface of the first capping pattern and the side surface of the first capping pattern, a first insulating pattern covering the side surface of the first capping pattern and the edge of the first capping pattern, and an interlayer insulating layer on an outer side surface of the first insulating pattern. A thickness of the first insulating pattern on the edge of the first capping pattern is different from a thickness of the first insulating pattern on outer side surfaces of the spacer patterns.

According to some example embodiments of inventive concepts, a semiconductor device may include a substrate including an active pattern protruding in an upward direction, a first gate pattern and a second gate pattern, which are on the active pattern and are apart from each other in a specific direction, spacer patterns at a first side of the first gate pattern and at a second side of the first gate pattern, a first capping pattern on a top surface of the first gate pattern and top surfaces of the spacer patterns, an insulating pattern covering the first capping pattern and extending to cover outer side surfaces of the spacer patterns, a second capping pattern on a top surface of the second gate pattern and apart from the insulating pattern in the specific direction, and an interlayer insulating layer covering a side surface of the second capping pattern. The insulating pattern has a top surface at a same level as a top surface of the second capping pattern.

According to some example embodiments of inventive concepts, a semiconductor device may include a substrate including an active pattern protruding in an upward direction, a device isolation pattern on the substrate to cover a lower portion of the active pattern, gate patterns on the active pattern to cross the active pattern and to extend in a first direction, the gate patterns comprising a first gate pattern and a second gate pattern, the first gate pattern and the second gate pattern apart from each other in a second direction different from the first direction, gate insulating layers between the active pattern and the gate patterns, first spacer patterns on a first side surface of and a second side surface of the first gate pattern, a first capping pattern on a top surface of the first gate pattern and on top surfaces of the first spacer patterns, a first insulating pattern on a top surface of the first capping pattern, second spacer patterns on a first side surface of and a second side surface of the second gate pattern, a second capping pattern on a top surface of the second gate pattern and on top surfaces of the second spacer patterns and apart from the first insulating pattern, an interlayer insulating layer covering a first side surface of the second capping pattern, source/drain patterns on the active pattern and at the first side surface of and the second side surface of the first gate pattern, active contacts on and coupled to the source/drain patterns, silicide patterns between the source/drain patterns and the active contacts, and a contact pattern on one of the active contacts. The first insulating pattern has a top surface at the same level as the top surface of the second capping pattern.

DETAILED DESCRIPTION OF SOME EXAMPLE EMBODIMENTS

Figure 1:
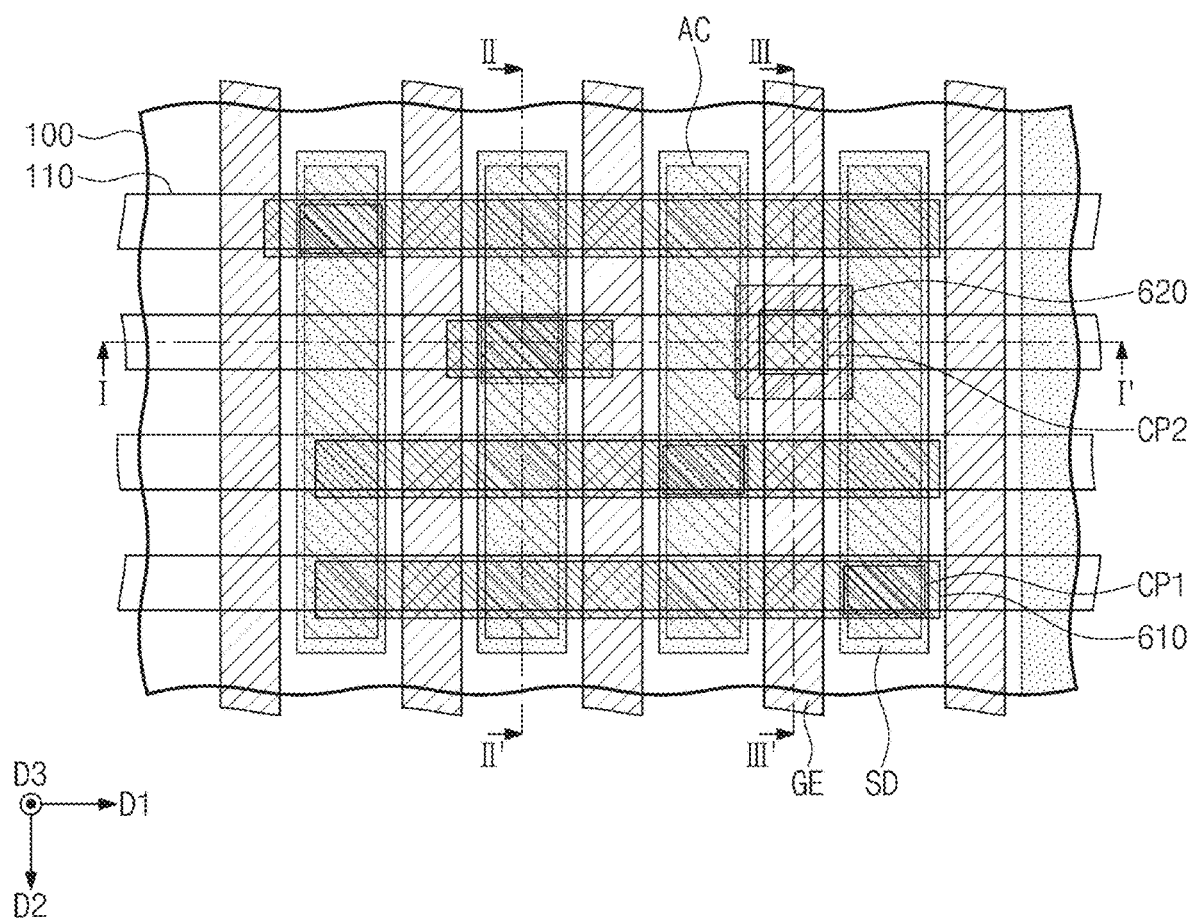
FIG. 1 is a plan view illustrating a semiconductor device according to some example embodiments of inventive concepts.

Some example embodiments of inventive concepts will now be described more fully with reference to the accompanying drawings, in which some example embodiments are shown. Example embodiments of inventive concepts may, however, be embodied in many different forms and should not be construed as being limited to example embodiments set forth herein; rather, these example embodiments are provided so that this disclosure will be thorough and complete, and will fully convey the concept of example embodiments to those of ordinary skill in the art. In the drawings, the thicknesses of layers and regions are or may be exaggerated for clarity. Like reference numerals in the drawings denote like elements, and thus their description will be omitted for brevity.

Figure 2A:
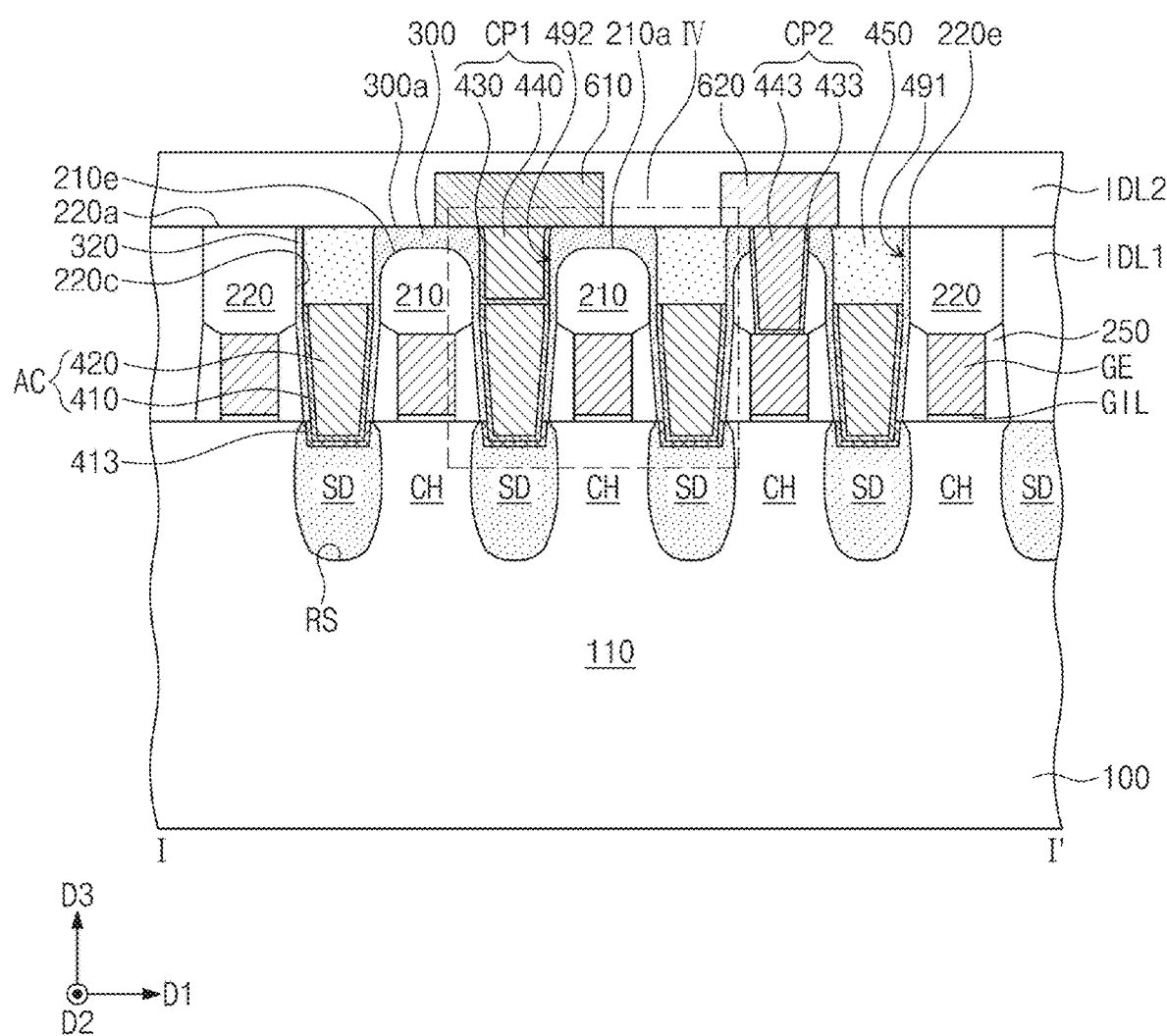
FIG. 2A is a sectional view taken along a line I-I' of FIG. 1.
Figure 2B:
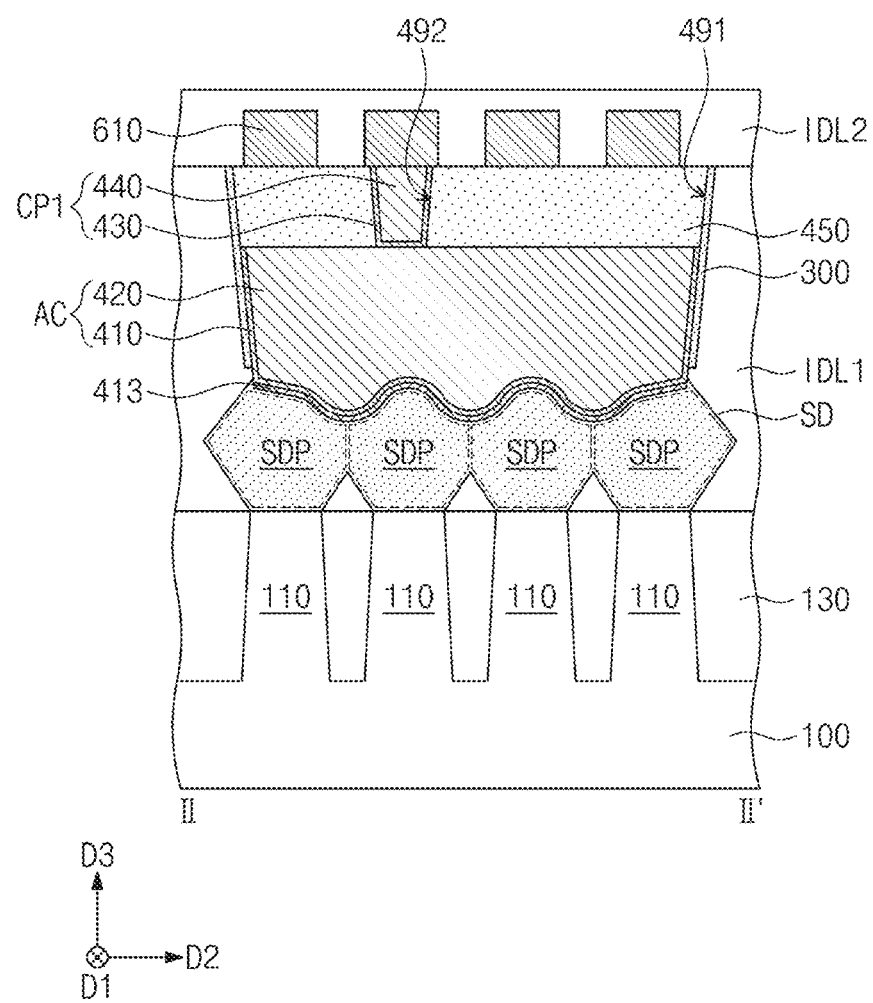
FIG. 2B is a sectional view taken along a line II-IT of FIG. 1.
Figure 2C:
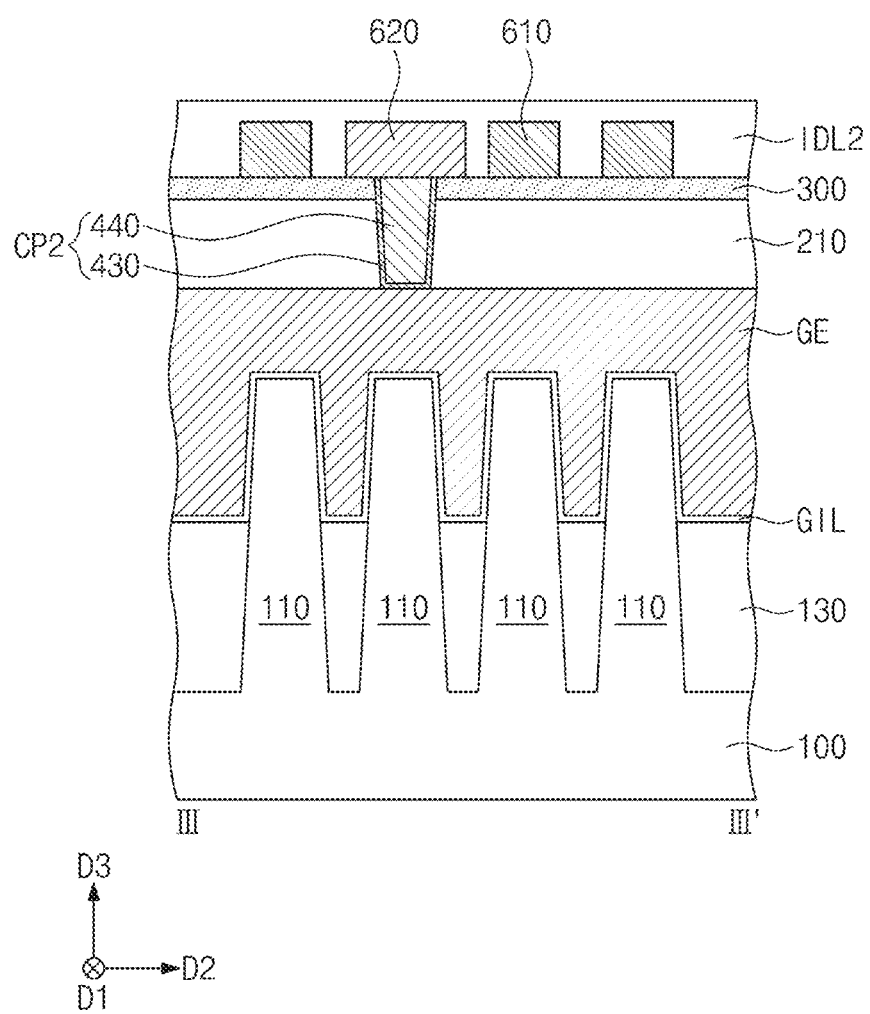
FIG. 2C is a sectional view taken along a line III-III' of FIG. 1.
Figure 2D:
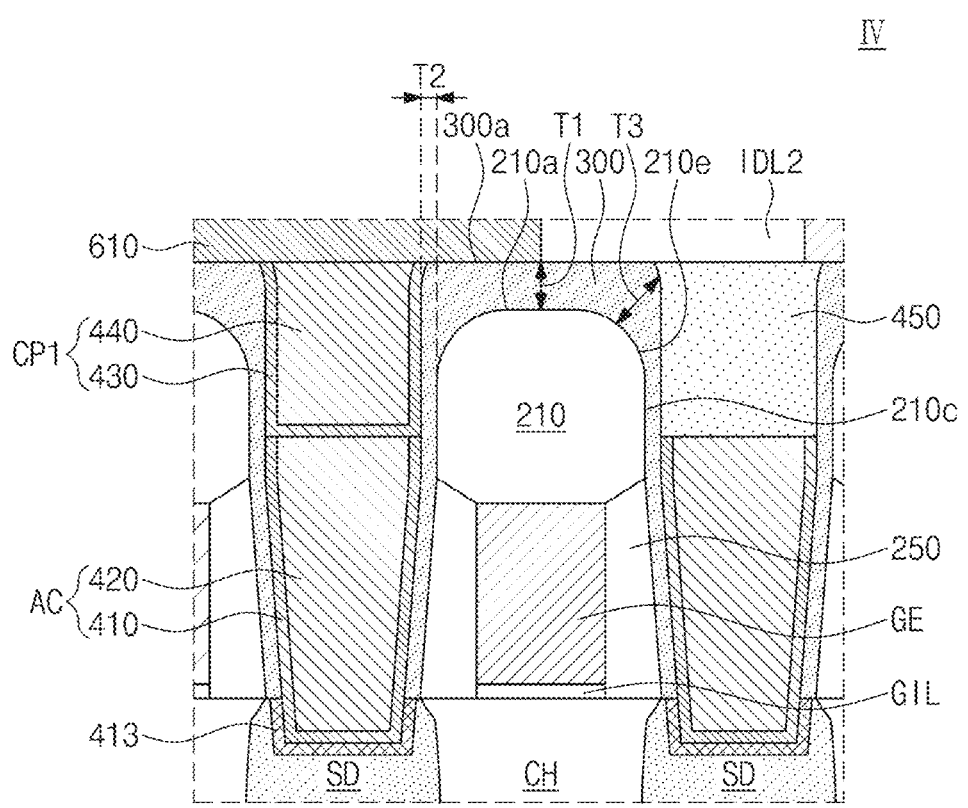
FIG. 2D is an enlarged sectional view of a portion 'IV' of FIG. 2A.

FIG. 1 is a plan view illustrating a semiconductor device according to some example embodiments of inventive concepts. FIG. 2A is a sectional view taken along a line I-I' of FIG. 1. FIG. 2B is a sectional view taken along a line II-IT of FIG. 1. FIG. 2C is a sectional view taken along a line III-III' of FIG. 1. FIG. 2D is an enlarged sectional view of a portion 'IV' of FIG. 2A. For concise description, if an element is substantially the same as that in a previous embodiment, the element may be identified by the same reference number without repeating an overlapping description thereof.

Referring to FIGS. 1, 2A, 2B, and 2C, a logic cell may be provided on a substrate 100. Transistors constituting or included in a logic circuit may be disposed on the logic cell. The substrate 100 may be or may include a semiconductor substrate that is formed of or includes silicon, germanium, and/or silicon-germanium such as single-crystal silicon, germanium, and/or silicon-germanium that is undoped or lightly doped with impurities. Alternatively or additionally, the substrate 100 may be a silicon-on-insulator (SOI) substrate and/or a compound semiconductor substrate.

An active pattern 110 may protrude upward from the substrate 100. The active pattern 110 may be defined by a trench formed in an upper portion of the substrate 100. The active pattern 110 may extended in or parallel to a first direction D1. The first direction D1 may be parallel to a bottom surface of the substrate 100. The active pattern 110 may be formed of a semiconductor material. For example, the active pattern 110 may be formed of silicon such as epitaxial single-crystal silicon. In some example embodiments, the active pattern 110 may be a portion of the substrate 100. For example, the active pattern 110 may be connected to the substrate 100 without any interface therebetween. Alternatively, the active pattern 110 may include an epitaxial layer grown from the substrate 100. The active pattern 110 may include a least a portion that is doped with dopants such as at least one of boron, phosphorus, arsenic, or carbon.

A device isolation pattern 130 may be provided on the substrate 100 to cover lower portions of side surfaces of the active pattern 110. For example, the device isolation pattern 130 may fill a lower portion of the trench. In some example embodiments, the device isolation pattern 130 may be provided to expose an upper portion of the active pattern 110. The upper portion of the active pattern 110 exposed by the device isolation pattern 130 may be called or referred to as an active fin. The device isolation pattern 130 may be formed of or include an insulating material. For example, the device isolation pattern 130 may be formed of or include at least one of silicon oxide, silicon nitride, and/or silicon oxynitride. A liner layer may be additionally interposed between the active pattern 110 and the device isolation pattern 130. The liner layer may be formed of or include a silicon-based insulating material.

A first interlayer insulating layer IDL1 may be provided on the substrate 100. The first interlayer insulating layer IDL1 may be formed of or include at least one of insulating materials (e.g., at least one of silicon oxide, silicon nitride, silicon carbide, or silicon oxynitride).

A transistor may be provided on the substrate 100. The transistor may include source/drain patterns SD, a gate insulating layer GIL, and a gate pattern GE. Hereinafter, the transistor will be described in more detail below.

The gate pattern GE may extend in or parallel to a second direction D2 to cross the active pattern 110. Here, the second direction D2 may be parallel to the bottom surface of the substrate 100 and may not be parallel to the first direction D1. For example, the first direction D1 and the second direction D2 may be orthogonal to one another; however, example embodiments are not limited thereto. A portion of the active pattern 110 below the gate pattern GE may serve as a channel region CH. The gate pattern GE may include a plurality of gate patterns GE, which are spaced apart from each other in the first direction D1.

Although not shown, each of the gate patterns GE may include a work function layer and a conductive layer, which are stacked on the substrate 100. The conductive layer may be on the work function layer; however, example embodiments are not limited thereto. The work function layer may be formed of a conductive material, which has a specific work function and is used to adjust a threshold voltage of the transistor. The work function layer may include a lower work function layer and an upper work function layer which are stacked. In some example embodiments, the lower work function layer may include a p-type work function material. The lower work function layer may include at least one metallic material (e.g., at least one of Ti, Ta, Hf, Mo, and Al) and nitrogen (N). The lower work function layer may further contain carbon (C). The upper work function layer may have a work function that is different from the lower work function layer. In some example embodiments, the upper work function layer may include an n-type work function material. For example, the upper work function layer may include aluminum (Al) and metal carbide. The metal carbide may be a compound containing at least one of Ti, Ta, W, Ru, Nb, Mo, Hf, and La and carbon. At least one of the lower and upper work function layers may be omitted. The conductive layer may be disposed on the work function layer to fill an empty space formed by the work function layer. The conductive layer may be formed of or include at least one of tungsten (W), aluminum, or tungsten alloys. Alternatively or additionally, each of the gate patterns GE may further include a barrier layer, which is interposed between the gate insulating layer GIL and the work function layer and/or between the work function layer and the conductive layer.

The barrier layer may be formed of or include at least one of metal nitrides (e.g., at least one of TiN, TaN, WN, HfN, TiAlN, TaAlN, or HfAlN).

Spacer patterns 250 may be provided on opposite side surfaces of each of the gate patterns GE. Each of the spacer patterns 250 may not be extended to a region on a top surface of a corresponding one of the gate pattern GE. The spacer patterns 250 may have top surfaces 250a that are inclined at an angle to the top surface of the substrate 100; e.g., the top surfaces 250a may not be parallel to the top surface of the substrate 100. The top surfaces 250a of the spacer patterns 250 may be provided at a level that is greater than or equal to the top surface of the gate pattern GE. The spacer patterns 250 may be formed of or include at least one of silicon nitride and/or silicon carbon nitride.

The gate insulating layer GIL may be interposed between the channel region CH of the active pattern 110 and the gate pattern GE. The gate insulating layer GIL may be formed of or include at least one of silicon oxide, silicon nitride, silicon oxynitride, and/or high-k dielectric materials. The high-k dielectric materials may have dielectric constants that are higher than that of silicon oxide. For example, the high-k dielectric materials may include at least one of hafnium-based materials (e.g., $HfO_2$, HfSiO, HfSiON, HfON, HfAlO, and/or HfLaO), silicate-based materials (e.g., AlSiO and/or TaSiO), zirconium-based material (e.g., $ZrO_2$ or ZrSiO), lanthanide-based materials (e.g., $La_2O_3$, $Pr_2O_3$, and/or $Dy_2O_3$), and quaternary oxides (e.g., BST $((Ba, Sr)TiO_3)$ or PZT $(Pb(Zr, Ti)O_3)$).

In some example embodiments, the semiconductor device may include a negative capacitance (NC) FET using a negative capacitor; however, example embodiments are not limited thereto. For example, the gate insulating layer GIL may include a ferroelectric layer (not shown) exhibiting a ferroelectric property and a paraelectric layer (not shown) exhibiting a paraelectric property.

The ferroelectric layer may have a negative capacitance, and the paraelectric layer may have a positive capacitance. In a case where two or more capacitors are connected in series and each capacitor has a positive capacitance, a total capacitance may be reduced to a value that is less than a capacitance of either of the capacitors. By contrast, in the case where at least one of serially-connected capacitors has a negative capacitance, a total capacitance of the serially-connected capacitors may have a positive value and may be greater than an absolute value of either capacitance.

In the case where a ferroelectric layer having a negative capacitance and a paraelectric layer having a positive capacitance are connected in series, a total capacitance of the serially-connected ferroelectric and paraelectric layers may be increased. Due to such an increase of the total capacitance, a transistor including the ferroelectric layer may have a subthreshold swing (SS), which is less than 60 mV/decade, at the room temperature.

The ferroelectric layer may have the ferroelectric property. The ferroelectric layer may be formed of or include at least one of, for example, hafnium oxide, hafnium zirconium oxide, barium strontium titanium oxide, barium titanium oxide, and/or lead zirconium titanium oxide. Here, the hafnium zirconium oxide may be hafnium oxide that is doped with zirconium (Zr). Alternatively or additionally, the hafnium zirconium oxide may be a compound composed of hafnium (Hf), zirconium (Zr), and/or oxygen (O).

The ferroelectric layer may further include dopants. For example, the dopants may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), and/or tin (Sn). The kind of the dopants in the ferroelectric layer may vary depending on a ferroelectric material included in the ferroelectric layer.

In a case where the ferroelectric layer includes hafnium oxide, the dopants in the ferroelectric layer may include at least one of, for example, gadolinium (Gd), silicon (Si), zirconium (Zr), aluminum (Al), and/or yttrium (Y).

In a case where the dopants are aluminum (Al), a content of aluminum in the ferroelectric layer may range from 3 to 8 at % (atomic percentage). Here, the content of the aluminum as the dopants may be a ratio of the number of aluminum atoms to the number of hafnium and aluminum atoms.

In a case where the dopants are silicon (Si), a content of silicon in the ferroelectric layer may range from 2 at % to 10 at %. In a case where the dopants are yttrium (Y), a content of yttrium in the ferroelectric layer may range from 2 at % to 10 at %. In the case where the dopants are gadolinium (Gd), a content of gadolinium in the ferroelectric layer may range from 1 at % to 7 at %. In a case where the dopants are zirconium (Zr), a content of zirconium in the ferroelectric layer may range from 50 at % to 80 at %.

The paraelectric layer may have the paraelectric property. The paraelectric layer may be formed of or include at least one of, for example, silicon oxide and/or high-k metal oxides. The metal oxides, which can be used as the paraelectric layer, may include at least one of, for example, hafnium oxide, zirconium oxide, and/or aluminum oxide, but inventive concepts are not limited to these examples.

The ferroelectric layer and the paraelectric layer may be formed of or include the same material. The ferroelectric layer may have the ferroelectric property, but the paraelectric layer may not have the ferroelectric property. For example, in a case where the ferroelectric and paraelectric layers contain hafnium oxide, a crystal structure of the hafnium oxide in the ferroelectric layer may be different from a crystal structure of the hafnium oxide in the paraelectric layer.

The ferroelectric layer may exhibit the ferroelectric property, only when its thickness is in a specific range. In some example embodiments, the ferroelectric layer may have a thickness ranging from 0.5 to 10 nm, but inventive concepts are not limited to this example. Since a critical thickness associated with the occurrence of the ferroelectric property varies depending on the kind of the ferroelectric material, the thickness of the ferroelectric layer may be changed depending on the kind of the ferroelectric material.

As an example, the gate insulating layer GIL may include a single ferroelectric layer. As another example, the gate insulating layer GIL may include a plurality of ferroelectric layers spaced apart from each other. The gate insulating layer GIL may have a multi-layered structure, in which a plurality of ferroelectric layers and a plurality of paraelectric layers are alternately stacked.

Capping patterns 210 and 220 may include a first capping pattern 210 and a second capping patterns 220. The first and second capping patterns 210 and 220 may be formed on the gate patterns GE, respectively, to cover the top surface of the gate patterns GE. Each of the first and second capping patterns 210 and 220 may be provided to cover the top surfaces 250a of a corresponding pair of the spacer patterns 250. For example, the first and second capping patterns 210 and 220 may be formed of or include at least one of silicon nitride, silicon carbonitride, and/or silicon carbon oxynitride. In some example embodiments, the capping patterns may be formed of or include silicon oxide.

The second capping patterns 220 may be spaced apart from the first capping pattern 210 in the first direction D1 and/or in a direction opposite to the first direction D1. Each of the second capping patterns 220 may have a top surface 220a, a first side surface 220c, a second side surface, and an edge 220e. The first side surface 220c of each of the second capping patterns 220 may face the first capping pattern 210. The second side surface of each of the second capping patterns 220 may be located at an opposite side of the first side surface 220c. The second side surface of each of the second capping patterns 220 may be covered with the first interlayer insulating layer IDL1. The top surface 220a of each of the second capping patterns 220 may be substantially flat or planar. For example, the top surface 220a of each of the second capping patterns 220 may be parallel to the first direction D1. The edge 220e of each of the second capping patterns 220 may be a portion, which is defined by and interposed between the top surface 220a and the first side surface 220c or by the top surface 220a and the first side surface 220c. The edge 220e of each of the second capping patterns 220 may have a sharp shape and/or a non-flat shape.

The first capping pattern 210 may be disposed between the second capping patterns 220, when viewed in a plan view. A top surface 210a of the first capping pattern 210 may be located at a level that is lower than the top surfaces 220a of the second capping patterns 220, e.g. is closer to a top surface of the substrate 100. A height of the first capping pattern 210 may be lower than a height of the second capping patterns 220. As used herein, a height of an element may be given by the largest distance between top and bottom surfaces of the element. As used herein, a level of an element may mean a vertical position of the element, e.g. relative to a top surface of the substrate 100, and a difference in level between elements may be a difference between the vertical positions of the elements measured in a third direction D3. The third direction D3 may be a direction that is substantially perpendicular to the top surface of the substrate 100 and is not parallel to, e.g. is orthogonal to, the first and second directions D1 and D2.

As shown in FIG. 2D, the first capping pattern 210 may have a top surface 210a, a side surface 210c, and an edge 210e. The edge 210e of the first capping pattern 210 may be a portion that is defined by and interposed between the top surface 210a and the side surface 210c. The edge 210e of the first capping pattern 210 may have a rounded, or beveled and rounded, shape. For example, as shown in FIG. 2A, the edge 210e of the first capping pattern 210 may have a different shape from the edge 220e of the second capping patterns 220. The edge 210e of the first capping pattern 210 may have a curvature different from the edge 220e of the second capping pattern 220. The first capping pattern 210 may be formed of or include the same material as the second capping pattern 220, and may be formed at the same time; however, example embodiments are not limited thereto.

A first insulating pattern 300 may be disposed on the first capping pattern 210. For example, the first insulating pattern 300 may cover the top surface 210a, the side surface 210c, and the edge 210e of the first capping pattern 210.

The first insulating pattern 300 may cover the first capping pattern 210 in a non-conformal manner. For example, the first insulating pattern 300 may have a first thickness T1, a second thickness T2, and a third thickness T3, each of which or at least two of which are different from each other. The first thickness T1 may be a thickness of the first insulating pattern 300 measured on the top surface 210a of the first capping pattern 210. The second thickness T2 may be a thickness of the first insulating pattern 300 measured on the side surface 210c of the first capping pattern 210. The third thickness T3 may be a thickness of the first insulating pattern 300 measured on the edge 210e of the first capping pattern 210. The first thickness T1 may be different from the second thickness T2 and the third thickness T3. For example, the first thickness T1 may be larger than the second thickness T2. The third thickness T3 may be different from the second thickness T2. For example, the third thickness T3 may be greater than the second thickness T2 and may be less than the first thickness T1.

The first insulating pattern 300 may have a top surface 300a that is placed at substantially the same level as, e.g. is planar with, the top surfaces 220a of the second capping patterns 220. A small height of the first capping pattern 210 may be compensated by the first insulating pattern 300. For example, a sum of the first thickness T1 of the first insulating pattern 300 and the height of the first capping pattern 210 may be substantially equal to the height of the second capping patterns 220. As used herein, if physical and/or chemical properties (e.g., thickness, level, width, shape, curvature, and/or composition ratio) of two elements are within tolerance margins thereof or engineering tolerance margins thereof, the elements will be described to be the same as each other in terms of such a property.

The first insulating pattern 300 may be provided on a pair of the spacer patterns 250 to cover the outer side surfaces of the spacer patterns 250. The first insulating pattern 300 may have a fourth thickness. The fourth thickness may be a thickness of the first insulating pattern 300 measured on the outer side surfaces of the spacer patterns 250. The fourth thickness may be less than 2 nm. In a case where the fourth thickness is less than 2 nm, it may be easy to secure a space for an active contact AC, which will be described below. The first insulating pattern 300 may be provided to cover an inner side surface of the first interlayer insulating layer IDL1, as shown in FIG. 2B.

The first insulating pattern 300 may be formed of or include the same material as the first capping pattern 210. Alternatively or additionally, the first insulating pattern 300 may be formed of or include the same compound as the first capping pattern 210, and in this case, a composition ratio of the first insulating pattern 300 may be different from a composition ratio of the first capping pattern 210. In some example embodiments, the first insulating pattern 300 may be formed of or include a material different from the first capping pattern 210. The first insulating pattern 300 may further include a first additional element. In a case where the transistor is an NMOSFET, the first additional element may be a Group V element (e.g., phosphorus (P)), and in the case where the transistor is a PMOSFET, the first additional element may be Group III element (e.g., boron (B)).

In some example embodiments, a plurality of the first capping patterns 210 and a plurality of the first insulating patterns 300 may be provided. In this case, the first insulating patterns 300 may be disposed on the first capping patterns 210, respectively. For convenience in description, one of the first capping patterns 210 and one of the first insulating patterns 300 will be described below.

Second insulating patterns 320 may be disposed on the first side surfaces 220c of the second capping patterns 220, respectively. The second insulating patterns 320 may be further extended to cover the outer side surfaces of the spacer patterns 250. The second insulating patterns 320 may be spaced apart from the first insulating pattern 300 in the first direction D1. The second insulating patterns 320 may be formed of or include the same material as the first insulating pattern 300. Alternatively or additionally, the second insulating pattern 320 may further include a second additional element. The second additional element may be the same element as the first additional element. A thickness of the second insulating patterns 320 may be smaller than the first thickness T1 of the first insulating pattern 300, but inventive concepts are not limited to this example.

The source/drain patterns SD may be provided on the active pattern 110 and at both sides of the gate patterns GE. A plurality of recess portions RS may be formed in an upper portion of the active pattern 110. The source/drain patterns SD may be provided in the recess portions RS, respectively. A portion of the active pattern 110 between the source/drain patterns SD may serve as or correspond to the channel region CH of the transistor. Top surfaces of the source/drain patterns SD may be located at a level that is lower than the topmost surface of the channel region CH. Unlike a illustrated in the drawings, the top surfaces of the source/drain patterns SD may be located at a level, e.g. may be planar at a higher than or equal to the topmost surface of the channel region CH. The top surfaces of the source/drain patterns SD may not be covered with the first insulating pattern 300 and the second insulating patterns 320.

The source/drain patterns SD may be epitaxial patterns. The epitaxial pattern may mean a pattern that is formed by an epitaxial growth process, e.g. a selective epitaxial growth (SEG) process. The source/drain patterns SD may be formed of or include at least one of semiconductor materials (e.g., silicon, germanium, silicon-germanium (SiGe), and/or silicon carbide (SiC)). The source/drain patterns SD may have a lattice constant different from the active patterns 110. Due to the difference in lattice constant the source/drain patterns SD and the active pattern 110, the source/drain patterns SD may exert or induce a stress on the channel region CH of the active pattern 110. Such a stress may be compressive; however, example embodiments are not limited thereto. For example, alternatively or additionally in some example embodiments, the source/drain patterns SD may be configured such that the stress is tensile.

The source/drain patterns SD may further include an impurity. The impurity may be the same element or the same conductivity type as the first additional element in the first insulating pattern 300 and the second additional element in the second insulating pattern 320. For example, in the case where the transistor is an NMOSFET, the impurity may be a Group V element (e.g., at least one of phosphorus (P) or arsenic (As)), and in the case where the transistor is a PMOSFET, the impurity may be Group III element (e.g., boron (B)). Since the source/drain patterns SD contain the impurities, the transistor may have improved electric characteristics.

As shown in FIG. 2A, the source/drain patterns SD may be spaced apart from each other in the first direction D1. As shown in FIG. 2B, each of the source/drain patterns SD may include a plurality of source/drain portions SDP. The source/drain portions SDP may be provided on the active patterns 110, respectively. The source/drain portions SDP, which are arranged in the second direction D2, may be merged to constitute each of the source/drain pattern SD. Unlike that illustrated in the drawings, the source/drain portions SDP may be spaced apart from each other in the second direction D2.

The first interlayer insulating layer IDL1 may have a or define first contact hole 491. As shown in FIG. 2B, the first contact hole 491 may be provided to penetrate the first interlayer insulating layer IDL1 and to expose the source/drain pattern SD. The first contact hole 491 may be extended in the second direction D2. The first contact hole 491 may be formed to expose the side surface of the first insulating pattern 300. A plurality of the first contact holes 491 may be provided, as shown in FIG. 2A.

Active contacts AC may be provided on and coupled to (e.g. electrically connected to) the source/drain patterns SD, respectively. The active contacts AC may be provided in lower portions of the first contact holes 491, respectively. Each of the active contacts AC may be extended in the second direction D2, when viewed in a plan view. As shown in FIG. 2A, the active contacts AC may be spaced apart from each other in the first direction D1 and may be electrically separated from each other. First contact patterns CP1 may be respectively disposed between adjacent ones of the gate patterns GE. The active contacts AC may be disposed in the first interlayer insulating layer IDL1, as shown in FIG. 2B.

The active contacts AC may be self-aligned contacts. For example, the active contacts AC may be formed using the first insulating pattern 300 in a self-aligned manner. In this case, each of the active contacts AC may cover at least a portion of the side surface of the first insulating pattern 300. The active contacts AC may have top surfaces that are located at a level lower than, e.g. closer to a top surface of the substrate 100 as, the top surface 300a of the first insulating pattern 300. Alternatively, at least one of the active contacts AC may be formed using the first and second insulating patterns 300 and 320, which are placed around the same, in a self-aligned manner. In this case, the active contact AC may cover the side surfaces of the first and second insulating patterns 300 and 320.

Each of the active contacts AC may include a first barrier pattern 410 and a first conductive pattern 420. The first barrier pattern 410 may be interposed between the first conductive pattern 420 and the first insulating pattern 300 and between the first conductive pattern 420 and a corresponding one of the source/drain patterns SD. The first barrier pattern 410 may cover, e.g. may conformally cover side and bottom surfaces of the first conductive pattern 420. The first barrier pattern 410 may not cover a top surface of the first conductive pattern 420. The first barrier pattern 410 may be formed of or include at least one of metal nitrides (e.g., titanium nitride, tungsten nitride, and/or tantalum nitride).

The first conductive pattern 420 may be disposed on the first barrier pattern 410. The first conductive pattern 420 may be formed of or include a material different from the first barrier pattern 410. The first conductive pattern 420 may be formed of or include at least one of metallic material (e.g., aluminum, copper, tungsten, molybdenum, and/or cobalt).

Silicide patterns 413 may be respectively interposed between the active contacts AC and the source/drain patterns SD. The active contacts AC may be electrically connected to the source/drain patterns SD, respectively, through the silicide patterns 413. The silicide patterns 413 may be formed of or include at least one of metal silicide materials. For example, the metal silicide materials may include titanium silicide, tantalum silicide, tungsten silicide, nickel silicide, and/or cobalt silicide.

Gapfill patterns 450 may be disposed on the active contacts AC to cover the top surfaces of the active contacts AC. The gapfill patterns 450 may be provided to fill the upper portions of the first contact holes 491, respectively. The gapfill pattern 450 may be formed of or include at least one of silicon-based insulating materials (e.g., silicon nitride, silicon oxide, silicon carbonitride, and/or silicon carbon oxynitride). The gapfill patterns 450 may have top surfaces that are coplanar with the top surface 300a of the first insulating pattern 300. Each of the gapfill patterns 450 may have a second contact hole 492, as shown in FIG. 2B. The second contact hole 492 may be provided to penetrate a corresponding one of the gapfill patterns 450 and to expose a corresponding one of the active contacts AC.

The first contact pattern CP1 may be disposed on a corresponding one of the active contacts AC, in the second contact hole 492. The first contact pattern CP1 may be electrically connected to or directly electrically connected to the corresponding one of the active contacts AC.

The first contact pattern CP1 may be formed using the first insulating pattern 300 in a self-aligned manner. For example, the first contact pattern CP1 may be formed to cover the side surface of the first insulating pattern 300. The top surface of the first contact pattern CP1 may be coplanar with the top surfaces 300a of the first insulating pattern 300. The top surface of the first contact pattern CP1 may be located at substantially the same level as, e.g. may be planar with, the top surfaces of the gapfill patterns 450. The first insulating pattern 300 may be interposed between the first capping pattern 210 and the first contact pattern CP1 and between the first capping pattern 210 and the gapfill pattern 450. The first insulating pattern 300 may have a first side surface and a second side surface that are opposite to each other. The first side surface of the first insulating pattern 300 may be covered with the first contact pattern CP1, and the second side surface of the first insulating pattern 300 may be covered with a corresponding one of the gapfill patterns 450.

The first contact pattern CP1 may include a second barrier pattern 430 and a second conductive pattern 440. The second barrier pattern 430 may be interposed between the second conductive pattern 440 and the first insulating pattern 300 and between the second conductive pattern 440 and the first conductive pattern 420. As shown in FIG. 2B, the second barrier pattern 430 may be interposed between the second conductive pattern 440 and a corresponding one of the gapfill patterns 450. The second barrier pattern 430 may cover side and bottom surfaces of the second conductive pattern 440. The second barrier pattern 430 may not cover a top surface of the second conductive pattern 440. The second barrier pattern 430 may be formed of or include at least one of metal nitrides (e.g., titanium nitride, tungsten nitride, and/or tantalum nitride). The second conductive pattern 440 may be disposed on the second barrier pattern 430. The second conductive pattern 440 may be formed of or include a material different from the second barrier pattern 430. The second conductive pattern 440 may be formed of or include a material that is the same as or different from the first conductive pattern 420. The second conductive pattern 440 may be formed of or include at least one of metallic materials (e.g., aluminum, copper, tungsten, molybdenum, and/or cobalt).

In some example embodiments, as shown in FIG. 1, a plurality of the first contact patterns CP1 may be provided to be coupled to the active contacts AC, respectively. The first contact patterns CP1 may be electrically disconnected or isolated from each other. The first contact patterns CP1 on adjacent ones of the source/drain patterns SD may not be aligned to each other in the first direction D1. This may make it possible to more easily form the first contact patterns CP1.

First interconnection patterns 610 may be disposed on the first contact patterns CP1, respectively. The first interconnection patterns 610 may be extended in the first direction D1, when viewed in a plan view. The first interconnection patterns 610 may be spaced apart from each other in the second direction D2. For convenience in description, one of the first contact patterns CP1 and one of the first interconnection patterns 610 will be described below.

A second contact pattern CP2, e.g. a gate contact pattern, may be provided to penetrate the first capping pattern 210 and the first insulating pattern 300. The second contact pattern CP2 may be disposed on and coupled to one of the gate patterns GE. The second contact pattern CP2 may be laterally spaced apart from the first contact pattern CP1 and may be electrically separated from the first contact pattern CP1. The second contact pattern CP2 may include the same, or different, materials from the first contact pattern CP1.

Each of the second contact patterns CP2 may include a third barrier pattern 433 and a third conductive pattern 443. The third barrier pattern 433 may cover side and bottom surfaces of the third conductive pattern 443. The third barrier pattern 433 may not cover a top surface of the third conductive pattern 443. The third barrier pattern 433 may be formed of or include at least one of metal nitrides (e.g., titanium nitride, tungsten nitride, or tantalum nitride). The third barrier pattern 433 may be formed of or include the same material as the second barrier pattern 430, but inventive concepts are not limited to this example. The third conductive pattern 443 may be disposed on the third barrier pattern 433. The third conductive pattern 443 may be formed of or include the same material as the second conductive pattern 440, but inventive concepts are not limited to this example. The third conductive pattern 443 may be formed of or include at least one of metallic materials (e.g., aluminum, copper, tungsten, molybdenum, and cobalt).

Unlike that illustrated in the drawings, the second barrier pattern 430 and the third barrier pattern 433 may be omitted.

A second interconnection pattern 620 may be disposed on the second contact pattern CP2 and may be coupled to the second contact pattern CP2. The second interconnection pattern 620 may be spaced apart from and electrically disconnected from the first interconnection pattern 610. The second interconnection pattern 620 may be formed of or include at least one of metallic materials. Although not shown, a plurality of second interconnection patterns 620 may be coupled to the second contact patterns CP2, respectively. The second contact patterns CP2 may be coupled to the gate patterns GE, respectively. For convenience in description, one of the second contact patterns CP2 will be described below.

In some example embodiments, there may be a need or desire to separate the first contact pattern CP1 from the second contact pattern CP2 by a certain variable or predetermined distance. In a case where the distance between the first and second contact patterns CP1 and CP2 is small, an electric short circuit may be formed between the first and second contact patterns CP1 and CP2. The short circuit may cause a loss of yield and/or a loss of reliability. However according to some example embodiments of inventive concepts, since the gapfill pattern 450, the first capping pattern 210, and the first insulating pattern 300 are disposed between the first and second contact patterns CP1 and CP2, the first and second contact patterns CP1 and CP2 may be effectively or more effectively spaced apart from each other. Accordingly, it may be possible to prevent or reduce the likelihood of or impact from an electric short circuit from being formed between the first and second contact patterns CP1 and CP2.

In a case where the first insulating pattern 300 is omitted, there may be a difficulty in forming at least one of the first and second contact patterns CP1 and CP2, due to the difference in a level between the top surfaces 210a and 220a of the first and second capping patterns 210 and 220. According to some example embodiments of inventive concepts, since the first insulating pattern 300 is provided, the difference in level between the top surfaces 210a and 220a of the first and second capping patterns 210 and 220 may be compensated. Accordingly, it may be possible to form the first and second contact patterns CP1 and CP2 in a desired shape and/or to realize a semiconductor device with improved reliability and/or improved yield.

A second interlayer insulating layer IDL2 may be disposed on the first interlayer insulating layer IDL1 to cover the top surface 210a of the first capping pattern 210, the top surface 300a of the first insulating pattern 300, the top surfaces 220a of the second capping patterns 220, the top surfaces of the second insulating patterns 320, and the top surface of the gapfill pattern 450. The second interlayer insulating layer IDL2 may cover the first interconnection pattern 610 and the second interconnection patterns 620. Unlike that illustrated in the drawings, the second interlayer insulating layer IDL2 may be further extended into regions between the first interconnection pattern 610 and the first insulating pattern 300 and between the second interconnection pattern 620 and the first insulating pattern 300. The second interlayer insulating layer IDL2 may be formed of or include at least one of silicon-based insulating materials.

Figure 2E:
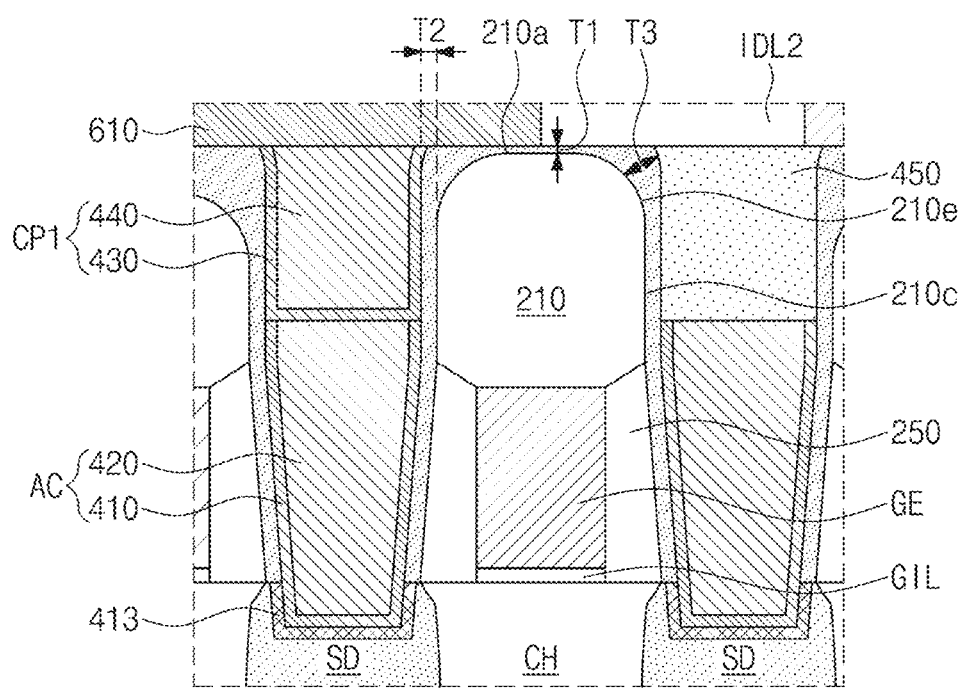
FIG. 2E is a sectional view illustrating a first insulating pattern according to some example embodiments of inventive concepts.

FIG. 2E is a sectional view illustrating a first insulating pattern according to some example embodiments of inventive concepts and illustrates an enlarged structure of the portion 'IV' of FIG. 2A.

Referring to FIG. 2E, the first insulating pattern 300 may be provided to cover the side surface 210c, the edge 210e, and the top surface 210a of the first capping pattern 210. The edge 210e of the first capping pattern 210 may have a rounded shape. The first thickness T1 of the first insulating pattern 300 may be smaller than the third thickness T3. The first thickness T1 of the first insulating pattern 300 may be smaller than the second thickness T2. Unlike that illustrated in the drawings, the first thickness T1 may be less than the third thickness T3 but larger than the second thickness T2. Alternatively, the first thickness T1 may be equal to the second thickness T2 or the third thickness T3.

The first insulating pattern 300 may be extended to cover outer side surfaces of the spacer patterns 250. The first insulating pattern 300 may have a fourth thickness on the outer side surfaces of the spacer patterns 250. The fourth thickness may be less than 2 nm. The fourth thickness may be equal to or less than the second thickness T2.

Figure 3A:
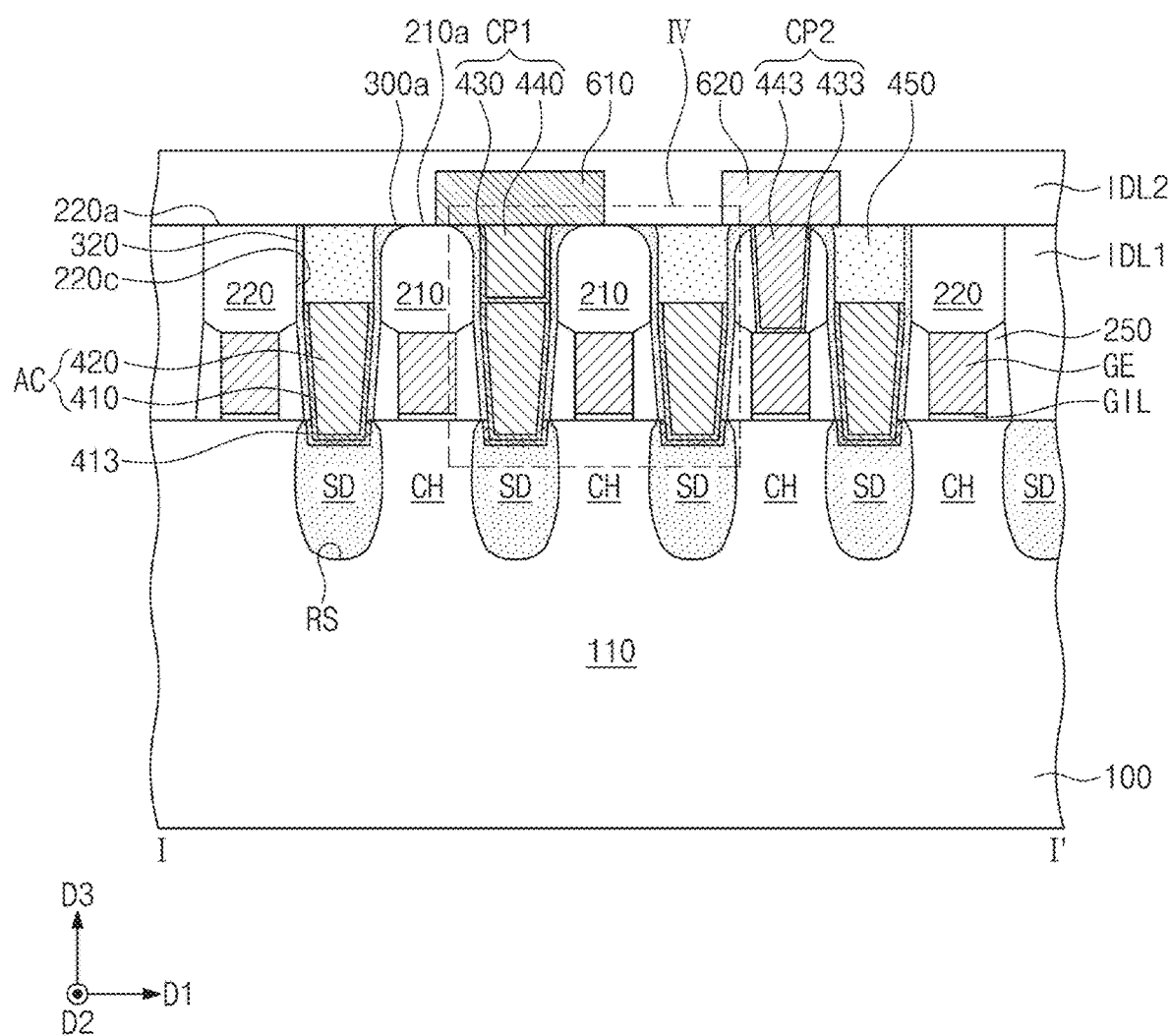
FIG. 3A is a sectional view illustrating a semiconductor device according to some example embodiments of inventive concepts.
Figure 3B:
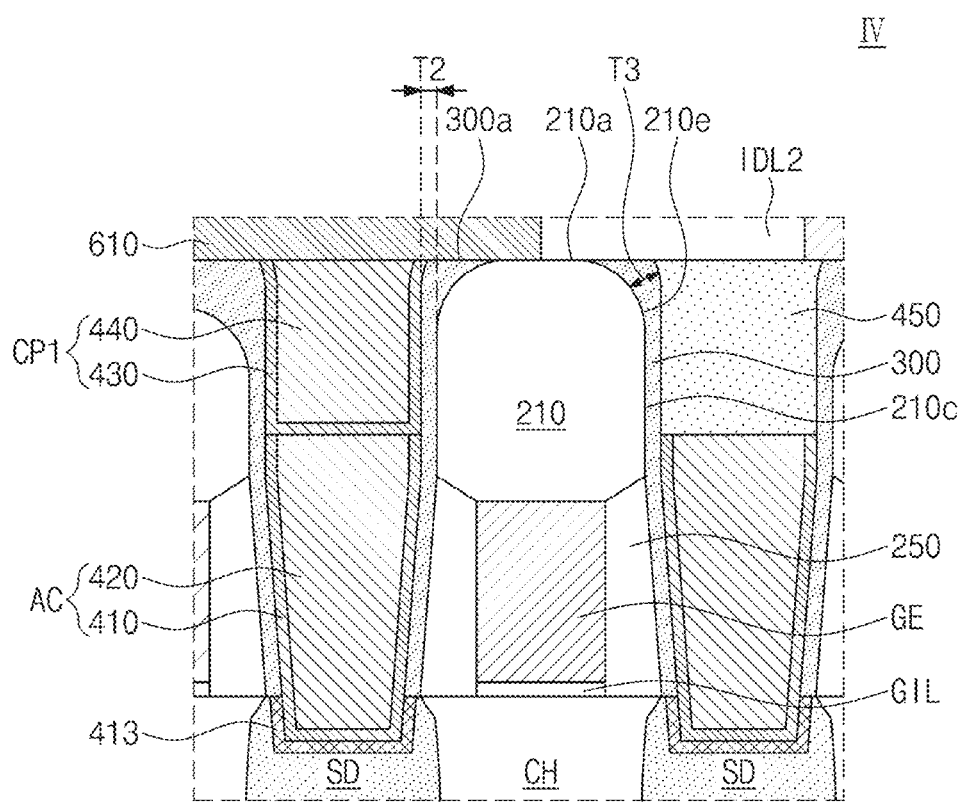
FIG. 3B is an enlarged sectional view of a portion 'IV' of FIG. 3A.

FIG. 3A is a sectional view, which is taken along a line I-I' of FIG. 1 to illustrate a semiconductor device according to some example embodiments of inventive concepts. FIG. 3B is an enlarged sectional view of a portion 'IV' of FIG. 3A.

Referring to FIGS. 3A and 3B, the semiconductor device may include the substrate 100, the device isolation pattern 130, the gate pattern GE, the spacer patterns 250, the active contact AC, the first capping pattern 210, the second capping pattern 220, the first insulating pattern 300, the second insulating pattern 320, the first contact pattern CP1, the second contact pattern CP2, and the gapfill pattern 450.

The first insulating pattern 300 may cover the side surface 210c and the edge 210e of the first capping pattern 210 but may not cover the top surface 210a of the first capping pattern 210. The top surface 300a of the first insulating pattern 300 and the top surface 210a of the first capping pattern 210 may be located at substantially the same level to be coplanar with each other. The top surface 210a of the first capping pattern 210 may be disposed at substantially the same level as the top surface of the second insulating pattern 320, the top surface 220a of the second capping pattern 220, and the top surface of the gapfill pattern 450.

Figure 4A:
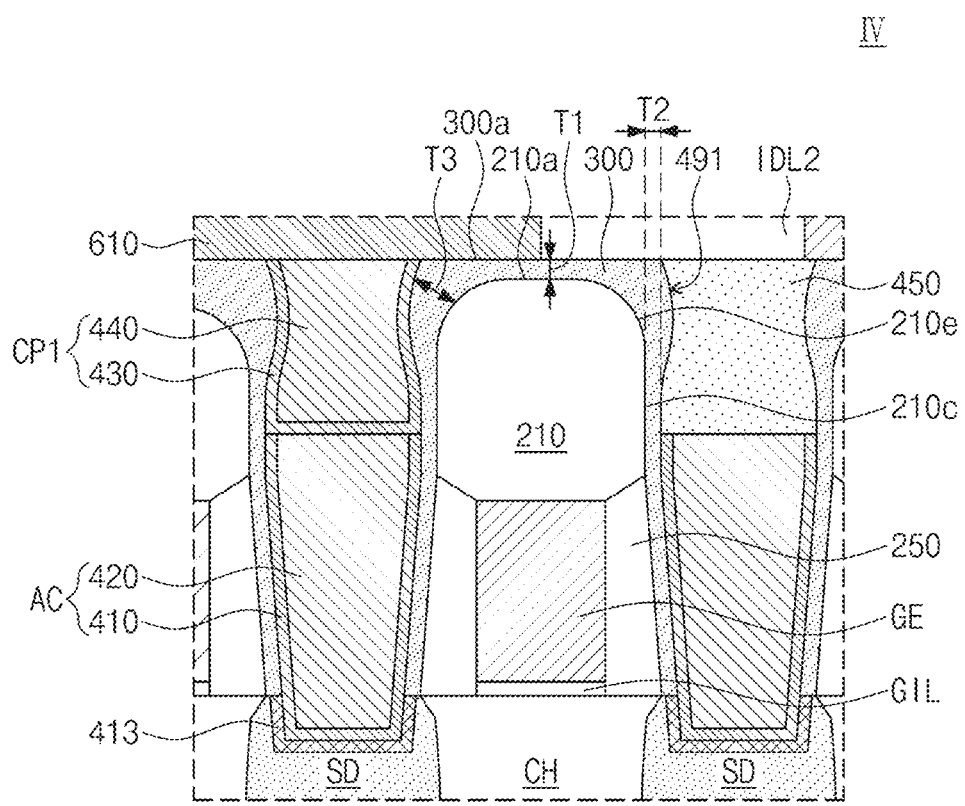
FIG. 4A is a sectional view illustrating a first insulating pattern according to some example embodiments of inventive concepts.

FIG. 4A is a sectional view illustrating a first insulating pattern according to some example embodiments of inventive concepts and illustrates an enlarged structure of the portion 'IV' of FIG. 2A.

Referring to FIG. 4A, the first insulating pattern 300 may cover the side surface 210c, the edge 210e, and the top surface 210a of the first capping pattern 210. The edge 210e of the first capping pattern 210 may have a rounded shape. The first insulating pattern 300 on the edge 210e of the first capping pattern 210 may define an entrance of the first contact hole 491. The first contact hole 491 may have a relatively small width. The first insulating pattern 300 on the edge 210e of the first capping pattern 210 may have a horizontally protruding shape, compared with the first insulating pattern 300 on the side surface 210c of the first capping pattern 210. The second thickness T2 of the first insulating pattern 300 may be larger than the first thickness T1 and the third thickness T3.

Figure 4B:
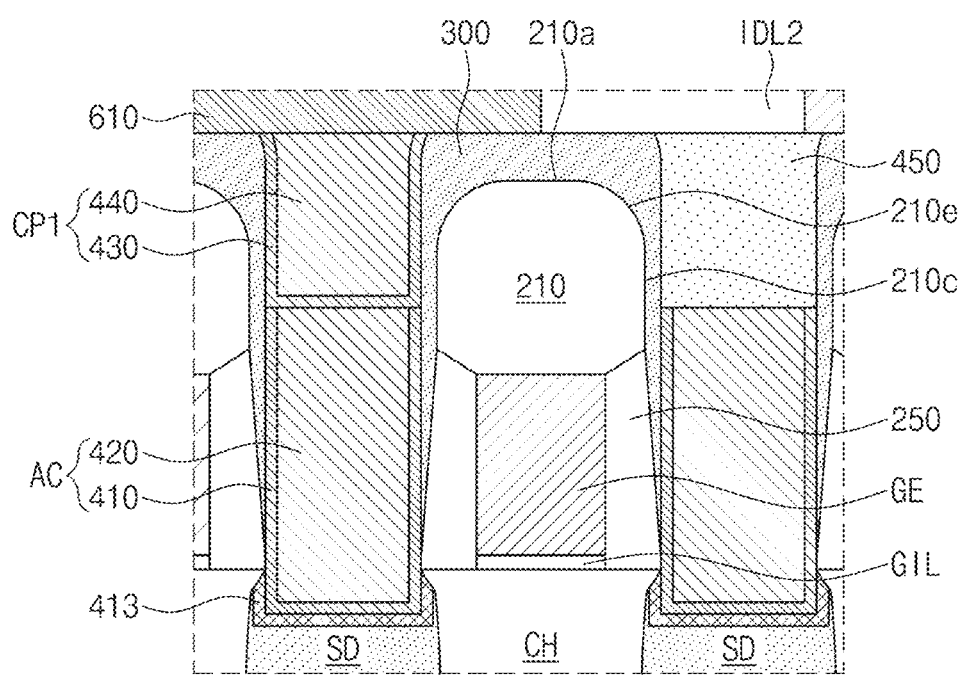
FIG. 4B is a sectional view illustrating a first insulating pattern according to some example embodiments of inventive concepts.

FIG. 4B is a sectional view illustrating a first insulating pattern according to some example embodiments of inventive concepts and illustrates an enlarged structure of the portion 'IV' of FIG. 2A).

Referring to FIG. 4B, the first insulating pattern 300 may cover the side surface 210c, the edge 210e, and the top surface 210a of the first capping pattern 210. However, the first insulating pattern 300 may not cover at least a portion of the spacer patterns 250. For example, the first insulating pattern 300 may not cover lower portions of the outer side surfaces of the spacer patterns 250. At least a portion of the outer side surfaces of the spacer patterns 250 may be in direct contact with the active contacts AC.

Unlike that illustrated in the drawings, the first insulating pattern 300 may not cover upper and lower portions of the outer side surfaces of the spacer patterns 250. The first insulating pattern 300 may be spaced apart from the spacer patterns 250.

Figure 4C:
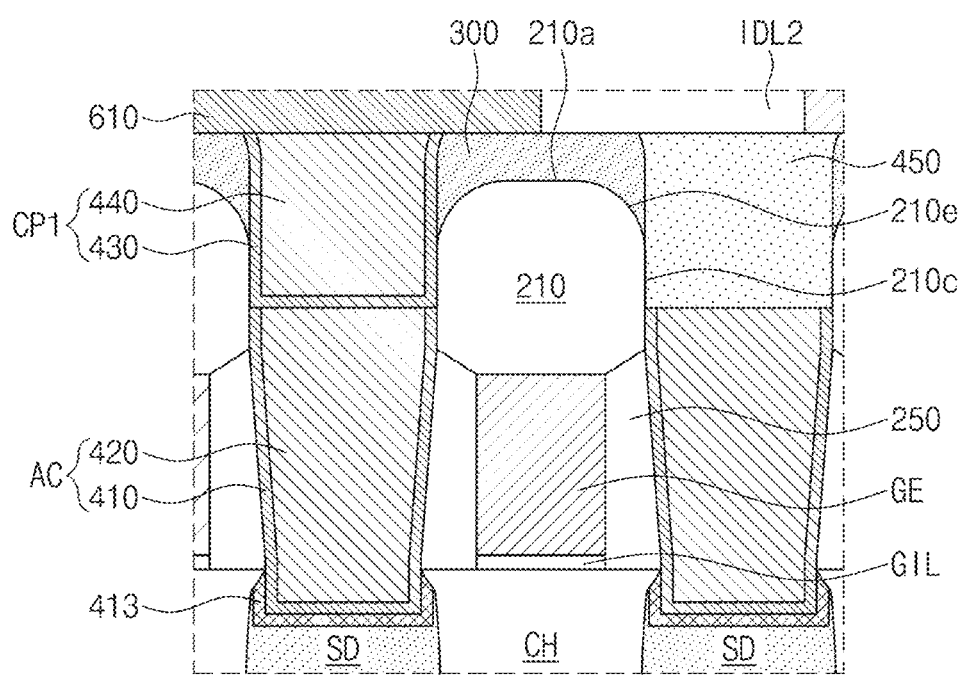
FIG. 4C is a sectional view illustrating a first insulating pattern according to some example embodiments of inventive concepts.

FIG. 4C is a sectional view illustrating a first insulating pattern according to some example embodiments of inventive concepts and illustrates an enlarged structure of the portion 'IV' of FIG. 2A). For convenience in description, one of the spacer patterns will be described below.

Referring to FIGS. 2A and 4C, the first insulating pattern 300 may cover the top surface 210a of the first capping pattern 210. However, the first insulating pattern 300 may not cover the spacer patterns 250 and the side surface 210c of the first capping pattern 210. The side surface 210c of the first capping pattern 210 may be in physical contact with at least one of the gapfill pattern 450 and the first contact pattern CP1. The first insulating pattern 300 may also cover the edge 210e of the first capping pattern 210. In some example embodiments, the first insulating pattern 300 may not cover the edge 210e of the first capping pattern 210.

In this case, the first side surface 220c of the second capping pattern 220 may be in direct contact with the gapfill pattern 450 without the second insulating pattern 320 described with reference to FIG. 2A.

Figure 4D:
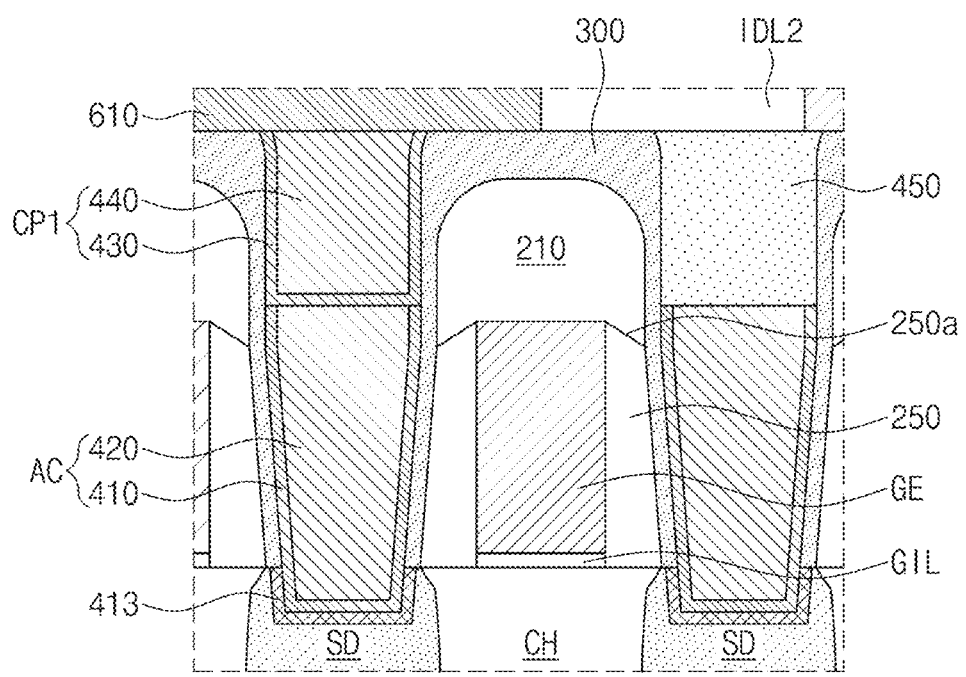
FIG. 4D is a sectional view illustrating a first insulating pattern according to some example embodiments of inventive concepts.

FIG. 4D is a sectional view illustrating a first insulating pattern according to some example embodiments of inventive concepts and illustrates an enlarged structure of the portion 'IV' of FIG. 2A).

Referring to FIG. 4D, the top surface of the gate pattern GE may be located at a level that is higher than or equal to the top surface 250a of the spacer pattern 250. The top surface 250a of the spacer pattern 250 may be inclined at an angle, e.g. at an angle relative to the top surface of the substrate 100. For example, the top surface 250a of the spacer pattern 250 may have a first top surface and a second top surface. The first top surface of the spacer pattern 250 may be provided on the gate pattern GE and the second top surface, when viewed in a plan view. The first top surface of the spacer pattern 250 may be located at a level higher than the second top surface.

Figure 4E:
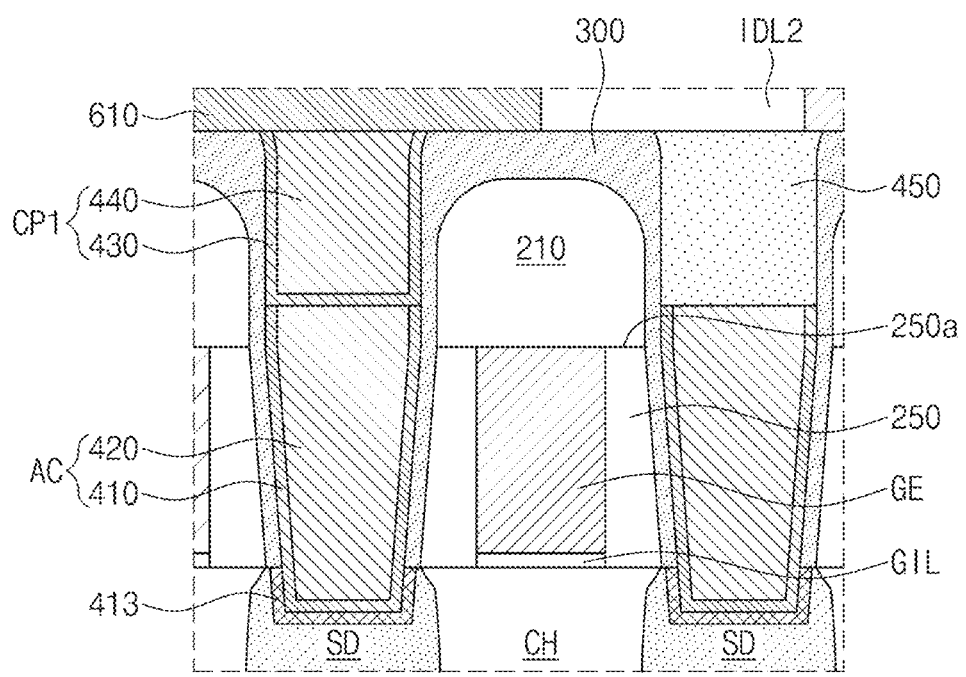
FIG. 4E is a sectional view illustrating a first insulating pattern according to some example embodiments of inventive concepts.

FIG. 4E is a sectional view illustrating a first insulating pattern according to some example embodiments of inventive concepts and illustrates an enlarged structure of the portion 'IV' of FIG. 2A.

Referring to FIG. 4E, the top surface of the gate pattern GE may be disposed at the same level as the top surface 250a of the spacer pattern 250. The top surface of the gate pattern GE may be substantially flat, and the top surface 250a of the spacer pattern 250 may be substantially flat.

Figure 5A:
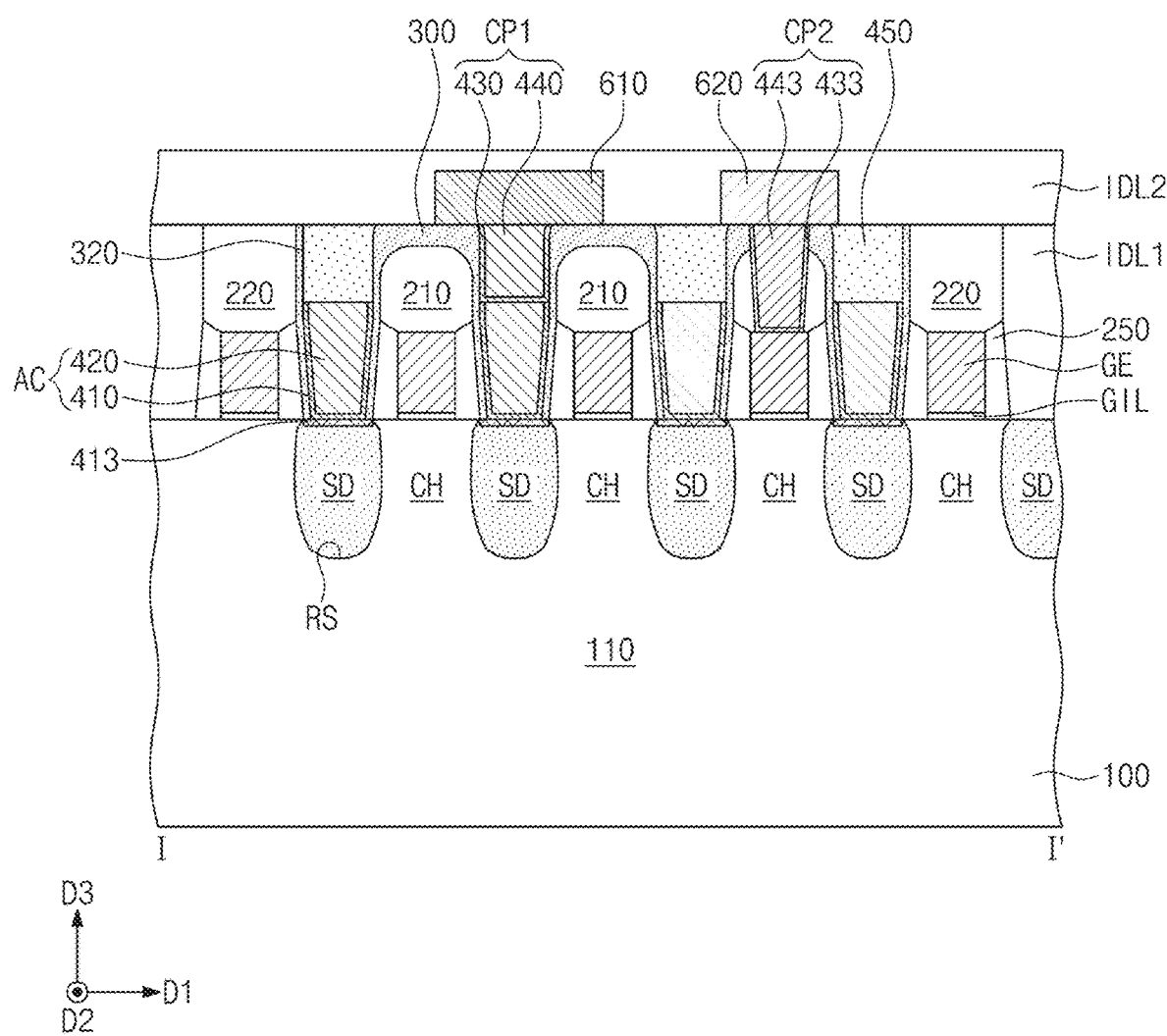
FIGS. 5A and 5B are sectional views which are respectively taken along lines II-IT and III-III' of FIG. 1 to illustrate a semiconductor device according to some example embodiments of inventive concepts.
Figure 5B:
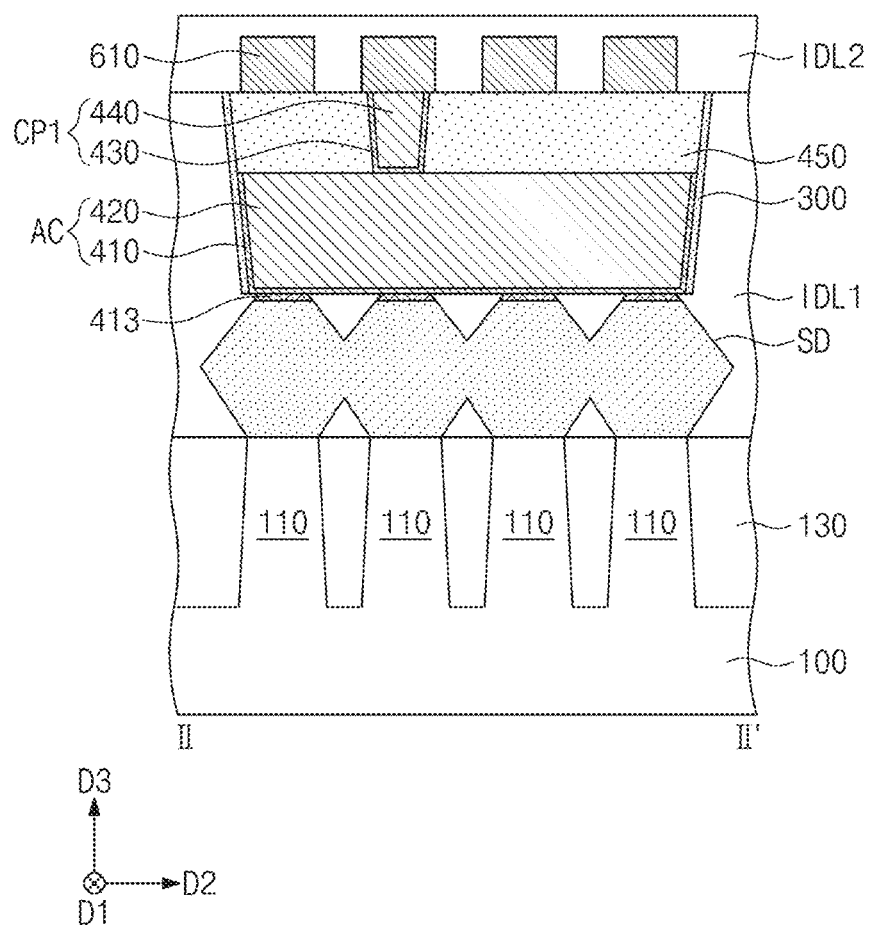

FIGS. 5A and 5B are sectional views which are respectively taken along lines II-IT and III-III' of FIG. 1 to illustrate a semiconductor device according to some example embodiments of inventive concepts.

Referring to FIGS. 5A and 5B, the semiconductor device may include the substrate 100, the device isolation pattern 130, the gate pattern GE, the spacer patterns 250, the active contact AC, the first capping pattern 210, the second capping pattern 220, the first insulating pattern 300, the second insulating pattern 320, the first contact pattern CP1, the second contact pattern CP2, and the gapfill pattern 450.

The bottom surfaces of the active contacts AC may be located at a level that is higher than or equal to the top surface of the channel region CH of the active pattern 110. As shown in FIG. 5B, the bottom surfaces of the active contacts AC may be substantially flat. At least a portion of the first interlayer insulating layer IDL1 may be interposed between a corresponding pair of the source/drain pattern SD and the active contact AC. The level and shape of the bottom surfaces of the active contacts AC are not limited to the illustrated example and may be variously changed.

Figure 6A:
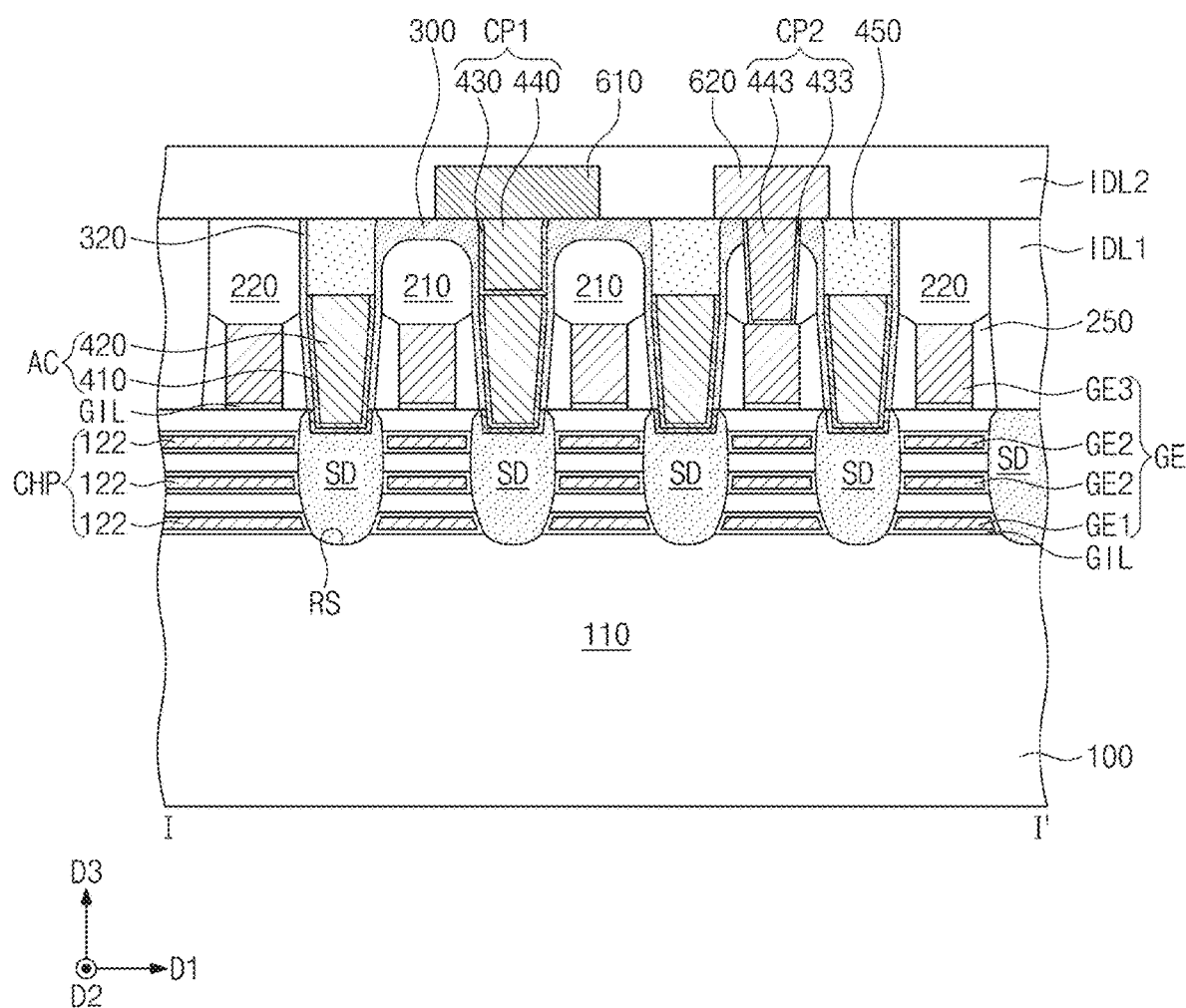
FIGS. 6A, 6B, and 6C are sectional views illustrating a semiconductor device according to some example embodiments of inventive concepts.
Figure 6B:
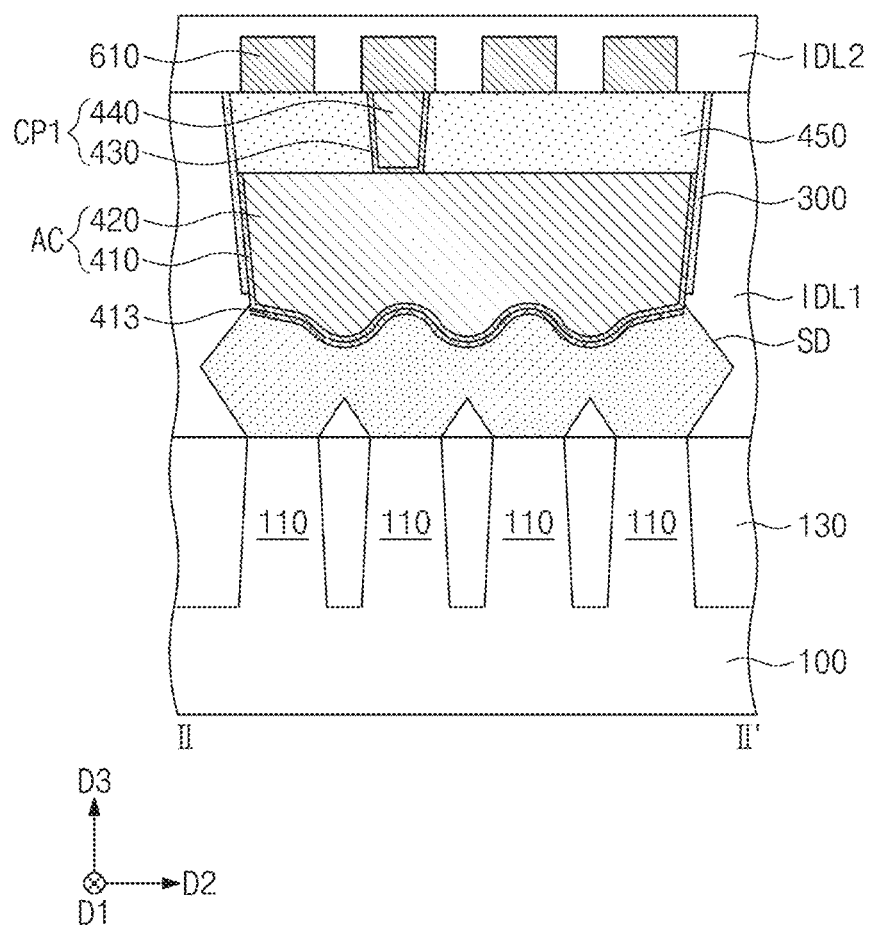
Figure 6C:
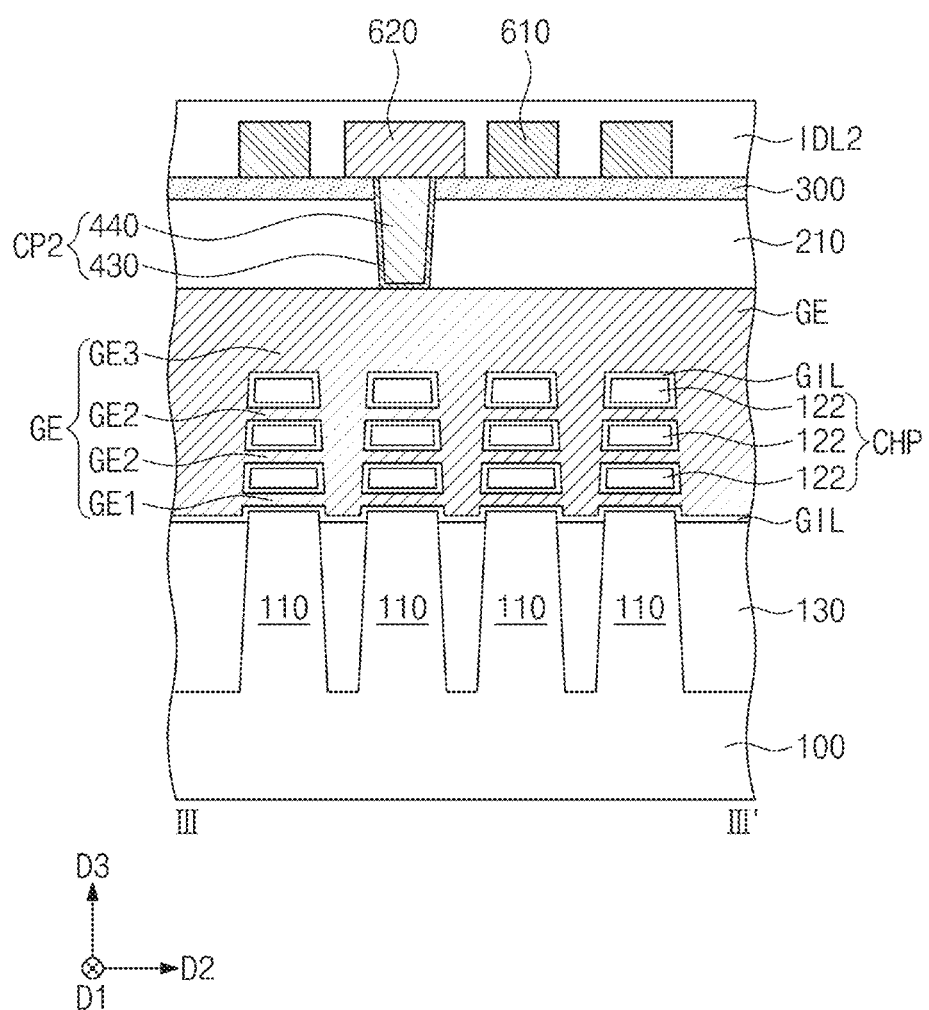
Figure 7A:
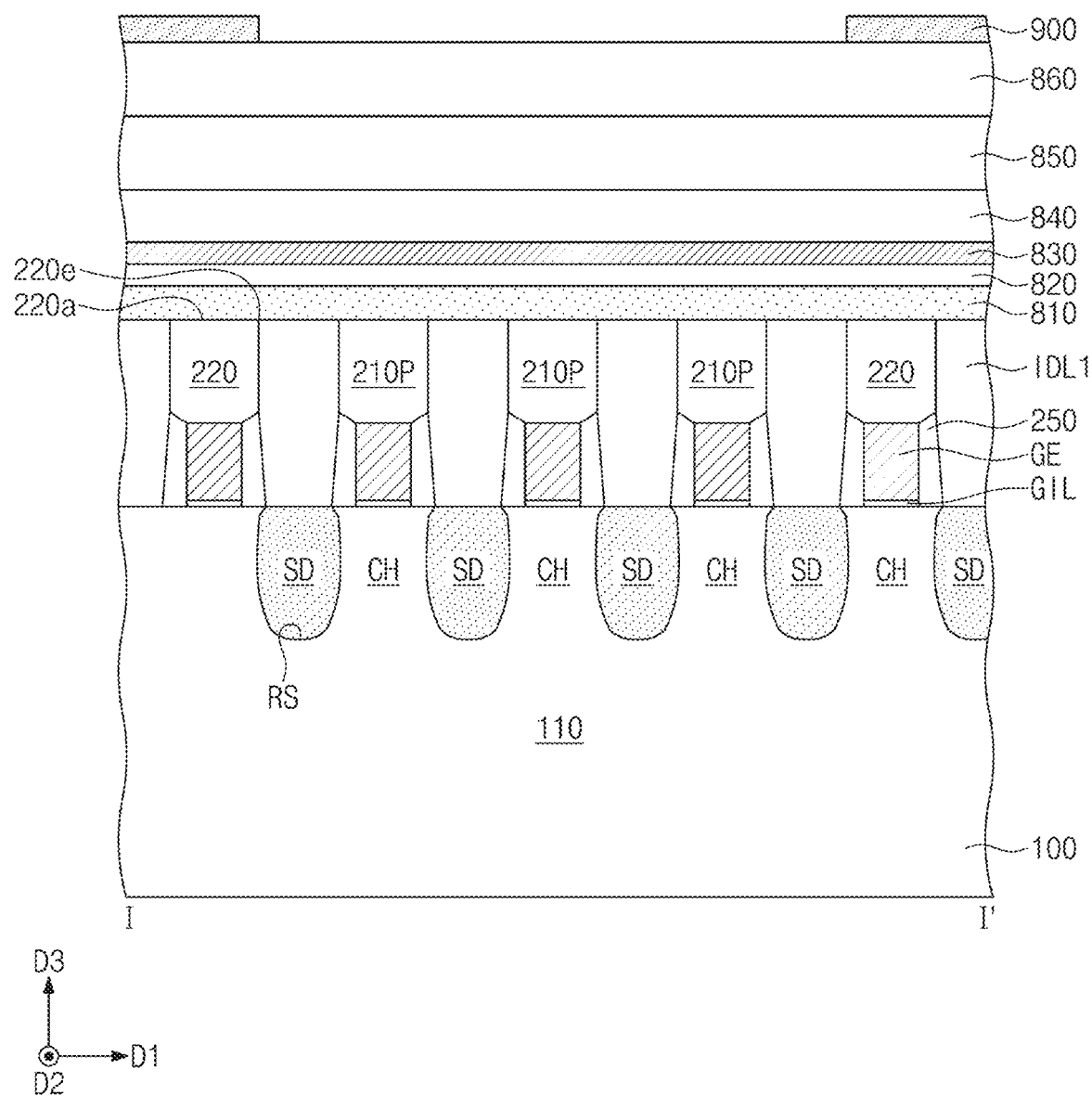
FIGS. 7A to 16C are sectional views illustrating a method of fabricating a semiconductor device, according to some example embodiments of inventive concepts.
Figure 7B:
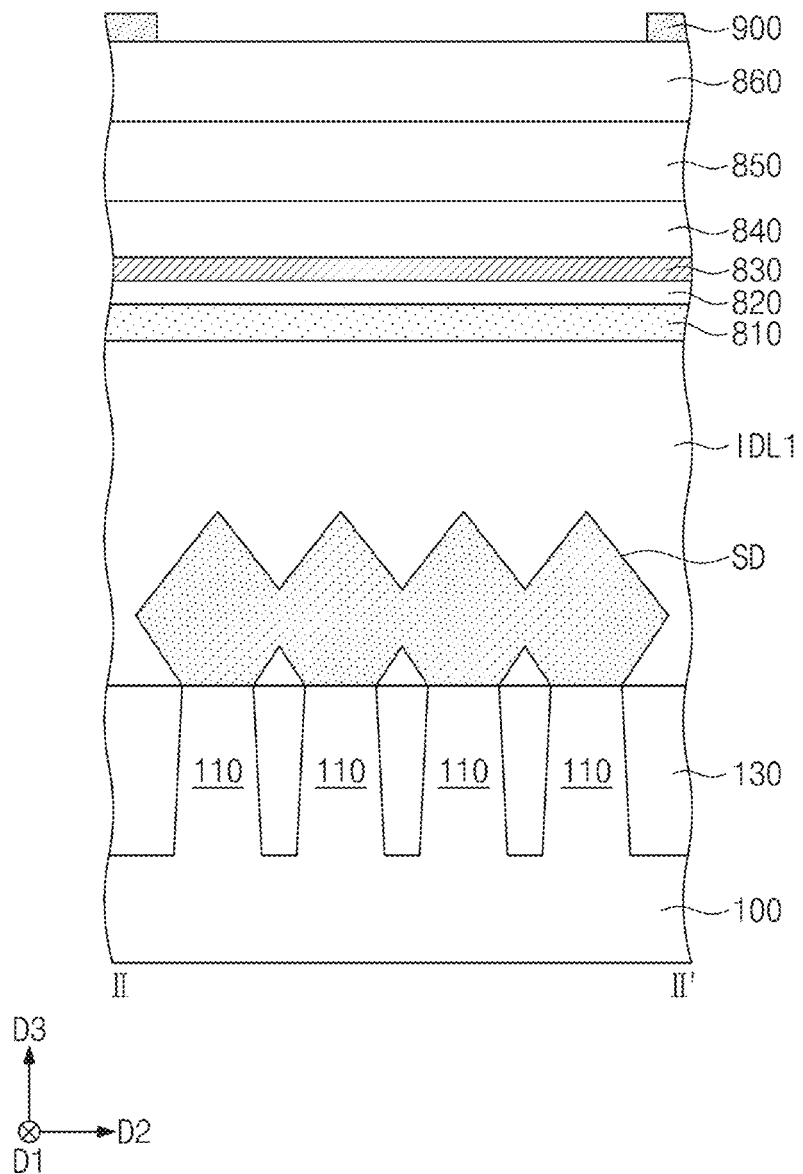
Figure 7C:
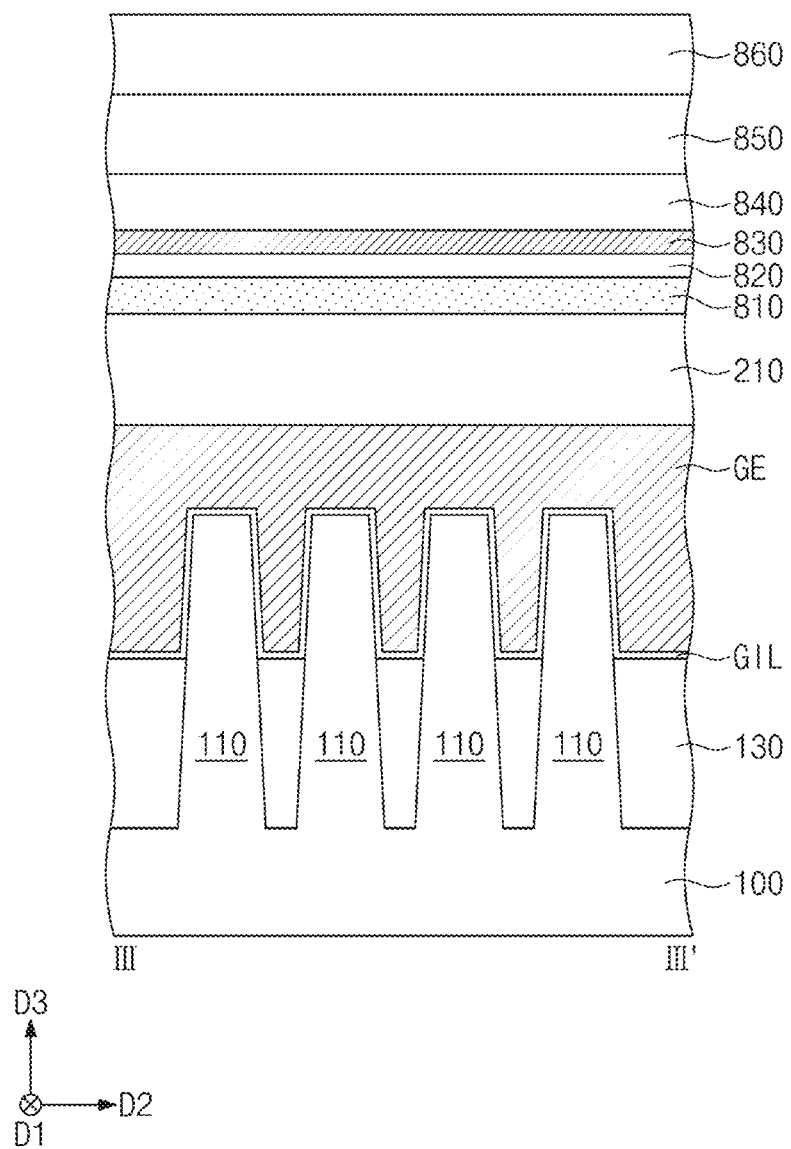
Figure 8A:
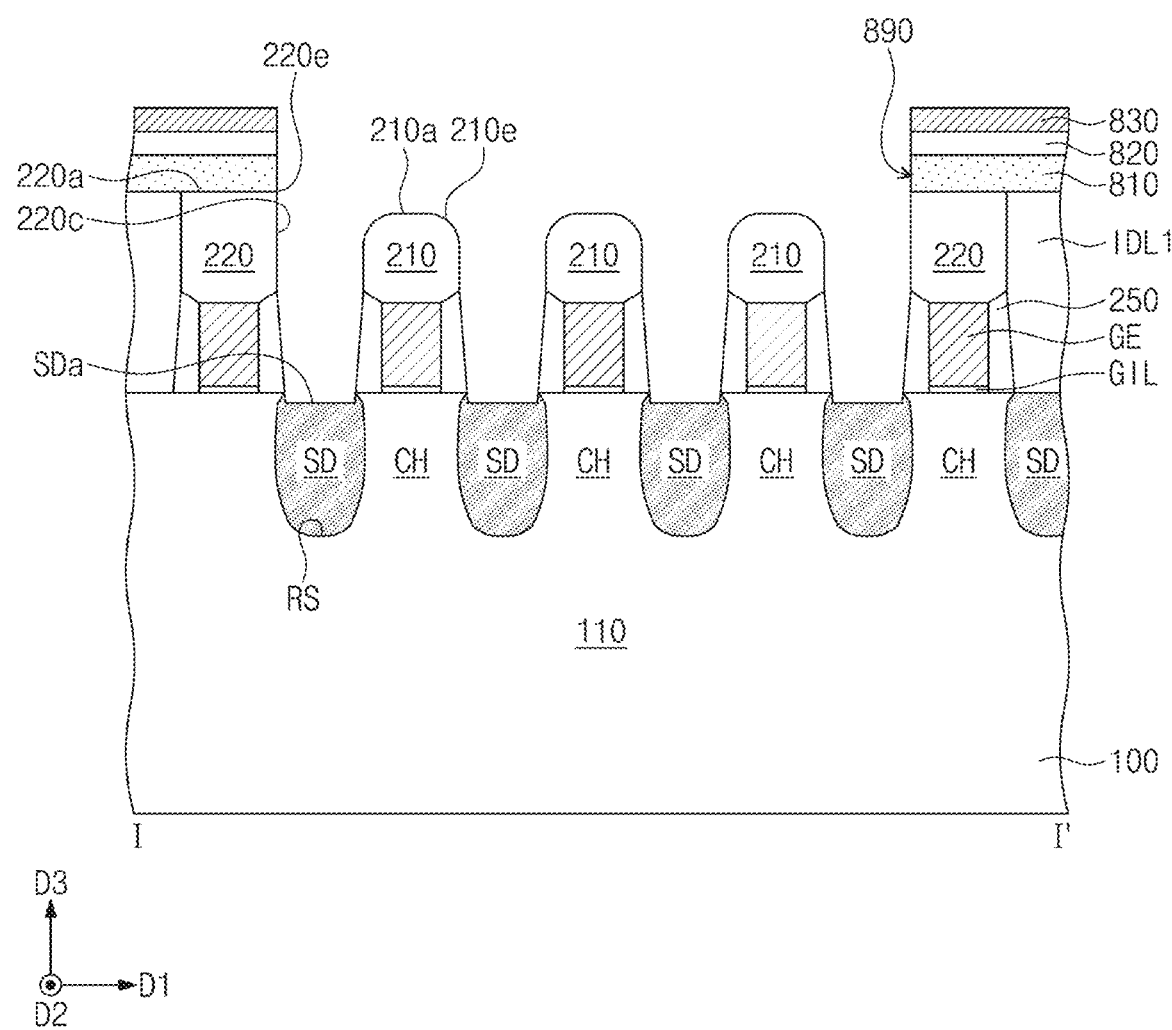
Figure 8B:
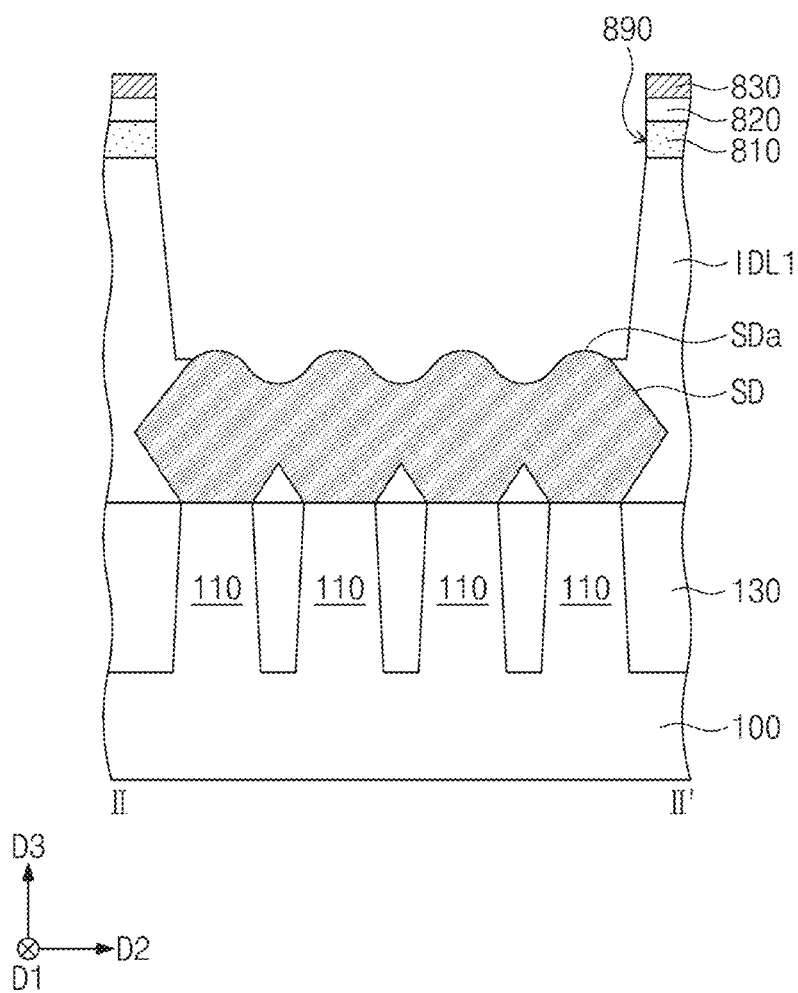
Figure 8C:
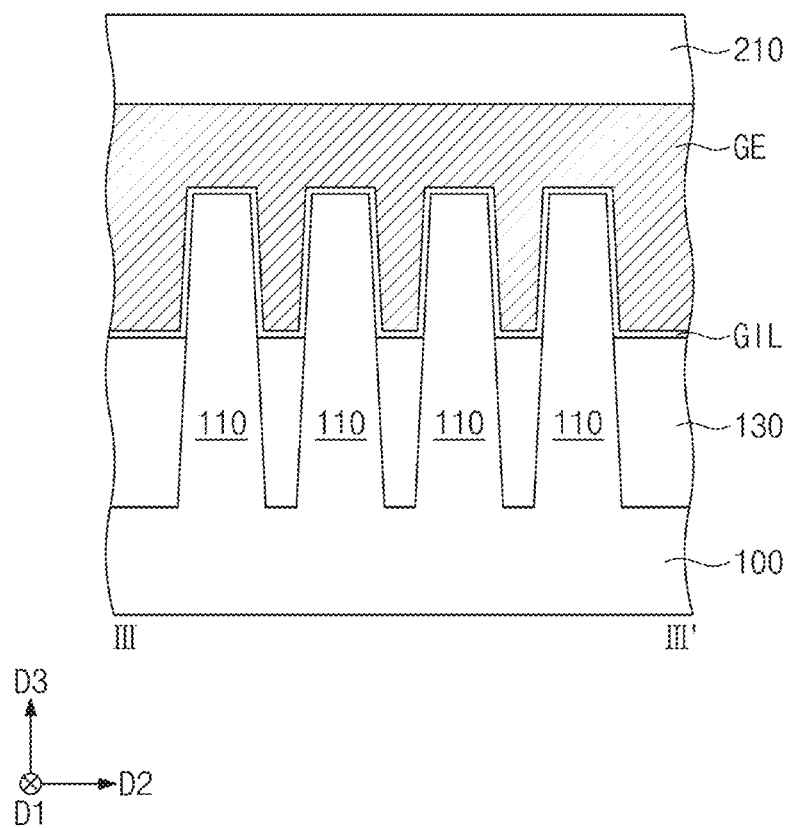

FIGS. 6A, 6B, and 6C are sectional views which are respectively taken along lines I-I', II-II', and III-III' of FIG. 1 to illustrate a semiconductor device according to some example embodiments of inventive concepts. For concise description, a previously described element may be identified by the same reference number without repeating an overlapping description thereof.

Referring to FIGS. 6A, 6B, and 6C, the semiconductor device may include the substrate 100, the device isolation pattern 130, the gate pattern GE, the spacer patterns 250, the source/drain patterns SD, the first capping pattern 210, the second capping pattern 220, the first insulating pattern 300, the second insulating pattern 320, the active contact AC, the first contact pattern CP1, the second contact pattern CP2, and the gapfill pattern 450.

The active pattern 110 may protrude upward from the substrate 100. The device isolation pattern 130 may be provided on the substrate 100 to cover lower portions of the side surfaces of the active pattern 110. A channel pattern CHP may be provided on the active pattern 110. The channel pattern CHP may include semiconductor patterns 122, which are vertically stacked. The semiconductor patterns 122 may be spaced apart from each other in the third direction D3. Each of the semiconductor patterns 122 may be formed of or include at least one of silicon (Si), germanium (Ge), or silicon-germanium (SiGe). In some example embodiments, each of the semiconductor patterns 122 may be formed of or include single-crystalline or polycrystalline silicon; however, example embodiments are not limited thereto.

The source/drain patterns SD may be provided on the active pattern 110. The source/drain patterns SD may be configured to have substantially the same features as those described above. However, in some example embodiments, the channel pattern CHP may be interposed between a pair of the source/drain patterns SD. The pair of the source/drain patterns SD may be connected to each other through the semiconductor patterns 122 of the channel pattern CHP. The semiconductor patterns 122 of the channel pattern CHP may serve as or correspond to the channel region of the transistor.

The gate pattern GE may be extended in the second direction D2 to cross the active patterns 110. Each of the gate patterns GE may be disposed on the channel pattern CHP and may be vertically overlapped with the channel pattern CHP. The gate pattern GE may include a first portion GE1, a second portion GE2, and a third portion GE3. The first portion GE1 of the gate pattern GE may be interposed between the active pattern 110 and the lowermost one of the semiconductor patterns 122. The second portion GE2 of the gate pattern GE may be interposed between the semiconductor patterns 122. The third portion GE3 of the gate pattern GE may be disposed on the uppermost one of the semiconductor patterns 122. The first portion GE1, the second portion GE2, and the third portion GE3 of the gate pattern GE may be connected to each other.

The gate pattern GE may be provided on the top, bottom, and side surfaces of each of the semiconductor patterns 122. A transistor according to the present embodiment may be a three-dimensional field-effect transistor (e.g., multi-bridge channel field-effect transistor (MBCFET™)), in which the gate pattern GE is provided to three-dimensionally surround the channel pattern CHP.

A pair of the spacer patterns 250 may be respectively disposed on opposite side surfaces of the third portion GE3 of the gate pattern GE. Each of the first and second capping patterns 210 and 220 may be provided on a corresponding one of the gate pattern GE and a corresponding pair of the spacer patterns 250. Each of the first and second capping patterns 210 and 220 may be extended along the gate pattern GE or in the first direction D1. The first capping pattern 210, the second capping pattern 220, the first insulating pattern 300, the second insulating pattern 320, the gapfill pattern 450, the second contact pattern CP2, the second contact pattern CP2, the gapfill pattern 450 may be configured to have substantially the same features as those described above.

FIGS. 7A to 16C are sectional views illustrating a method of fabricating a semiconductor device, according to some example embodiments of inventive concepts. FIGS. 7A, 8A, 9A, 10A, 11A, 12A, 13A, 14A, 15A, and 16A illustrate vertical sections corresponding to the line I-I' of FIG. 1, taken in respective steps of the fabrication method. FIGS. 7B, 8B, 9B, 10B, 11B, 12B, 13B, 14B, 15B, and 16B illustrate vertical sections corresponding to the line II-II' of FIG. 1, taken in respective steps of the fabrication method. FIGS. 7C, 8C, 9C, 10C, 11C, 12C, 13C, 14C, 15C, and 16C illustrate vertical sections corresponding to the line III-III' of FIG. 1, taken in respective steps of the fabrication method.

Referring to FIGS. 1, 7A, 7B, and 7C, the active pattern 110 may be formed to have a shape protruding from the substrate 100 may be formed. The formation of the active pattern 110 may include forming a mask pattern (not shown) on the substrate 100 and forming a trench (not shown) in the substrate 100 using the mask pattern as an etch mask. The device isolation pattern 130 may be formed on the substrate 100 to cover lower side surfaces of the active pattern 110. An upper portion of the active pattern 110 may be exposed by the device isolation pattern 130. In some example embodiments, the device isolation pattern 130 may be formed by a shallow trench isolation (STI) method, and/or may include a spin-on glass (SOG) process and/or a chemical vapor deposition (CVD) process.

Sacrificial gate patterns (not shown) may be formed on the substrate 100 to cross the active pattern 110 and to extend parallel to the second direction D2. Each of the sacrificial gate patterns may cover a portion of a corresponding one of the active patterns 110 but may expose other portion of the active pattern 110. The sacrificial gate patterns may be formed of or include polysilicon and may be doped or may be undoped.

The spacer patterns 250 may be formed on the substrate 100 to cover side surfaces of the sacrificial gate patterns, respectively. The formation of the spacer patterns 250 may include forming a spacer layer (not shown) and patterning the spacer layer using an etching process.

The active pattern 110, which is exposed by the sacrificial gate patterns and the spacer patterns 250, may be etched to form the recess portions RS in the active pattern 110. The recess portions RS may be formed at both sides of the sacrificial gate patterns.

The source/drain patterns SD may be formed on the active pattern 110 and at both sides of the sacrificial gate pattern. Each of the source/drain patterns SD may include an epitaxial pattern such as a homogeneous epitaxial pattern or a heterogeneous epitaxial pattern that is grown from the recess portions RS of the active pattern 110. As a result of the formation of the source/drain patterns SD, the channel region CH may be formed in the active pattern 110 between the source/drain patterns SD. The channel region CH of the active pattern 110 may have a top surface that is located at a level higher than bottom surfaces of the recess portions RS. The first interlayer insulating layer IDL1 may be formed to cover the source/drain patterns SD.

Next, the sacrificial gate patterns may be removed to form gate openings in the first interlayer insulating layer IDL1. Each of the gate openings may be formed to expose the channel region CH of the active pattern 110 between the spacer patterns 250.

The gate insulating layers GIL and the gate patterns GE may be formed in the gate openings. The gate insulating layer GIL and the gate patterns GE may be formed to have substantially the same features as described above. The gate patterns GE may include first gate patterns and second gate patterns (not shown), which are spaced apart from each other in the first direction D1 and are extended to be parallel to each other.

Each of first preliminary capping patterns 210P may be formed on a pair of the spacer patterns 250 and a corresponding one of the first gate patterns therebetween. Here, each of the first gate patterns may be formed between the pair of the spacer patterns 250. The first preliminary capping patterns 210P may be formed of or include at least one of silicon nitride, silicon carbonitride, and/or silicon carbon oxynitride.

Each of the second capping patterns 220 may be formed on a pair of the spacer patterns 250 and a corresponding one of the second gate patterns therebetween. The second capping patterns 220 may be formed of or include the same material as the first preliminary capping patterns 210P. In some example embodiments, the second capping patterns 220 and the first preliminary capping patterns 210P may be formed at substantially the same time using the same process. The first preliminary capping patterns 210P may be disposed between the second capping patterns 220. The second capping pattern 220 may have substantially the same shape as the first preliminary capping pattern 210P. For example, each of the first preliminary capping pattern 210P and the second capping pattern 220 may have a top surface, a side surface, and an edge. The top surface of the first preliminary capping pattern 210P may be placed at substantially the same level as the top surface 220a of the second capping pattern 220. The edge of the first preliminary capping pattern 210P and the edge 220e of the second capping pattern 220 may have a non-flat shape with a small curvature radius.

A first upper layer 810 may be formed on the top surfaces of the first preliminary capping patterns 210P, the top surfaces 220a of the second capping patterns 220, and the top surface of the first interlayer insulating layer IDL1. The first upper layer 810 may be formed of or include at least one of insulating materials (e.g., tetraethyl orthosilicate (TEOS) and/or silicon oxide).

A second upper layer 820, a third upper layer 830, a fourth upper layer 840, a fifth upper layer 850, and a sixth upper layer 860 may be sequentially formed on the first upper layer 810. The second upper layer 820 may be formed of or include at least one of insulating materials (e.g., silicon-based oxide materials). The second upper layer 820 may be formed by an atomic layer deposition (ALD) process; however, example embodiments are not limited thereto. A thickness of the second upper layer 820 may be less than a thickness of the first upper layer 810. The third upper layer 830 may be formed of or include at least one of metallic materials and/or metal nitride materials. For example, the third upper layer 830 may be formed of or include at least one of titanium, titanium nitride, tungsten, tungsten nitride, tantalum, tantalum nitride, and/or combinations thereof. The fourth upper layer 840 may be formed of or include silicon oxide. A thickness of the fourth upper layer 840 may be greater than a thickness of the third upper layer 830. The fifth upper layer 850 may include a spin-on-hardmask (SOH) layer; however, example embodiments are not limited thereto. The sixth upper layer 860 may be formed of or include at least one of silicon oxide, silicon nitride, and/or silicon oxynitride. The sixth upper layer 860 may further contain p-type impurities. At least one of the first to sixth upper layers 810, 820, 830, 840, 850, and 860 may be omitted, unlike that illustrated in the drawings. In some example embodiments, another upper layer may be additionally formed on one of the first to sixth upper layers 810, 820, 830, 840, 850, and 860.

A photoresist pattern 900 may be formed on the sixth upper layer 860. The photoresist pattern 900 may have a guide opening exposing the sixth upper layer 860. The photoresist pattern 900 may be vertically overlapped with the second capping patterns 220. The photoresist pattern 900 may not be vertically overlapped with the first preliminary capping patterns 210P.

Referring to FIGS. 1, 8A, 8B, and 8C, an opening 890 may be formed in the first to third upper layers 810, 820, and 830 and the first interlayer insulating layer IDL1. The formation of the opening 890 may include patterning the first to sixth upper layers 810, 820, 830, 840, 850, and 860 and the first interlayer insulating layer IDL1 through an etching process, in which the photoresist pattern 900 is used as a mask pattern.

The opening 890 may be formed to expose the source/drain patterns SD and the spacer patterns 250. During the formation of the opening 890, the first preliminary capping patterns 210P may be exposed to the etching process. In this case, the first preliminary capping patterns 210P may be recessed by the etching process to form the first capping patterns 210. The first capping patterns 210 may be exposed through the opening 890. The second capping patterns 220 may not be exposed to the etching process; e.g. the second capping patterns 220 may be covered by first to third upper layers 810, 820, and 830. Accordingly, the top surfaces 220a of the second capping patterns 220 may be positioned at a level higher than the top surface 210a of each of the first capping patterns 210. The edge 210e of each of the first capping patterns 210 may be recessed by the etching process and may have a rounded shape. As a result of the edge 210e of each of the first capping patterns 210 may be different from, e.g. may have a different profile than, that of the edge 220e of the second capping pattern 220. The edge 210e of each of the first capping patterns 210 may have a more rounded shape and/or a larger curvature radius than the edge 220e of the second capping pattern 220.

The first interlayer insulating layer IDL1 on the second side surfaces of the second capping patterns 220 may not be removed. The first side surfaces 220c of the second capping patterns 220 may be placed at an opposite side of the second side surfaces and may be exposed through the opening 890.

Figure 9A:
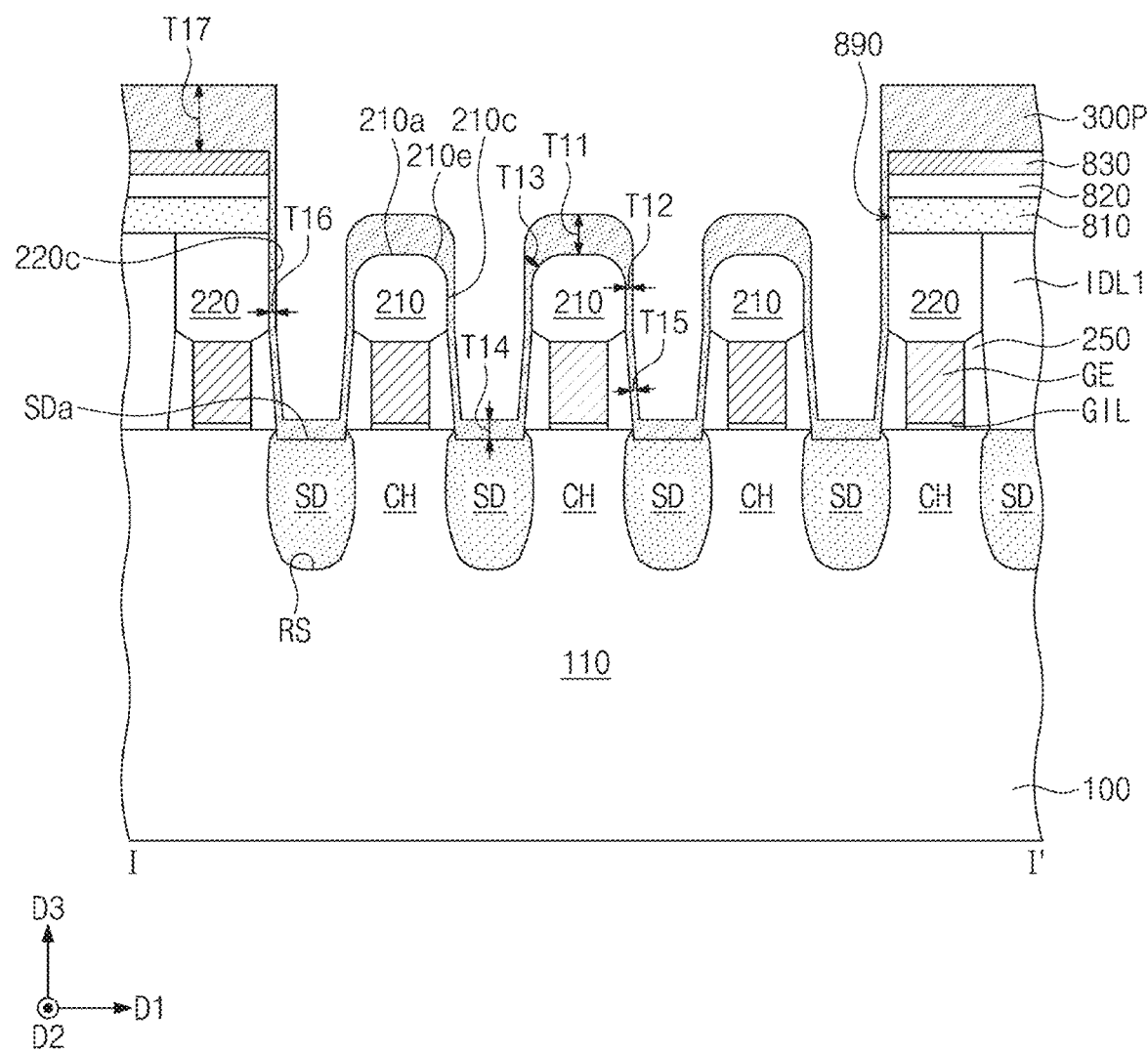
Figure 9B:
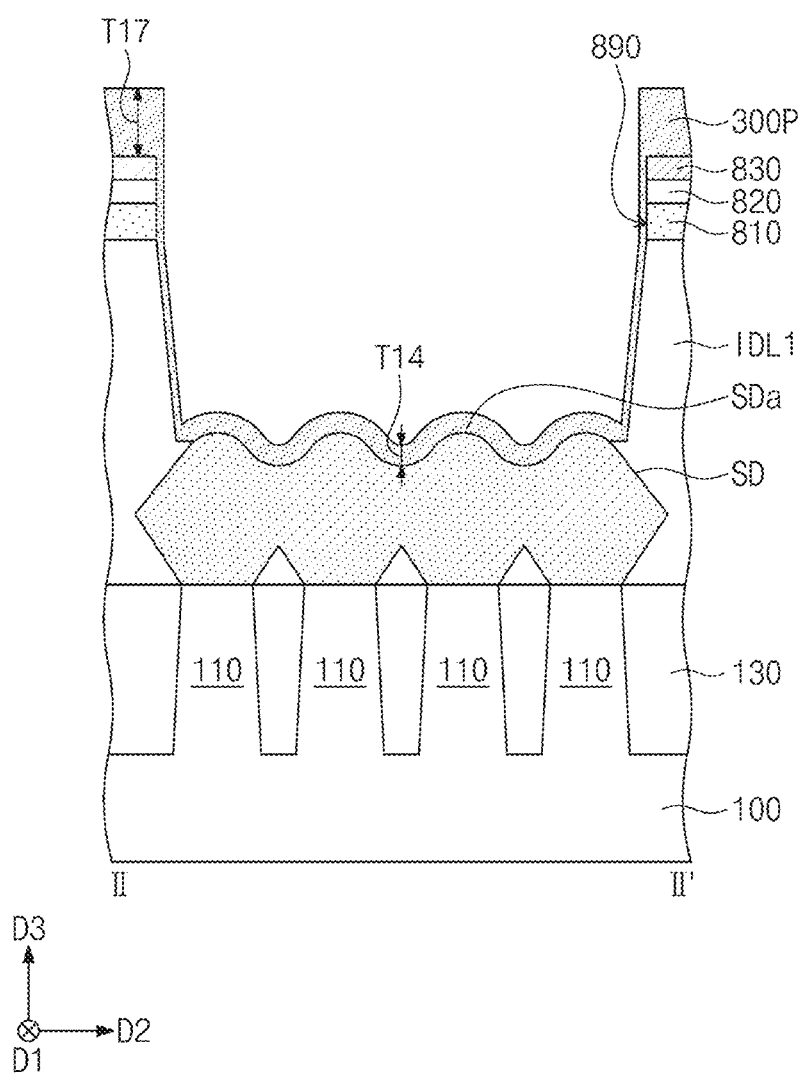
Figure 9C:
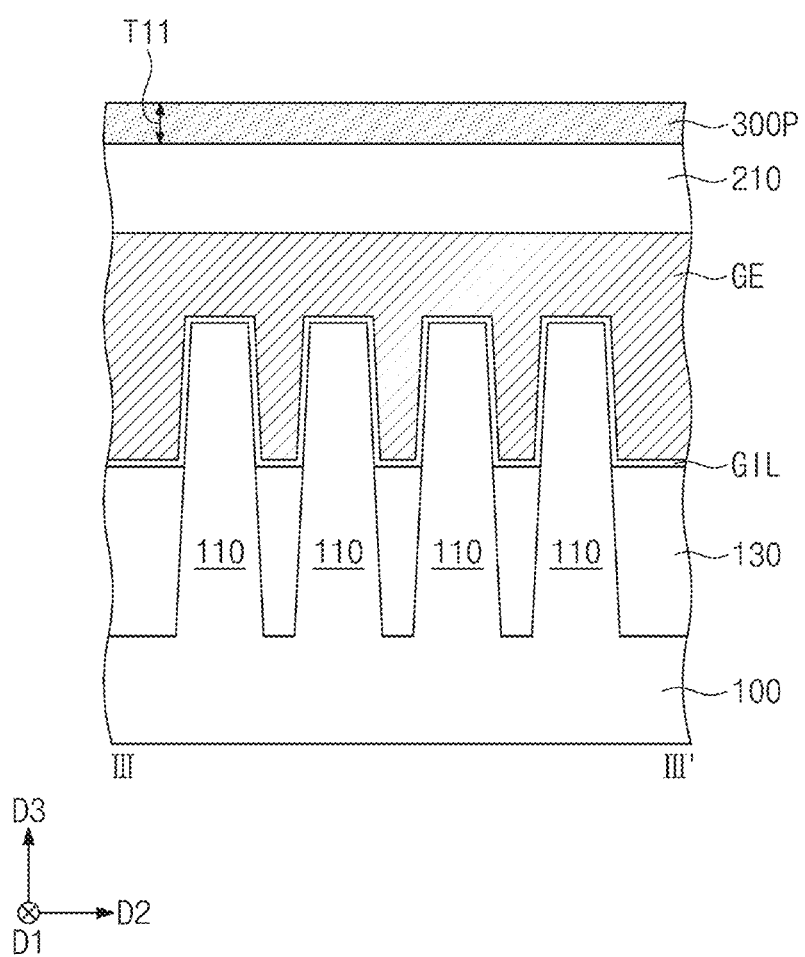

As shown in FIG. 9B, during the formation of the opening 890, the first interlayer insulating layer IDL1 on the source/drain patterns SD may be removed, and in this case, the source/drain patterns SD may be exposed, e.g. exposed to the outside. The exposed source/drain patterns SD may be additionally etched, and in this case, top surfaces SDa of the source/drain patterns SD may have uneven portions. Furthermore, the level of the top surface SDa of the source/drain patterns SD may be lowered during this process. For example, the top surface SDa of the source/drain patterns SD after the formation of the opening 890 may be located at a level that is lower than the source/drain patterns SD before the formation of the opening 890.

The top surface of the third upper layer 830 may be exposed by removing the fourth to sixth upper layers 840, 850, and 860 and the photoresist pattern 900.

Referring to FIGS. 1, 9A, 9B, and 9C, a preliminary insulating layer 300P may be formed in the opening 890 and on the third upper layer 830. In some example embodiments, the preliminary insulating layer 300P may be formed by a physical vapor deposition (PVD) process. The preliminary insulating layer 300P may cover the first capping patterns 210, the outer side surfaces of the spacer patterns 250, the exposed top surfaces SDa of the source/drain patterns SD, the first side surfaces 220c of the second capping patterns 220, and the top surface of the third upper layer 830 in a non-conformal manner. For example, a thickness T17 of the preliminary insulating layer 300P on the top surface of the third upper layer 830 may be greater than each of a thickness T14 of the preliminary insulating layer 300P on the top surfaces SDa of the source/drain patterns SD, a thickness T13 of the first insulating pattern 300 on the edge 210e of each of the first capping patterns 210, a thickness T15 of the preliminary insulating layer 300P on the outer side surfaces of the spacer patterns 250, a thickness T16 of the preliminary insulating layer 300P on the first side surfaces 220c of the second capping patterns 220, and a thickness T12 of the preliminary insulating layer 300P on the side surfaces 210c of the first capping patterns 210. The thickness T17 of the preliminary insulating layer 300P on the top surface of the third upper layer 830 may be equal to or greater than a thicknesses T11 of the preliminary insulating layer 300P on the top surfaces 210a of the first capping patterns 210. The thicknesses T11 of the preliminary insulating layer 300P on the top surfaces 210a of the first capping patterns 210 may be equal to or greater than the thickness T13 of the first insulating pattern 300 on the edge 210e of each of the first capping patterns 210. The thicknesses T11 of the preliminary insulating layer 300P on the top surfaces 210a of the first capping patterns 210 may be greater than each of the thickness T14 of the preliminary insulating layer 300P on the top surfaces SDa of the source/drain patterns SD, the thickness T15 of the preliminary insulating layer 300P on the outer side surfaces of the spacer patterns 250, the thickness T16 of the preliminary insulating layer 300P on the first side surfaces 220c of the second capping patterns 220, and the thickness T12 of the preliminary insulating layer 300P on the side surfaces 210c of the first capping patterns 210. The thickness T14 of the preliminary insulating layer 300P on the top surfaces SDa of the source/drain patterns SD may be greater than each of the thickness T15 of the preliminary insulating layer 300P on the outer side surfaces of the spacer patterns 250, the thickness T16 of the preliminary insulating layer 300P on the first side surfaces 220c of the second capping patterns 220, and the thickness T12 of the preliminary insulating layer 300P on the side surfaces 210c of the first capping patterns 210. The preliminary insulating layer 300P may be formed with a conformal deposition process such as a CVD process, and may experience a bread-loafing phenomena; however, example embodiments are not limited thereto.

Figure 9D:
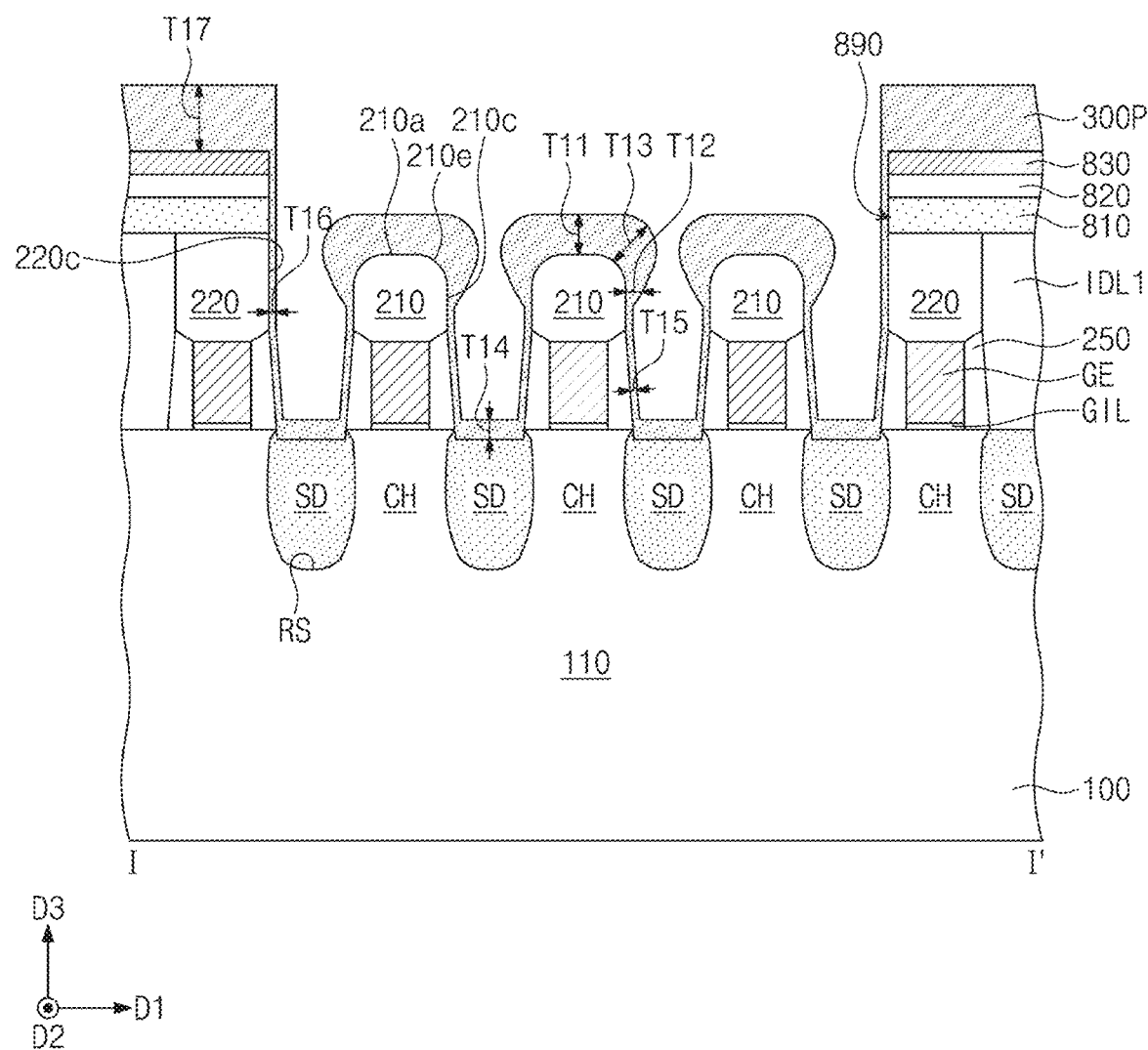
Figure 10A:
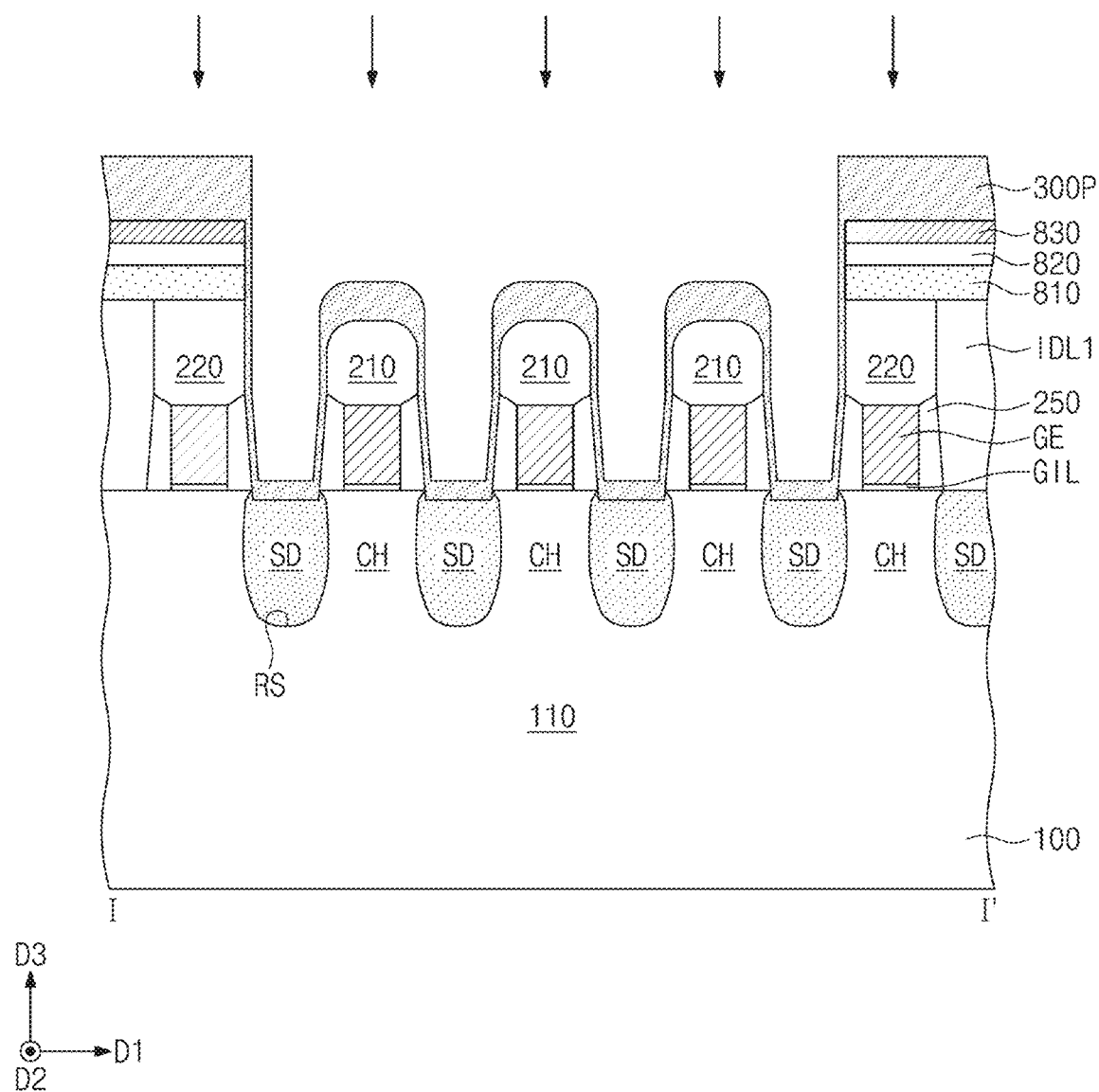
Figure 10B:
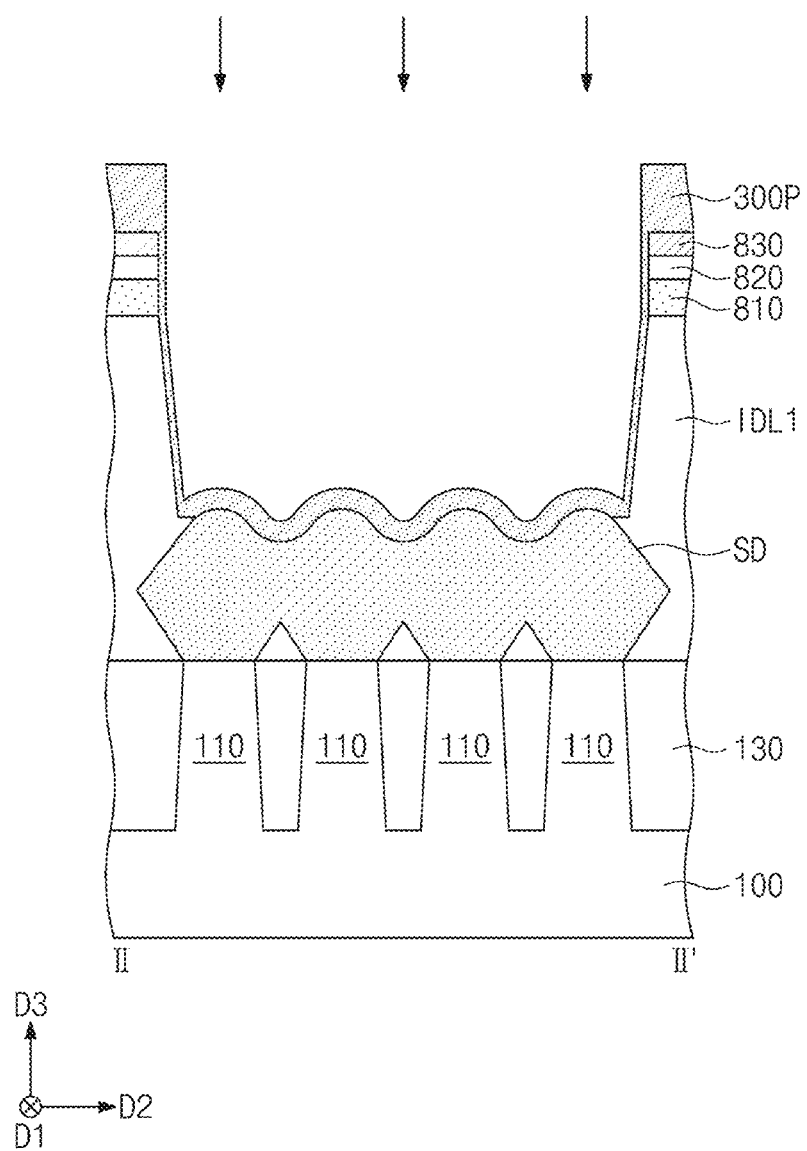
Figure 10C:
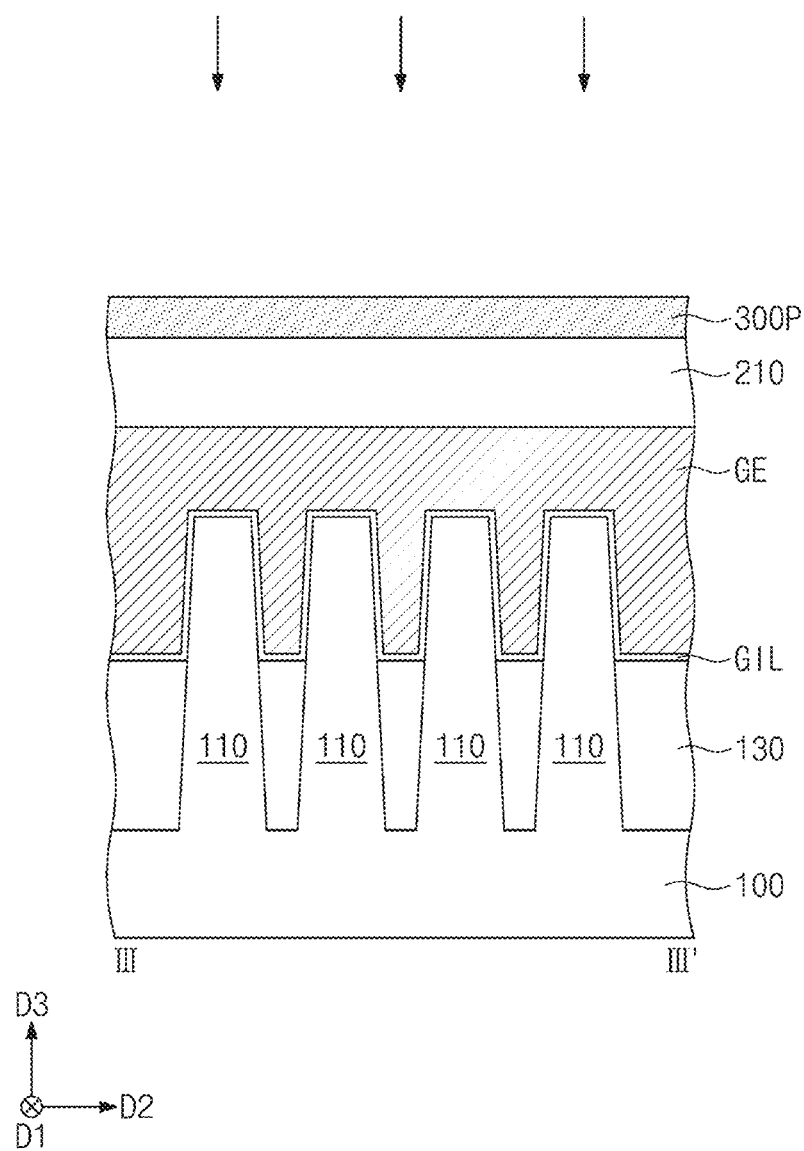
Figure 11A:
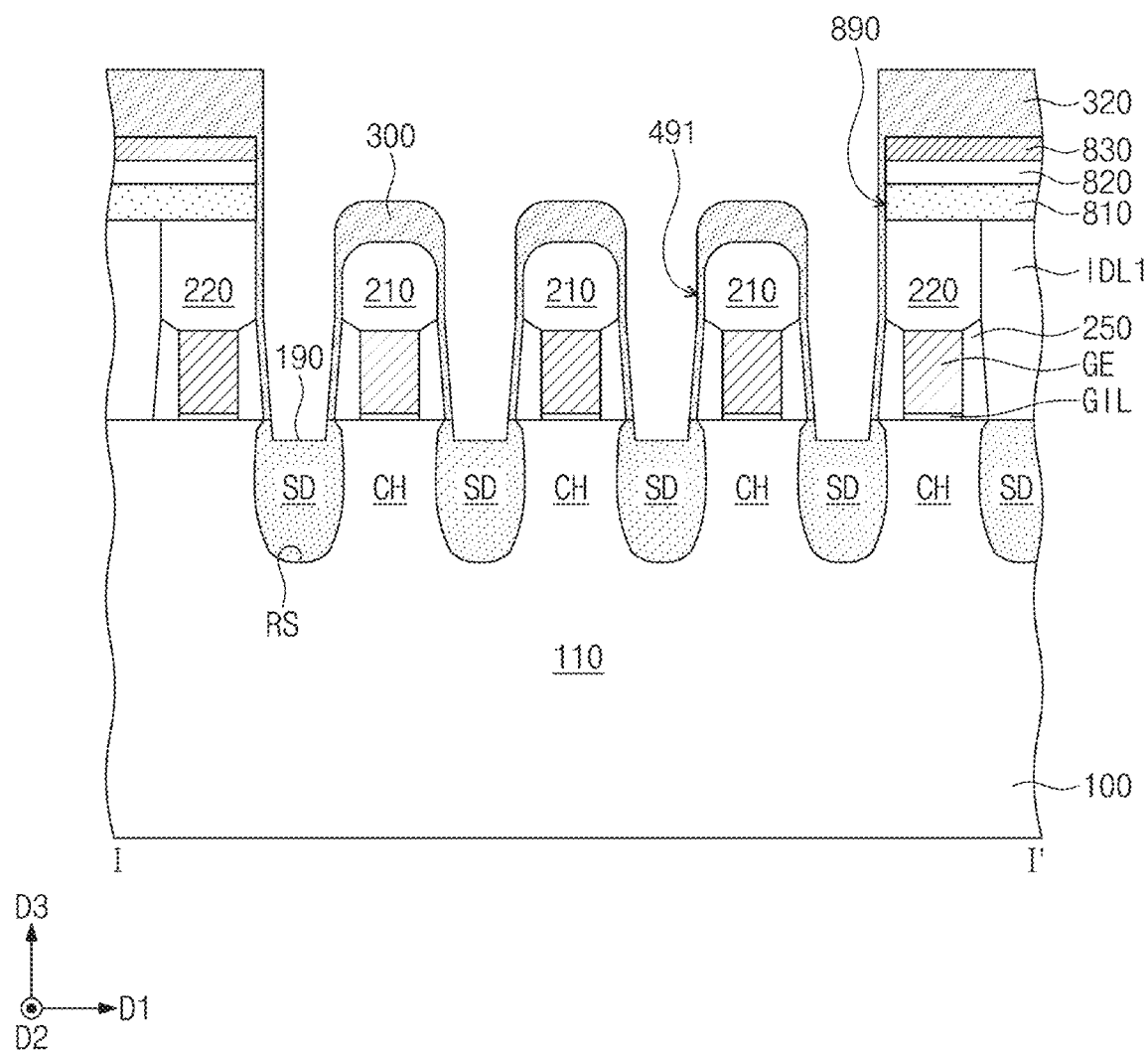
Figure 11B:
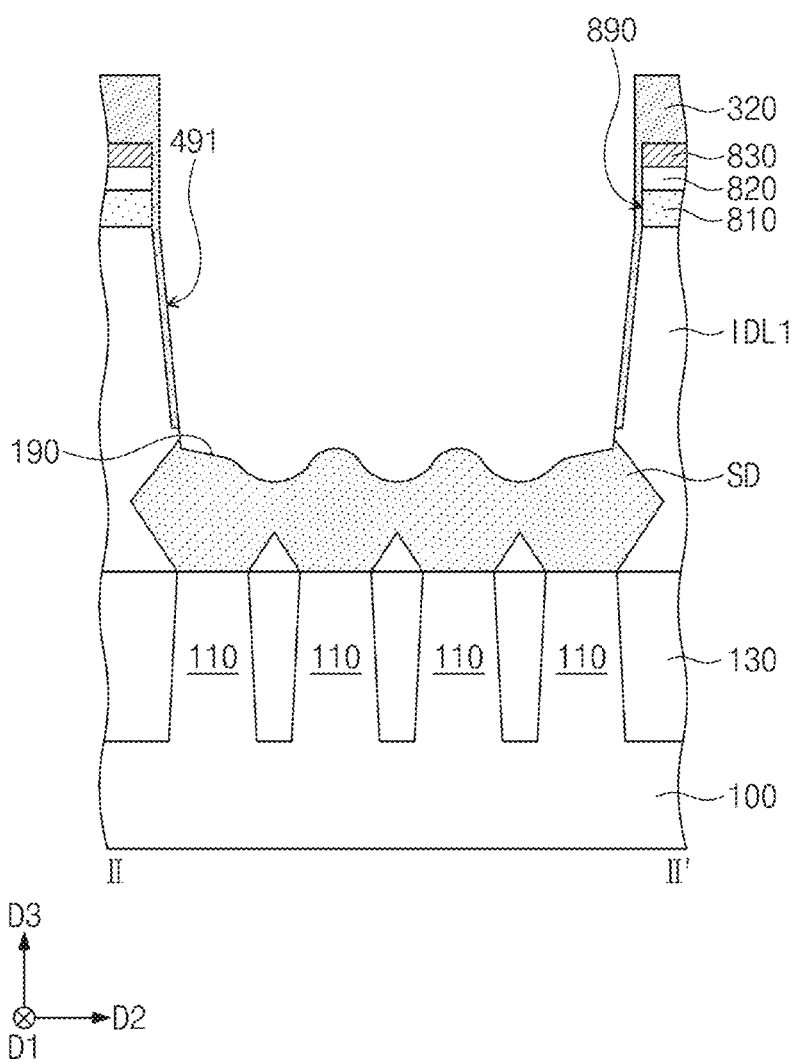
Figure 11C:
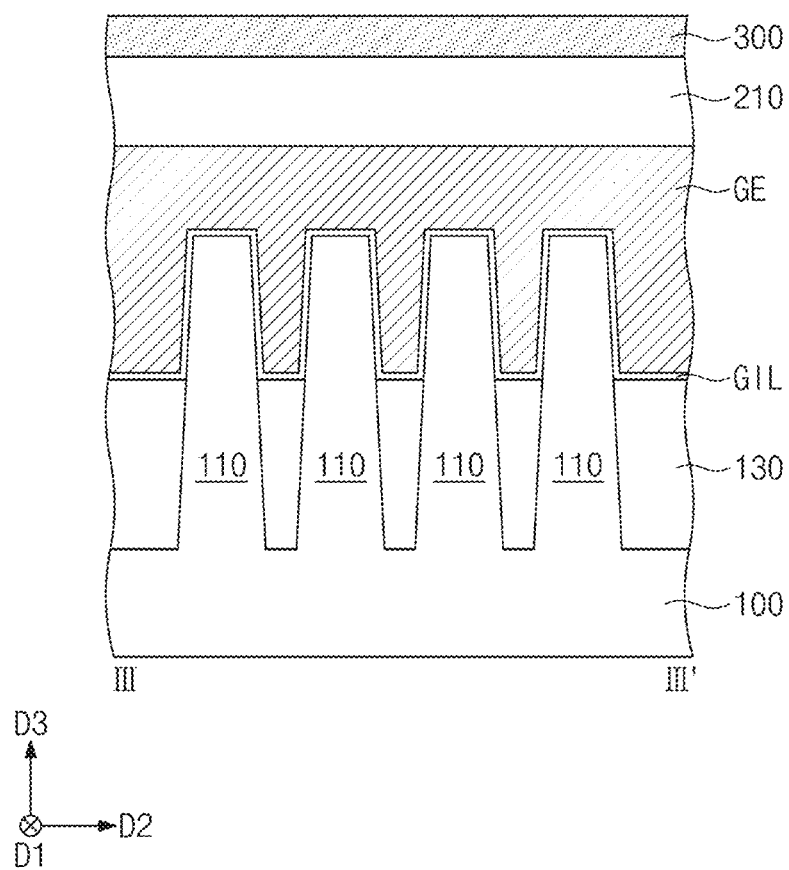
Figure 12A:
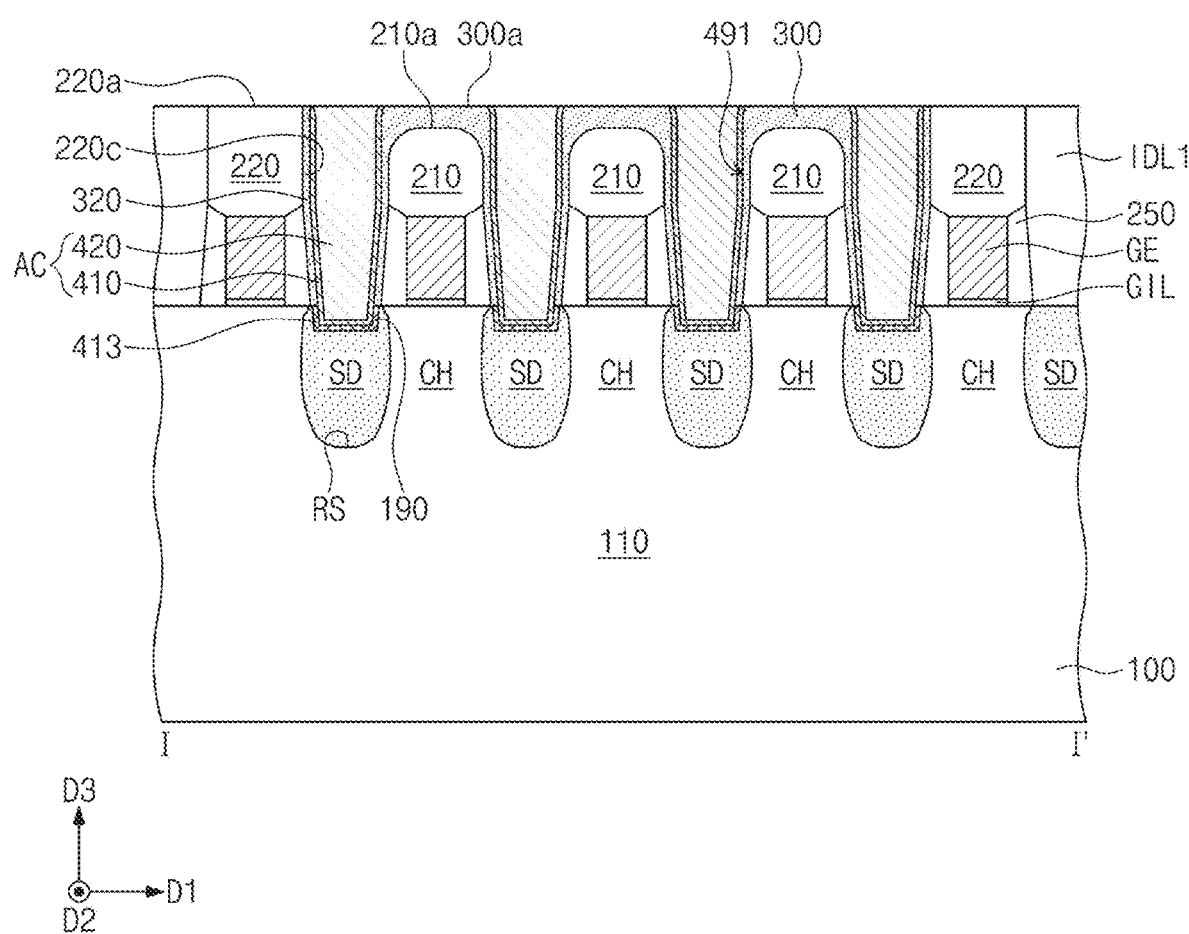
Figure 12B:
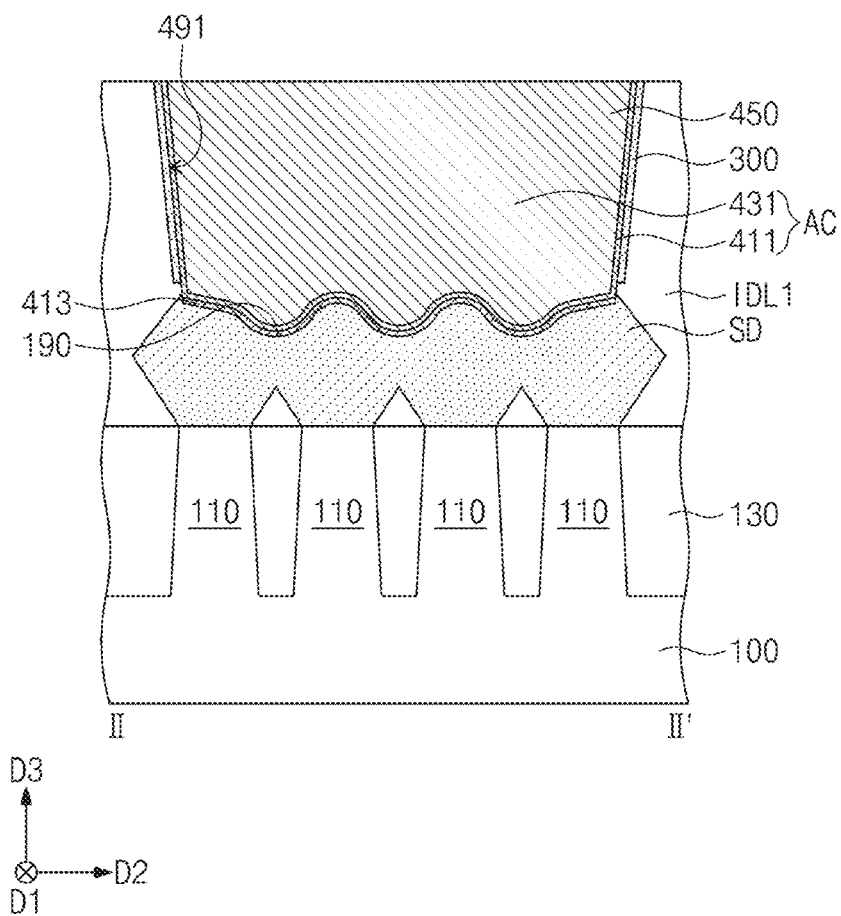
Figure 12C:
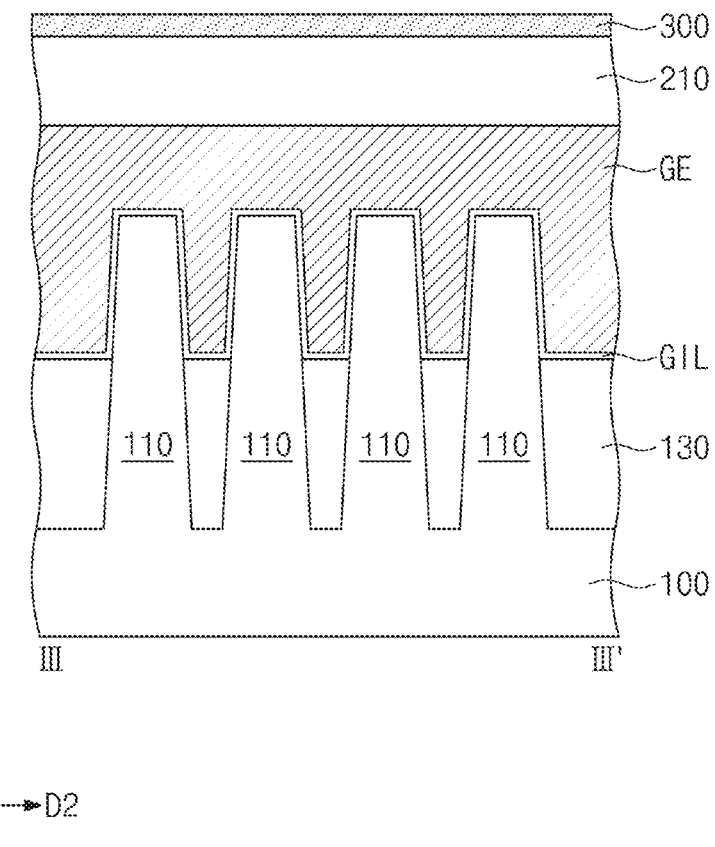
Figure 13A:
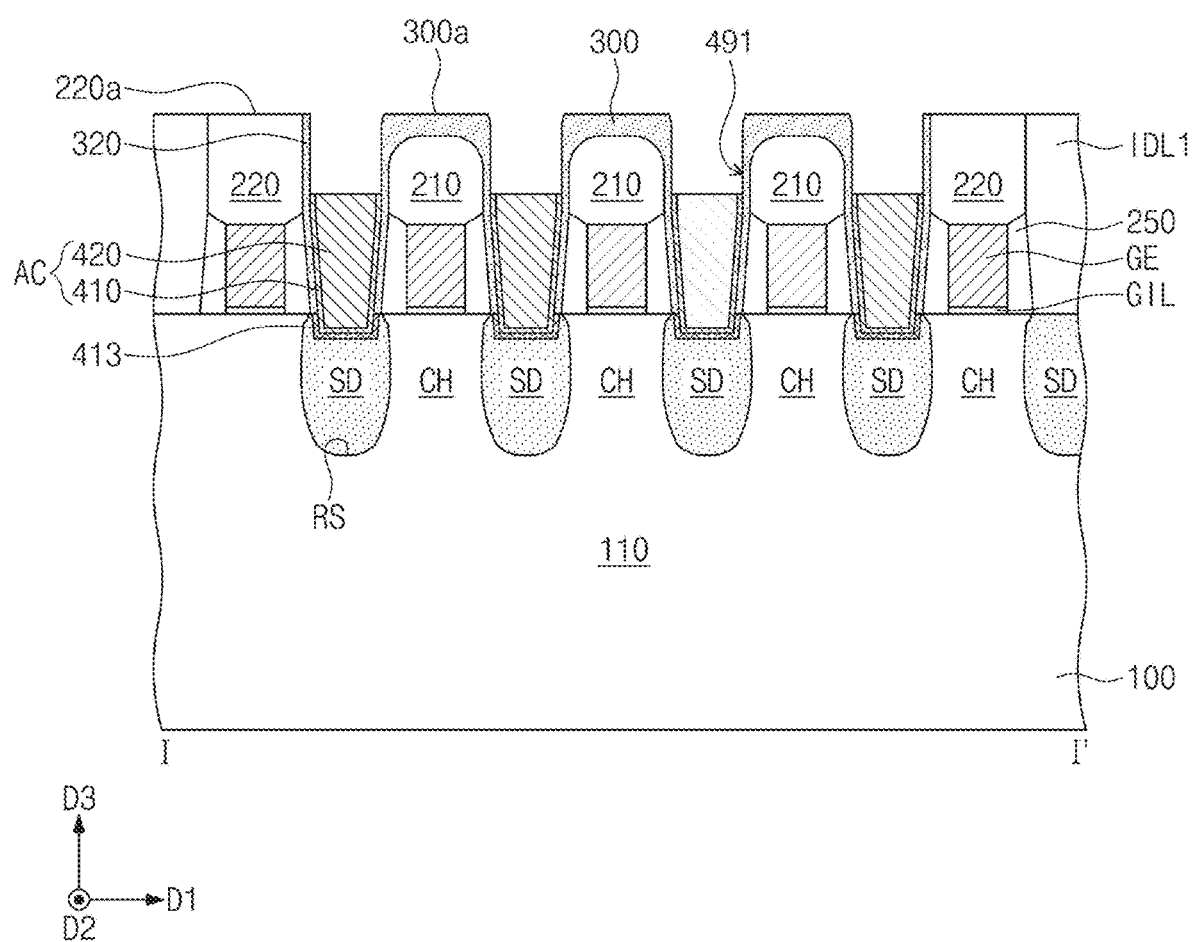
Figure 13B:
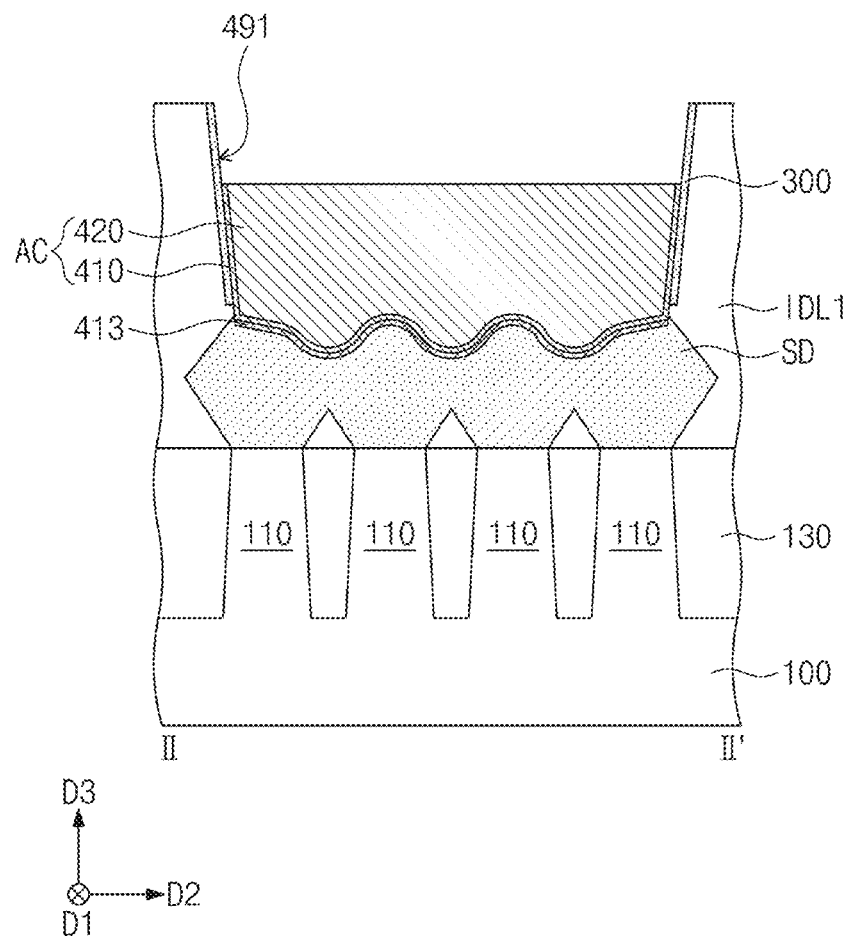
Figure 13C:
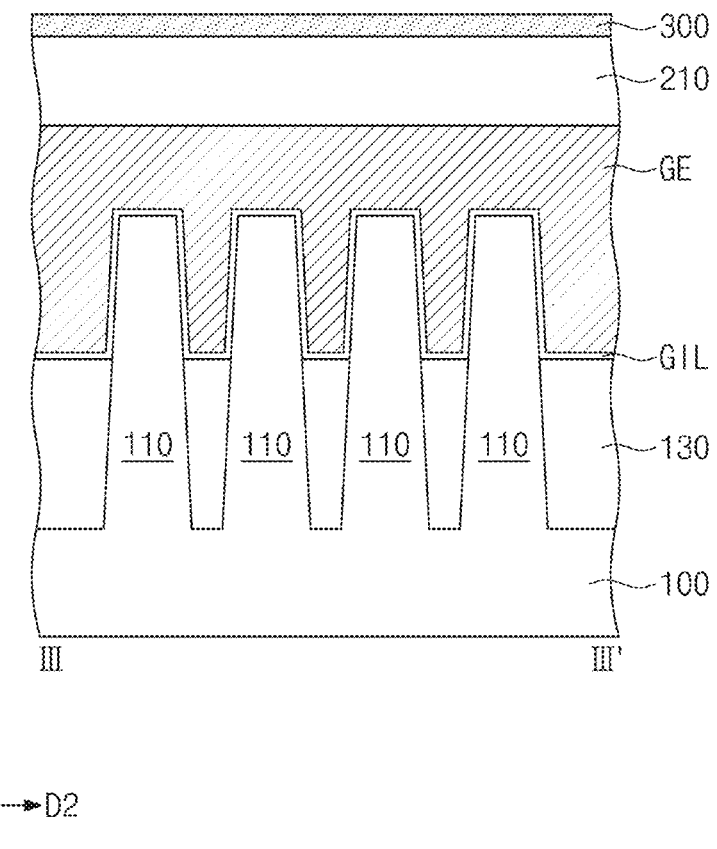
Figure 14A:
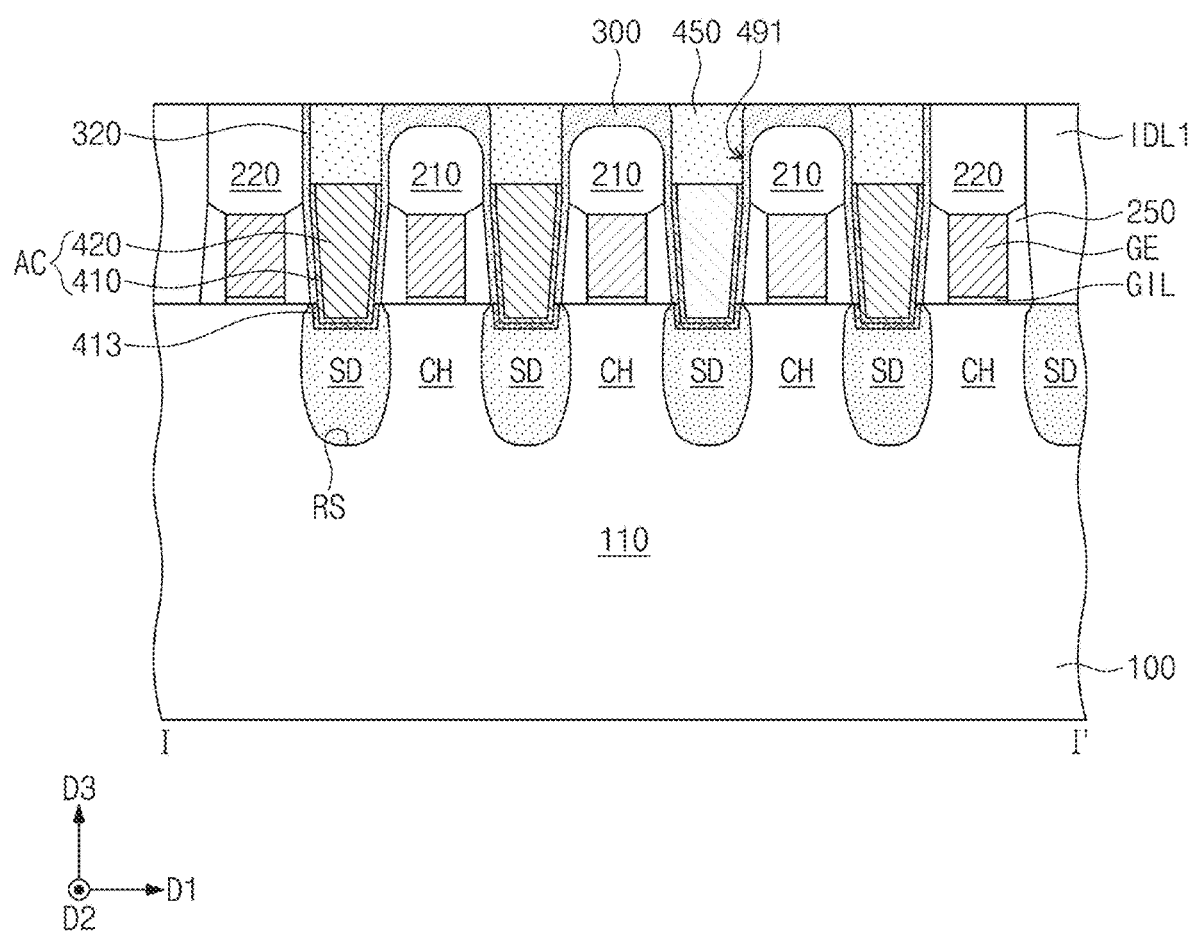
Figure 14B:
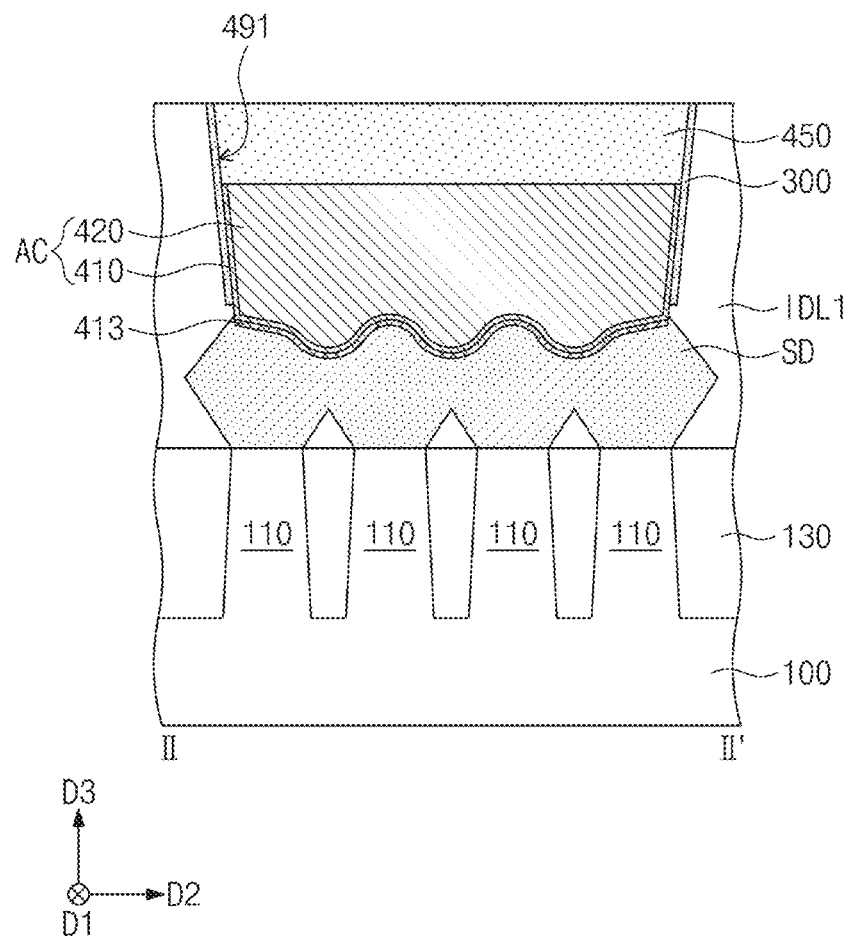
Figure 14C:
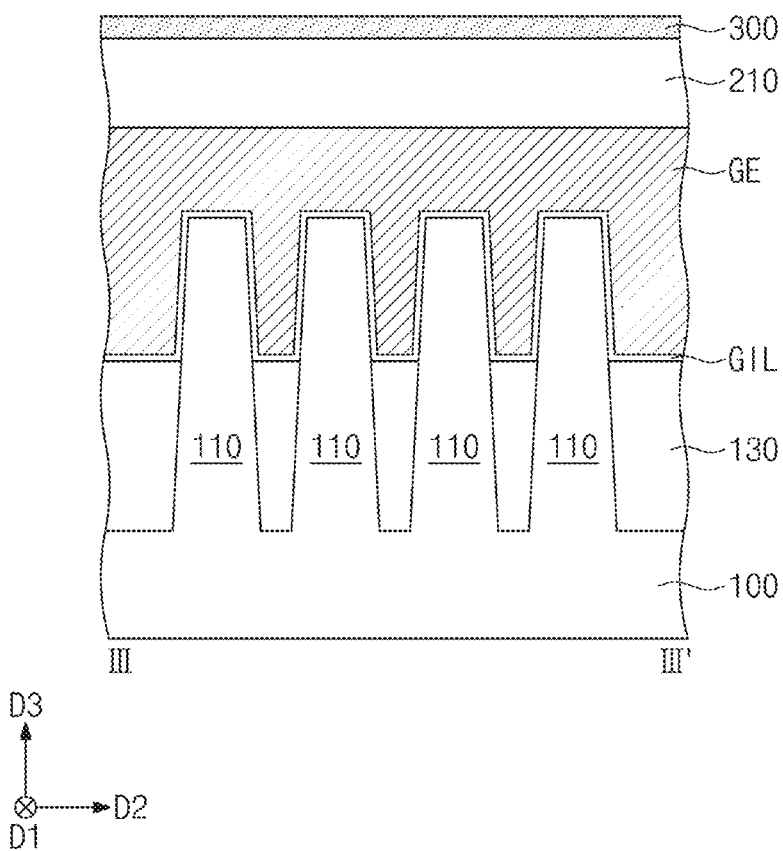
Figure 15A:
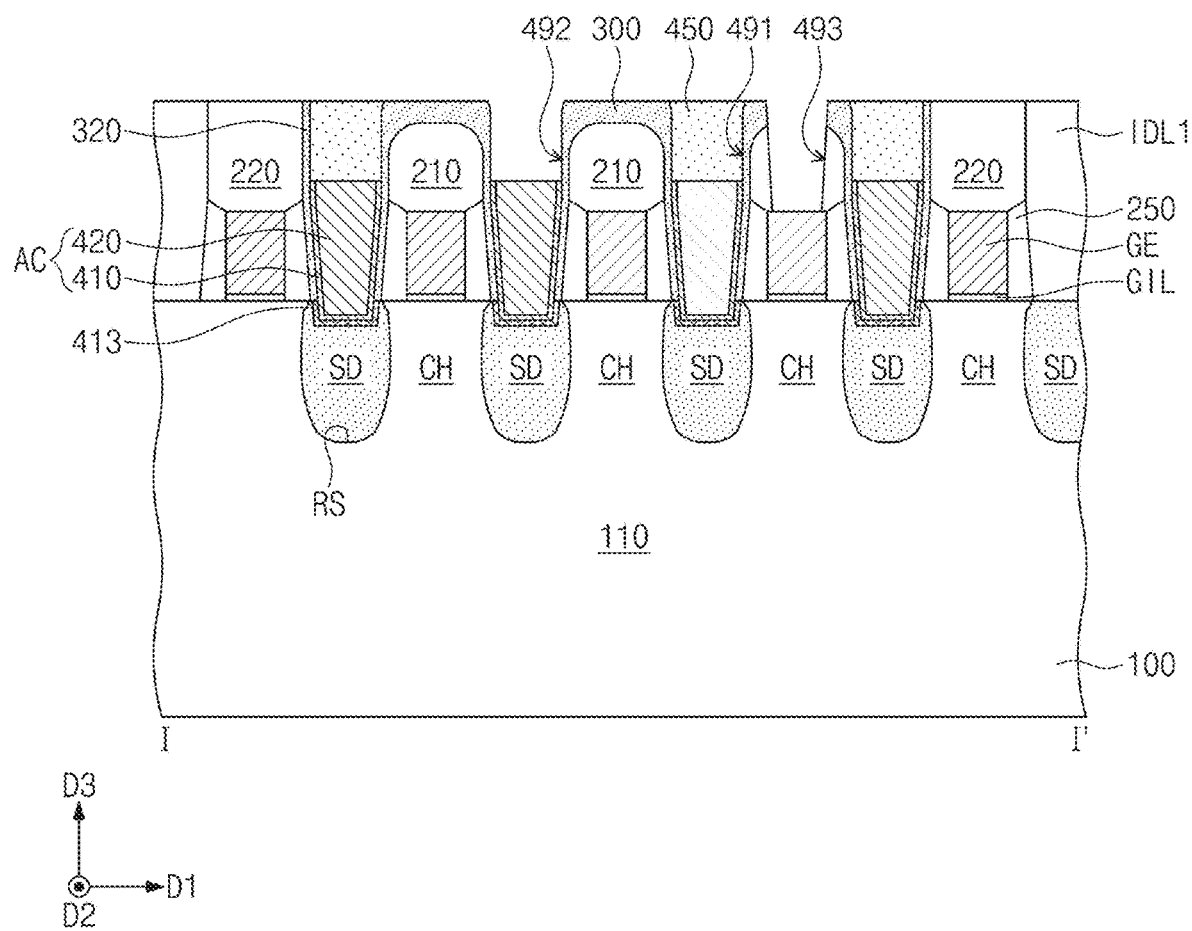
Figure 15B:
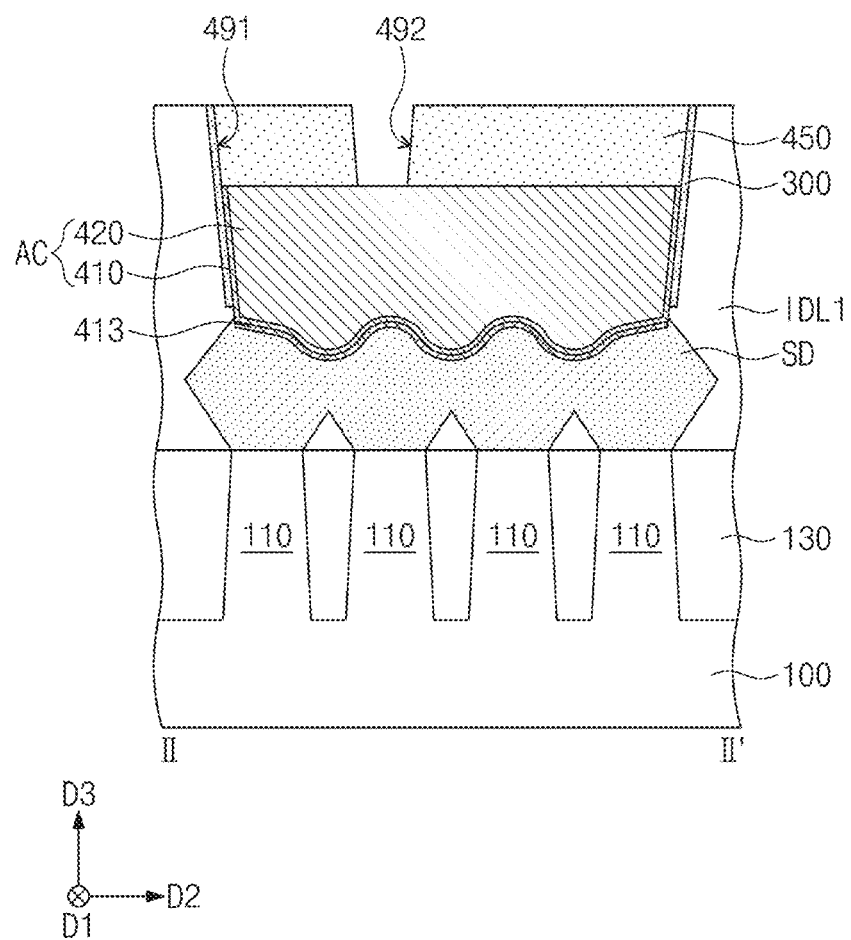
Figure 15C:
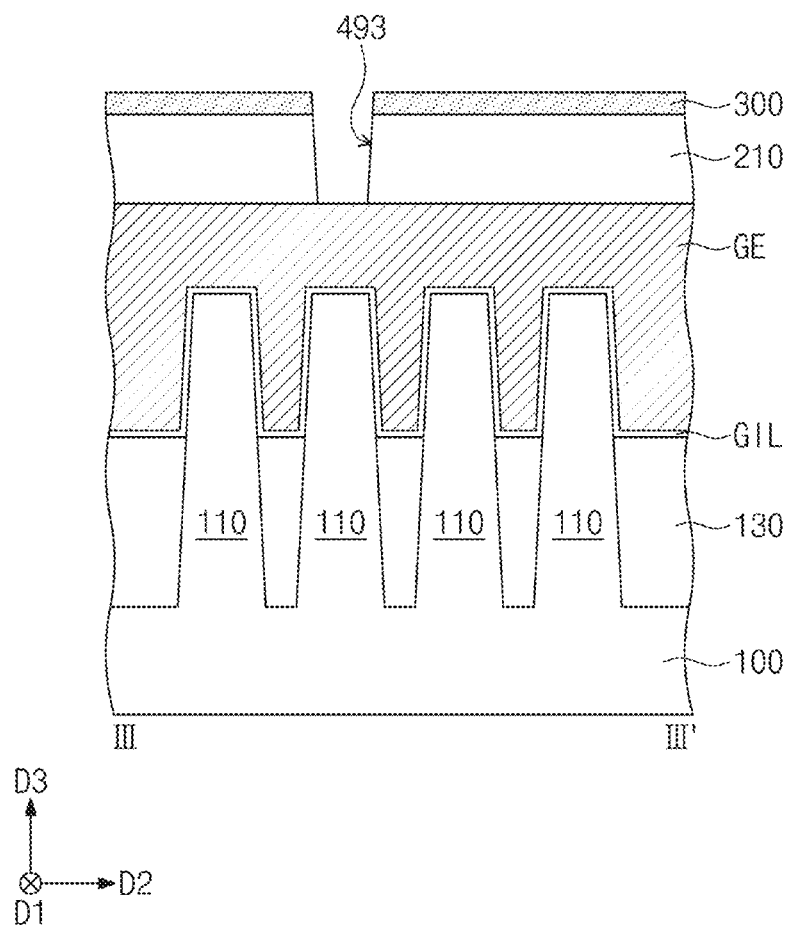
Figure 16A:
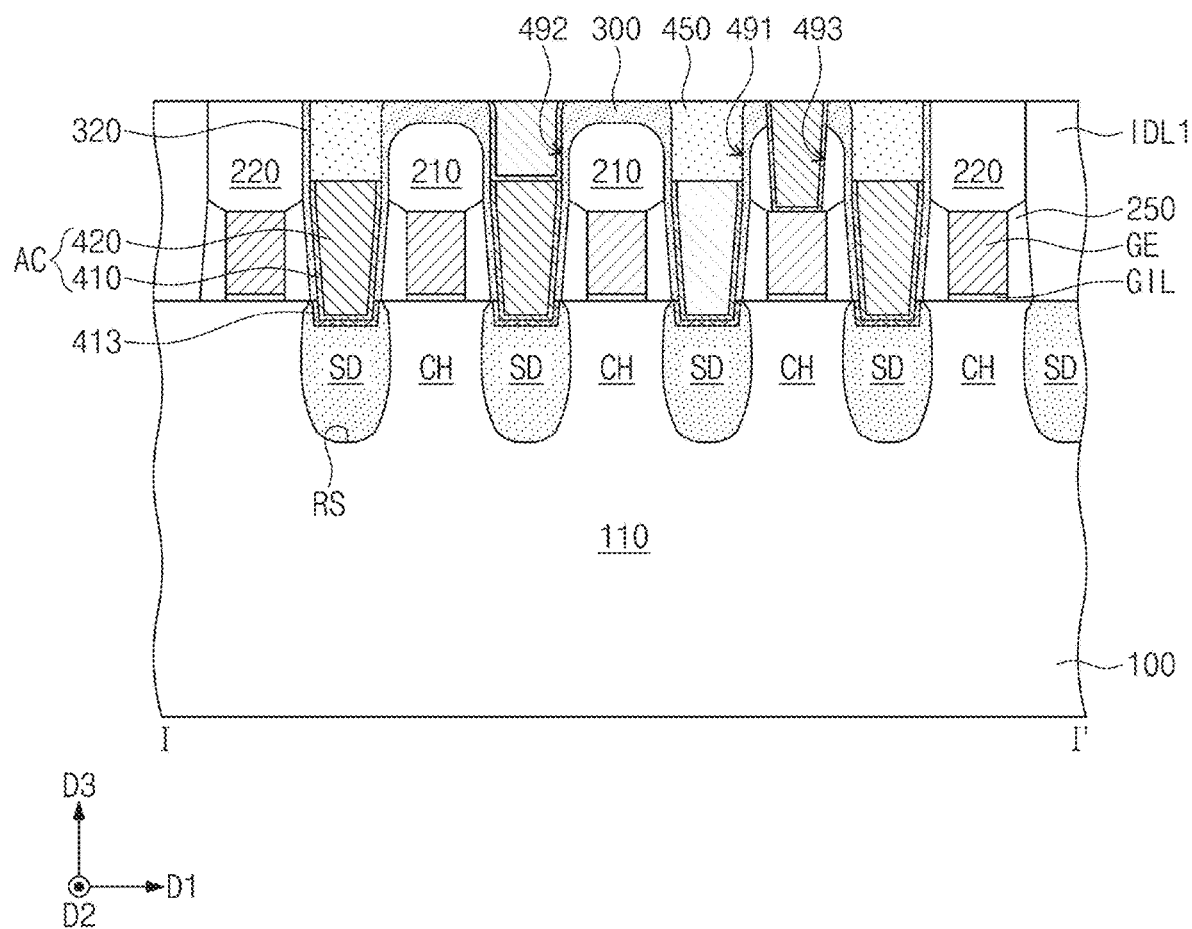
Figure 16B:
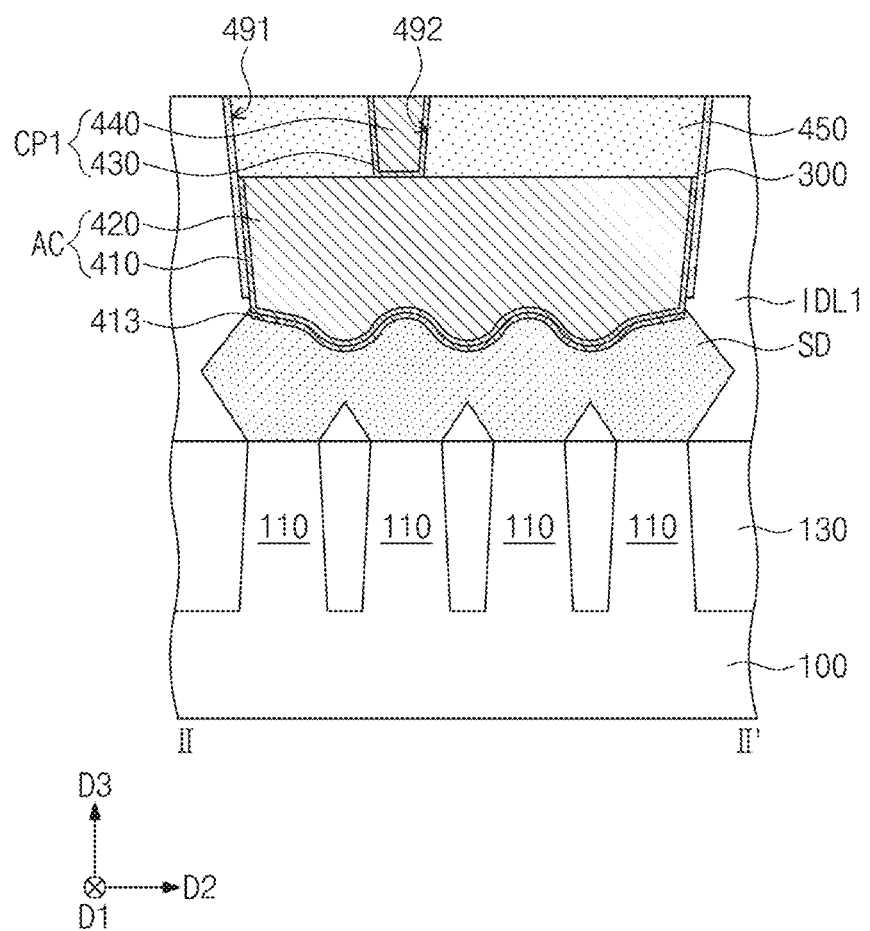
Figure 16C:
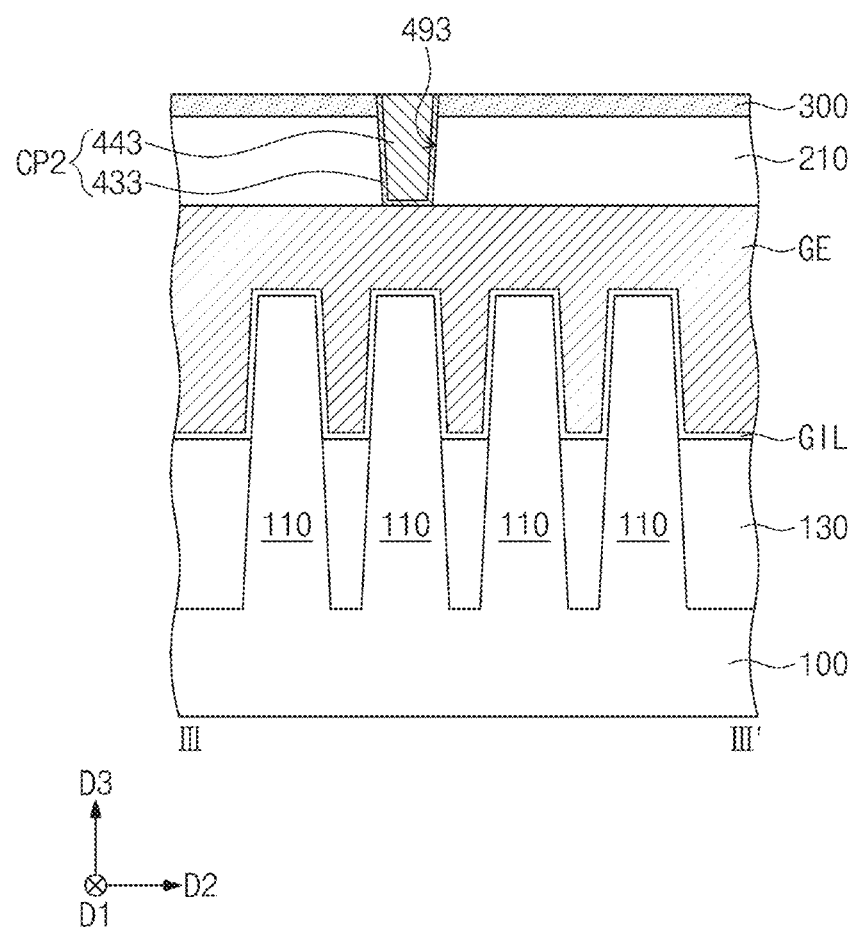

FIG. 9D is a sectional view, which is taken along a line I-I' of FIG. 1 to illustrate a process of forming a preliminary insulating layer according to some example embodiments of inventive concepts.

Referring to FIG. 9D, the preliminary insulating layer 300P may be formed in the opening 890 and on the third upper layer 830 by the same method as described above. However, in certain cases, a distance between the first capping patterns 210 may be small, and an entrance of the hole between the first capping patterns 210 may be relatively narrow. In this case, the thickness T13 of the first insulating pattern 300 on the edge 210e of each of the first capping patterns 210 may be greater than each of the thicknesses T11 and T12 of the first insulating pattern 300, which are respectively measured on the top and side surfaces 210a and 210c of each of the first capping patterns 210. In this case, the semiconductor device may be fabricated to have the structure shown in FIG. 4A.

Referring to FIGS. 1, 10A, 10B, and 10C, an ion implantation process such as a beamline ion implantation process may be performed on the preliminary insulating layer 300P. During the ion implantation process, ions of elements in Group V and/or III may be injected into the source/drain patterns SD through the preliminary insulating layer 300P.

Other elements such as carbon may be implanted into the source/drain patterns SD; however, example embodiment are not limited thereto. An energy of the ion implantation may be determined such that a peak of ions are implanted within the source/drain patterns SD; however, example embodiments are not limited thereto. The ion implantation process may be performed in a blanket manner; for example, there may not be a photoresist layer on the preliminary insulating layer 300P; however, example embodiments are not limited thereto.

Thereafter, an annealing process such as a rapid thermal annealing (RTA) and/or a laser annealing process may be performed on the source/drain patterns SD. The annealing process may include thermally treating the source/drain patterns SD. Since, during the annealing process, the preliminary insulating layer 300P covers the source/drain patterns SD, it may be possible to prevent or suppress the ions, which are injected or implanted into the source/drain patterns SD, from diffusing or leaking to the outside.

In the ion implantation process, some of the ions may be left in the preliminary insulating layer 300P. As a result of the ion implantation process and the annealing process, the preliminary insulating layer 300P may further include an additional element, and in some example embodiments, the additional element may be of the same element as, e.g. the same kind as, the impurities in the source/drain patterns SD.

Referring to FIGS. 1, 11A, 11B, and 11C, the first insulating patterns 300 and the second insulating patterns 320 may be formed by patterning the preliminary insulating layer 300P. The patterning of the preliminary insulating layer 300P may be performed using an etching process. In some example embodiments, the preliminary insulating layer 300P on the source/drain patterns SD may be removed by the etching process. The source/drain patterns SD may be further etched, and in this case, recesses 190 may be formed on the source/drain patterns SD, respectively. In some example embodiments, the recesses 190 may be formed using the etching process of the preliminary insulating layer 300P or may be independently formed through an additional process.

Alternatively, the source/drain patterns SD may not be further etched, and thus, the recesses 190 may not be formed. In this case, the bottom surfaces of the first contact holes 491 may be substantially flat.

The first insulating patterns 300 may cover the first capping patterns 210, respectively. Each of the first insulating patterns 300 may be further extended to cover outer side surfaces of the pair of the spacer patterns 250. The first insulating patterns 300 may expose the source/drain patterns SD.

The second insulating patterns 320 may be formed to cover the first side surfaces 220c of the second capping patterns 220, respectively. Each of the second insulating patterns 320 may be further extended to cover an outer side surface of the spacer pattern 250 that is adjacent to the first side surfaces 220c of the second capping patterns 220. The second insulating patterns 320 may be spaced apart from the first insulating patterns 300 in the first direction D1. The second insulating patterns 320 may not cover the source/drain patterns SD.

The first contact holes 491 may be provided between the gate patterns GE to expose the source/drain patterns SD. The first contact holes 491 may be provided between the first insulating patterns 300 and between adjacent ones of the first and second insulating patterns 300 and 320. The first contact holes 491 may be connected to the opening 890.

Unlike that illustrated in the drawings, portions of the preliminary insulating layer 300P on the side surfaces of the first capping patterns 210 may be further removed by the etching process. In this case, the first insulating patterns 300 may not be formed on the side surfaces of the first capping patterns 210 and the outer side surfaces of the spacer patterns 250, as previously described with reference to FIG. 4C.

Referring to FIGS. 1, 12A, 12B, and 12C, the active contacts AC may be formed on the source/drain patterns SD, respectively. The active contacts AC may be formed to fill the first contact holes 491. The formation of the active contacts AC may include forming a first barrier layer in the first contact holes 491, forming a first conductive layer on the first barrier layer to fill the first contact holes 491, and patterning the first barrier layer and the first conductive layer. As a result of the patterning of the first barrier layer and the first conductive layer. The first barrier patterns 410 and the first conductive patterns 420 may be formed in the first contact holes 491, respectively. Accordingly, each of the active contacts AC may include the first barrier pattern 410 and the first conductive pattern 420. The active contacts AC may be spaced apart from each other.

In the case where the first insulating patterns 300 are omitted, the top surfaces 210a of the first capping patterns 210 may be formed at a level lower than the top surfaces 220a of the second capping patterns 220, and in this case, the first contact holes 491 may have a depth that is insufficient to form the active contacts AC. By contrast, according to some example embodiments of inventive concepts, since the first insulating patterns 300 are formed as described above, the first contact hole 491 may have a depth that is large enough to form the active contacts AC. The active contacts AC may be formed using the first insulating patterns 300 in a self-aligned manner.

Thereafter, a planarization process may be performed on the third upper layer 830. The planarization process may be a chemical mechanical polishing (CMP) process and/or an etch-back process. As a result of the planarization process, the first to third upper layers 810, 820, and 830, upper portions of the first insulating patterns 300, and portions of the second insulating patterns 320 may be removed. Since the upper portions of the first insulating patterns 300 are removed, a level of the top surfaces of the first insulating patterns 300 may be lowered. The portions of the second insulating patterns 320 may be portions that are located on the first to third upper layers 810, 820, and 830. Other portions of the second insulating patterns 320 may be left on the first side surfaces 220c of the second capping patterns 220 and the outer side surfaces of the spacer patterns 250, after the planarization process. As a result of the planarization process, the top surfaces 300a of the first insulating patterns 300, the top surfaces 220a of the second capping patterns 220, and the top surfaces of the second insulating patterns 320 may be positioned at substantially the same level.

In the case where the second capping patterns 220 are omitted, there may be a difficulty in performing the planarization process, due to a difference in level between the top surfaces 210a of the first capping patterns 210 and the top surfaces 220a of the second capping patterns 220. However, according to some example embodiments of inventive concepts, since the first insulating patterns 300 are formed, the planarization process may be performed without such difficulty. Unlike that illustrated in the drawings, the planarization process may be performed to expose the first capping patterns 210.

Referring to FIGS. 1, 13A, 13B, and 13C, a process of recessing the active contacts AC may be performed. As a result of the recessing of the active contacts AC, the active contacts AC may have top surfaces that are lower than the top surfaces 300a of the first insulating patterns 300 and the top surface of the first interlayer insulating layer IDL1. For example, empty regions may be formed in upper portions of the first contact holes 491.

Referring to FIGS. 1, 14A, 14B, and 14C, the gapfill patterns 450 may be formed on the active contacts AC to fill the upper portions of the first contact holes 491, respectively. The gapfill patterns 450 may be disposed between the first insulating patterns 300 and between adjacent ones of the first and second insulating patterns 300 and 320.

Referring to FIGS. 1, 15A, 15B, and 15C, the second contact hole 492 may be formed in the gapfill pattern 450 to expose the top surface of the active contact AC. In some example embodiments, although not shown, a plurality of the second contact holes 492 may be formed in the gapfill patterns 450, respectively, to expose the top surfaces of the active contacts AC, respectively. The second contact holes 492, which are formed on adjacent ones of the active contacts AC, may not be aligned to each other in the first direction D1.

A gate hole 493 may be formed to penetrate a corresponding one of the first insulating patterns 300 and a corresponding one of the first capping patterns 210. The gate hole 493 may be formed to expose the top surface of a corresponding one of the gate patterns GE. Although not shown, in some example embodiments, a plurality of the gate holes 493 may be formed to expose the gate patterns GE, respectively. The gate holes 493, which are formed on adjacent ones of the gate patterns GE, may not be aligned to each other in the first direction D1.

Referring to FIGS. 1, 16A, 16B, and 16C, the first contact patterns CP1 may be formed in the second contact holes 492, respectively, and may be coupled to the active contacts AC, respectively. Each of the first contact patterns CP1 may include the second barrier pattern 430 and the second conductive pattern 440.

The second contact pattern CP2 may be formed in a corresponding one of the gate holes 493 and may be coupled to a corresponding one of the gate patterns GE. Each of the second contact patterns CP2 may include the third barrier pattern 433 and the third conductive pattern 443. The third barrier pattern 433 and the second barrier pattern 430 may be formed at substantially the same time by the same process. The third conductive pattern 443 and the second conductive pattern 440 may also be formed at substantially the same time by the same process, but inventive concepts are not limited to this example.

Referring back to FIGS. 1, 2A, 2B, and 2C, the first interconnection patterns 610 may be formed on the first contact patterns CP1, respectively. The second interconnection pattern 620 may be formed on the second contact pattern CP2. The second interlayer insulating layer IDL2 may be formed on the first interlayer insulating layer IDL1. A semiconductor device according to some example embodiments of inventive concepts may be fabricated by the afore-described method.

According to some example embodiments of inventive concepts, an insulating pattern may be provided on a first capping pattern. Due to the presence of the insulating pattern, a difference in level between top surfaces of first and second capping patterns may be reduced. The insulating pattern may be formed in a non-conformal manner. In this case, an active contact may be stably coupled to a source/drain pattern. Accordingly, it may be possible to realize a semiconductor device with improved reliability.

Certain claim terms may be described as having certain numerical values; it is to be understood that the terms may be substantially equal to the claimed numerical values. Alternatively or additionally certain claim terms may be described as having certain geometric shapes and/or positions; it is to be understood that the terms may substantially have the claimed shapes and/or positions. Alternatively or additionally certain claim terms may be described as having certain material compositions; it is to be understood that the terms may substantially have the claimed material composition.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Moreover, when the words "generally" and "substantially" are used in connection with material composition, it is intended that exactitude of the material is not required but that latitude for the material is within the scope of the disclosure.

Further, regardless of whether numerical values or shapes are modified as "about" or "substantially," it will be understood that these values and shapes should be construed as including a manufacturing or operational tolerance (e.g., ±10%) around the stated numerical values or shapes. Thus, while the term "same," "identical," or "equal" is used in description of example embodiments, it should be understood that some imprecisions may exist. Thus, when one element or one numerical value is referred to as being the same as another element or equal to another numerical value, it should be understood that an element or a numerical value is the same as another element or another numerical value within a desired manufacturing or operational tolerance range (e.g., ±10%).

Example embodiments are not limited to those described above. Furthermore example embodiments are not necessarily mutually exclusive to one another. For example, some example embodiments may include features described with reference to one or more figures, and may also include features described with reference to other figures.

While some example embodiments of inventive concepts have been particularly shown and described, it will be understood by one of ordinary skill in the art that variations in form and detail may be made therein without departing from the spirit and scope of the attached claims.

What is claimed is:

1. A semiconductor device, comprising:
   a substrate including an active pattern protruding in an upward direction;
   a first gate pattern on the active pattern and extending across the active pattern;
   spacer patterns on a first side surface of the first gate pattern and on a second side surface of the first gate pattern;
   a first capping pattern on a top surface of the first gate pattern and on top surfaces of the spacer patterns, the first capping pattern having a top surface, a side surface, and a rounded edge connecting the top surface of the first capping pattern and the side surface of the first capping pattern;
   a first insulating pattern covering the side surface of the first capping pattern, the rounded edge of the first capping pattern; and
   an interlayer insulating layer on an outer side surface of the first insulating pattern,
   wherein a thickness of the first insulating pattern on the rounded edge of the first capping pattern is different from a thickness of the first insulating pattern on outer side surfaces of the spacer patterns and different from a thickness of the first insulating pattern on the top surface of the first capping pattern.

2. The semiconductor device of claim 1, further comprising:
   a second gate pattern on the active pattern and apart from the first gate pattern in a direction; and
   a second capping pattern on a top surface of the second gate pattern and apart from the first insulating pattern in the direction, wherein the first insulating pattern has a top surface at a same level as a top surface of the second capping pattern.

3. The semiconductor device of claim 2, wherein the second capping pattern has the top surface, a side surface, and an edge connecting the top surface of the second capping pattern to the side surface of the second capping pattern, and
the edge of the second capping pattern has a different shape from the rounded edge of the first capping pattern.

4. The semiconductor device of claim 2, wherein a height of the second capping pattern is equal to a sum of a height of the first capping pattern and a first thickness of the first insulating pattern, and
the first thickness is a thickness of the first insulating pattern on the top surface of the first capping pattern.

5. The semiconductor device of claim 2, further comprising a second insulating pattern covering a first side surface of the second capping pattern and not covering the top surface of the second capping pattern, and
the interlayer insulating layer covers a second side surface of the second capping pattern, opposite to the first side surface of the second capping pattern.

6. The semiconductor device of claim 5, wherein the second capping pattern comprises a same material as the first capping pattern, and
the second insulating pattern comprises a same material as the first insulating pattern.

7. The semiconductor device of claim 1, wherein the first insulating pattern covers the top surface of the first capping pattern, and
a thickness of the first insulating pattern on the top surface of the first capping pattern is different from a thickness of the first insulating pattern on the side surface of the first capping pattern.

8. The semiconductor device of claim 7, further comprising:
a gate contact pattern penetrating the first capping pattern and the first insulating pattern and coupled to the first gate pattern.

9. The semiconductor device of claim 1, further comprising:
source/drain patterns on the active pattern and at the first side surface of the first gate pattern and the second side surface of the first gate pattern; and
active contacts on and coupled to the source/drain patterns,
wherein the first insulating pattern is between the spacer patterns and the active contacts.

10. The semiconductor device of claim 9, further comprising a contact pattern on one of the active contacts,
wherein the first insulating pattern is between the first capping pattern and the contact pattern.

11. A semiconductor device, comprising:
a substrate including an active pattern protruding in an upward direction;
a first gate pattern and a second gate pattern, which are on the active pattern and are apart from each other in a specific direction;
spacer patterns at a first side of the first gate pattern and a second side of the first gate pattern;
a first capping pattern on a top surface of the first gate pattern and top surfaces of the spacer patterns;
an insulating pattern covering the first capping pattern and extending to cover outer side surfaces of the spacer patterns;
a second capping pattern on a top surface of the second gate pattern and apart from the insulating pattern in the specific direction; and
an interlayer insulating layer covering a side surface of the second capping pattern,
wherein the insulating pattern has a top surface at a same level as a top surface of the second capping pattern,
wherein a thickness of the insulating pattern on the first capping pattern is different from a thickness of the insulating pattern on outer side surfaces of the spacer patterns.

12. The semiconductor device of claim 11, wherein the second capping pattern has a different shape from the first capping pattern, and
the second capping pattern comprises a same material as the first capping pattern.

13. The semiconductor device of claim 11, wherein the first capping pattern has a top surface at a level lower than the top surface of the second capping pattern.

14. The semiconductor device of claim 11, further comprising:
source/drain patterns on the active pattern and at the first side of and the second side of the first gate pattern;
active contacts on and coupled to the source/drain patterns; and
a contact pattern on one of the active contacts,
wherein the insulating pattern is between the first capping pattern and the contact pattern.

15. The semiconductor device of claim 14, wherein the source/drain patterns further comprise impurities, and
the insulating pattern further comprises an additional element, which is of a same element type as the impurities in the source/drain patterns.

16. A semiconductor device, comprising:
a substrate including an active pattern protruding in an upward direction;
a device isolation pattern on the substrate to cover a lower portion of the active pattern;
gate patterns on the active pattern to cross the active pattern and to extend in a first direction, the gate patterns comprising a first gate pattern and a second gate pattern, the first gate pattern and the second gate pattern apart from each other in a second direction different from the first direction;
gate insulating layers between the active pattern and the gate patterns;
first spacer patterns on a first side surface of and a second side surface of the first gate pattern;
a first capping pattern on a top surface of the first gate pattern and on top surfaces of the first spacer patterns;
a first insulating pattern on a top surface of the first capping pattern;
second spacer patterns on a first side surface of and a second side surface of the second gate pattern;
a second capping pattern on a top surface of the second gate pattern and on top surfaces of the second spacer patterns and apart from the first insulating pattern;
an interlayer insulating layer covering a first side surface of the second capping pattern;
source/drain patterns on the active pattern and at the first side surface of and the second side surface of the first gate pattern;
active contacts on and coupled to the source/drain patterns;
silicide patterns between the source/drain patterns and the active contacts; and
a contact pattern on one of the active contacts, wherein the first insulating pattern has a top surface at a same level as a top surface of the second capping pattern.

17. The semiconductor device of claim 16, wherein the first insulating pattern extends to cover a side surface of the first capping pattern and outer side surfaces of the first spacer patterns, the first insulating pattern has a first thickness on the top surface of the first capping pattern and has a second thickness on the side surface of the first capping pattern, and the second thickness is different from the first thickness.

18. The semiconductor device of claim 16, further comprising:

a gapfill pattern on another of the active contacts, wherein the first insulating pattern is between the first capping pattern and the contact pattern, between the first capping pattern and the gapfill pattern, and between the first spacer patterns and the active contacts.

19. The semiconductor device of claim 16, further comprising:

a second insulating pattern covering a second side surface of the second capping pattern opposite to the first side surface and exposing a top surface of the second capping pattern, wherein the top surface of the first insulating pattern is the same level as the top surface of the second capping pattern and a top surface of the second insulating pattern, the first capping pattern has a first edge connecting the top surface of the first capping pattern to a side surface of the first capping pattern, the second capping pattern has a second edge connecting the top surface of the second capping pattern to the first side surface of the second capping pattern, and the second edge has a curvature different from the first edge.

* * * * *